(12) United States Patent
Murayama et al.

(10) Patent No.: US 8,096,637 B2
(45) Date of Patent: Jan. 17, 2012

(54) LIQUID DROPLET EJECTION APPARATUS, METHOD OF MANUFACTURING ELECTROOPTICAL DEVICE, ELECTROOPTICAL DEVICE, AND ELECTRONIC APPARATUS

(75) Inventors: Yoshiaki Murayama, Shiojiri (JP); Kenji Kojima, Suwa (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 12/949,891

(22) Filed: Nov. 19, 2010

(65) Prior Publication Data

US 2011/0063367 A1 Mar. 17, 2011

Related U.S. Application Data

(60) Continuation of application No. 12/255,905, filed on Oct. 22, 2008, now Pat. No. 7,857,424, which is a division of application No. 11/113,938, filed on Apr. 25, 2005, now Pat. No. 7,455,388.

(30) Foreign Application Priority Data

May 12, 2004 (JP) ................................. 2004-142449
Oct. 14, 2004 (JP) ................................. 2004-300770

(51) Int. Cl.
*B41J 2/15* (2006.01)
*B41J 2/145* (2006.01)

(52) U.S. Cl. ................................. 347/41; 347/9; 347/12

(58) Field of Classification Search ................ 347/9, 12, 347/14, 15, 40, 41, 43, 54
See application file for complete search history.

(56) References Cited

U.S. PATENT DOCUMENTS

| | | | |
|---|---|---|---|
| 5,883,644 A * | 3/1999 | Nicoloff et al. | 347/12 |
| 5,992,962 A * | 11/1999 | Yen et al. | 347/9 |
| 6,277,529 B1 | 8/2001 | Marumoto et al. | |
| 6,471,352 B2 | 10/2002 | Akahira | |
| 6,667,795 B2 | 12/2003 | Shigemura | |
| 7,513,595 B2 | 4/2009 | Nakamura | |
| 2002/0105688 A1 | 8/2002 | Katagami et al. | |
| 2006/0146379 A1 | 7/2006 | Katagami et al. | |
| 2010/0182367 A1 * | 7/2010 | Takagi et al. | 347/14 |

FOREIGN PATENT DOCUMENTS

| | | |
|---|---|---|
| JP | 01-221251 | 9/1989 |
| JP | 04-278361 | 10/1992 |
| JP | 06-024005 | 2/1994 |
| JP | 11-058789 | 3/1999 |
| JP | 11-258416 | 9/1999 |
| JP | 2000-334951 | 12/2000 |
| JP | 2003-275646 | 9/2003 |

* cited by examiner

*Primary Examiner* — Thinh Nguyen
(74) *Attorney, Agent, or Firm* — Harness, Dickey & Pierce, P.L.C.

(57) ABSTRACT

A method of drawing on a workpiece by ejecting functional liquid thereon while relatively scanning the workpiece and an ejection head is provided. The method comprises the steps of: a first scanning for drawing in a plurality of first areas along a scanning direction; and a second scanning for drawing in a second area between the plurality of first areas drawn in by the first scanning.

4 Claims, 38 Drawing Sheets

STRIPE

MOSAIC

DELTA

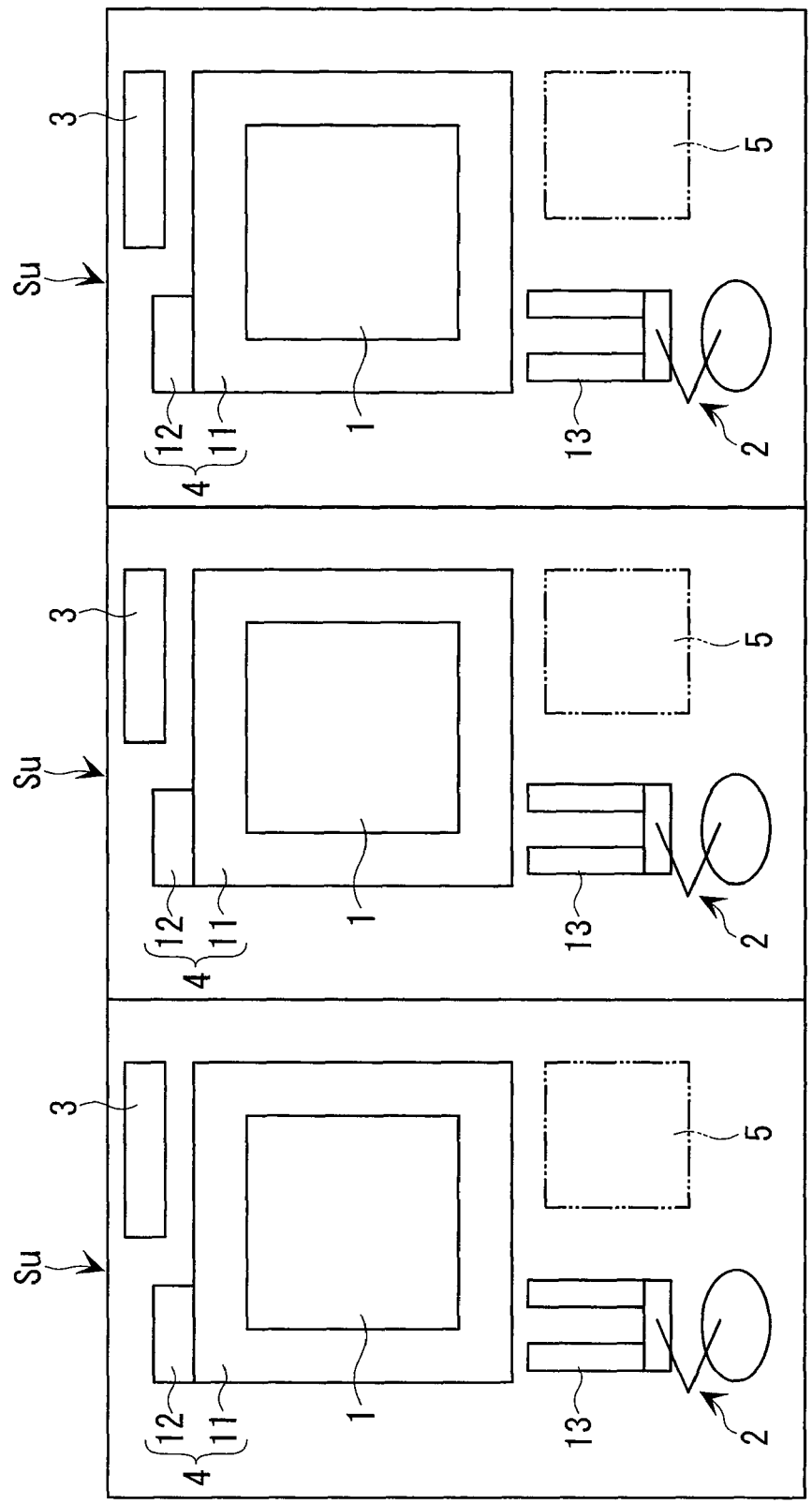

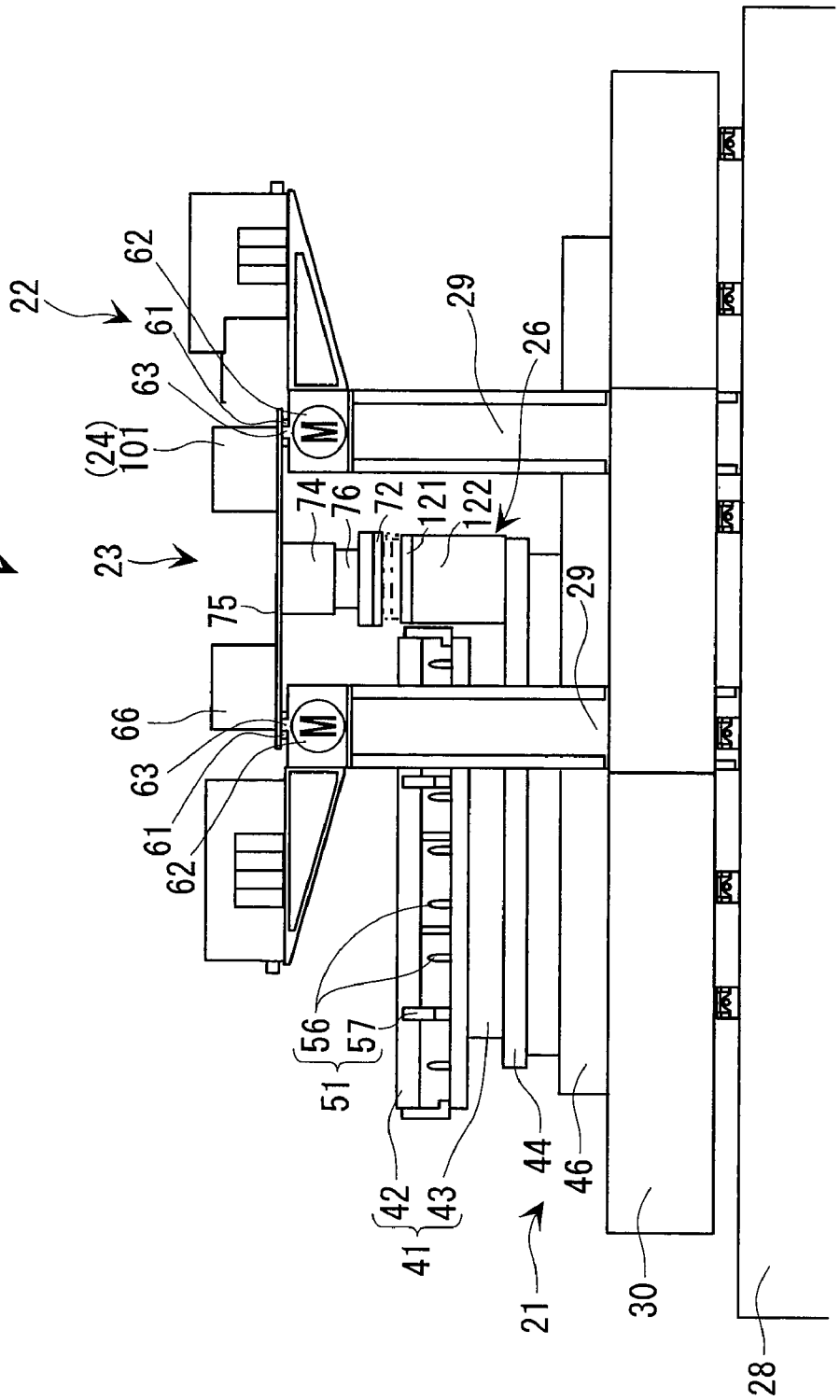

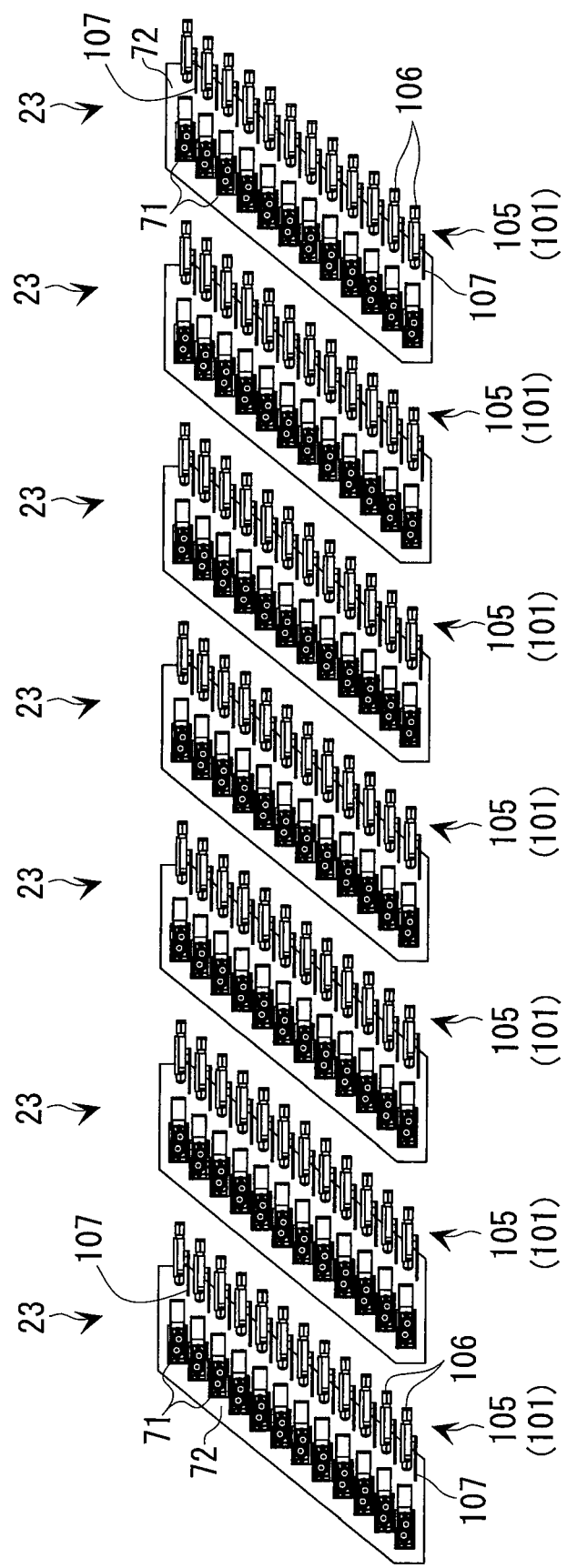

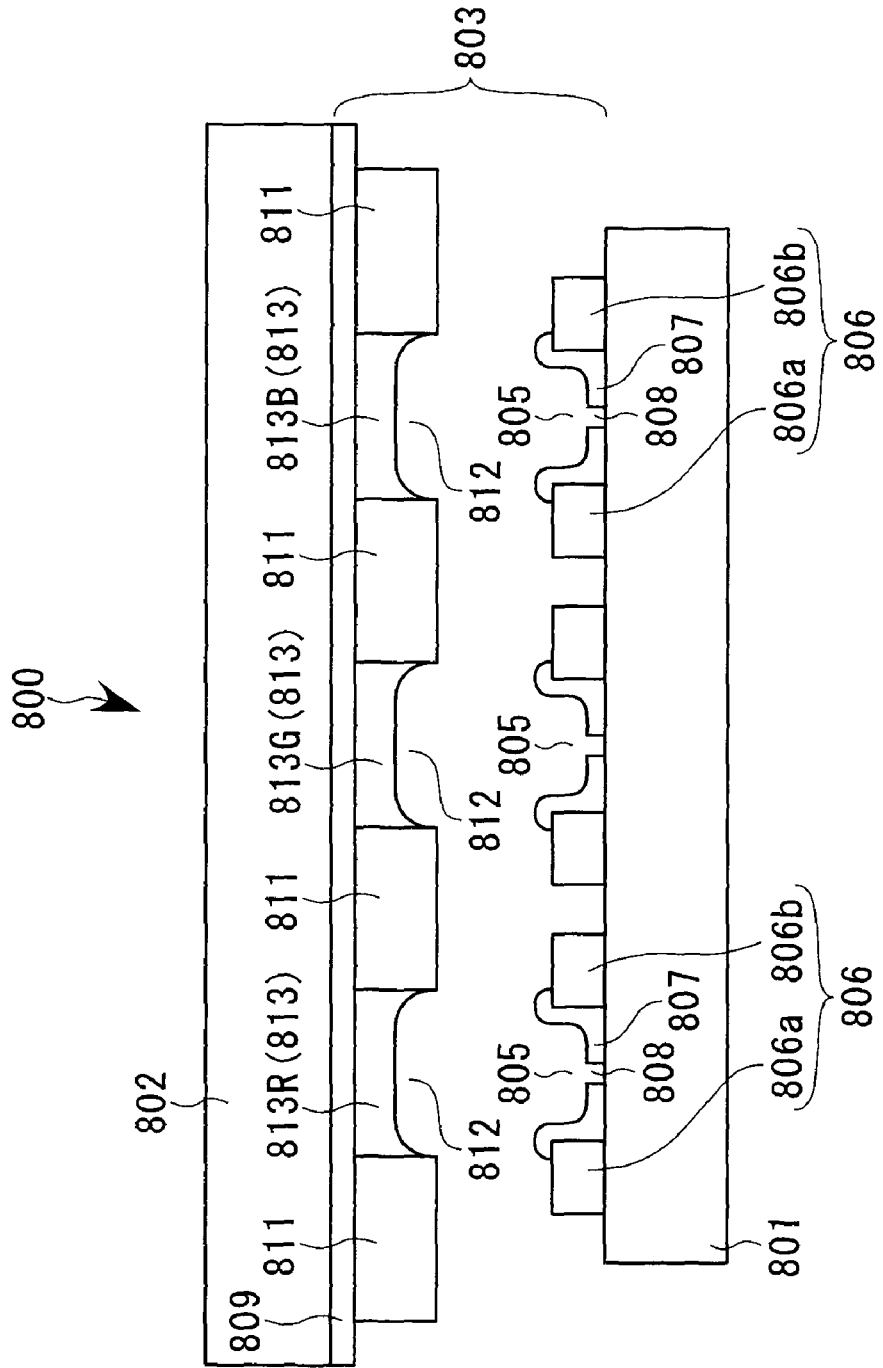

LIQUID DROPLET EJECTION APPARATUS, METHOD OF MANUFACTURING ELECTROOPTICAL DEVICE, ELECTROOPTICAL DEVICE, AND ELECTRONIC APPARATUS This application is a continuation of U.S. patent application Ser. No. 12/255,905 filed on Oct. 22, 2008 which is a divisional of U.S. Pat. No. 7,455,388 issued on Nov. 25, 2008. This application claims the benefit of Japanese Patent Application No. JP2004-142449 filed May 12, 2004 and JP2004-300770 filed Oct. 14, 2004. The disclosures of the above applications are incorporated herein by reference.

BACKGROUND OF THE INVENTION

1. Field of the Invention

This invention relates to a liquid droplet ejection apparatus for ejecting (or discharging) function (or functional) liquid droplets onto a substrate so as to image (or draw) on the same, while moving a plurality of color-dependent function liquid droplet ejection heads having a plurality of corresponding colors of function liquid introduced therein, relative to the substrate. This invention also relates to a method of manufacturing an electrooptical device, an electrooptical device, and an electronic apparatus.

2. Description of the Related Art

In a known liquid droplet ejection apparatus for use in manufacturing a color filter, while moving color-dependent inkjet heads (function liquid droplet ejection heads) having introduced therein three kinds of ink (function liquid) of R (red), G (green), and B (blue) colors, respectively, relative to a glass substrate having a black matrix (a plurality of pixel areas) formed thereon, an imaging process is performed by ejecting and landing ink droplets on the black matrix on the basis of a color arrangement pattern composed of the three colors. In such a liquid droplet ejection apparatus, in order to accurately eject ink droplets onto the black matrix, amounts of positional deviation of an X-Y stage (an X-axis table and a Y-axis table) moving a substrate relative to the inkjet heads are measured, and the amounts of positional deviation are corrected.

However, in an imaging operation of the liquid droplet ejection apparatus, even when the amounts of positional deviation are corrected, it is difficult to exactly or accurately eject ink onto the black matrix due to undesirable speed variations of the X-Y stage, a curved flying trajectory of ink, and so forth. Especially, when three kinds of ink of R, G, and B colors are simultaneously ejected (through a common main scanning operation), ink droplets not exactly ejected in mutually adjacent pixel areas cause ink of different colors to be mixed with each other on the substrate, resulting in deteriorating quality of a manufactured color filter.

SUMMARY OF THE INVENTION

Accordingly, it is an advantage of this invention to provide: a liquid droplet ejection apparatus having a structure in which, when function liquid droplets of a plurality of colors are simultaneously ejected and landed on a substrate, function liquid droplets of different colors are prevented from mixing with each other even when the function liquid droplets are not exactly landed in respective pixel areas; a method of manufacturing an electrooptical device; an electrooptical device; and an electronic apparatus.

According to one aspect of this invention, there is provided a liquid droplet ejection apparatus for ejecting function liquid droplets so as to be landed in a plurality of pixel areas formed on a substrate on a basis of a color arrangement pattern composed of a plurality of colors. The function liquid droplets are ejected by moving, relative to the substrate, a plurality of color-dependent function liquid droplet ejection heads having a plurality of corresponding kinds of function liquids introduced therein. The apparatus comprises: a plurality of carriage units, each having the plurality of color-dependent function liquid droplet ejection heads placed on a corresponding carriage; an X-axis table having the substrate thereon and moving the substrate in an X-axis direction as a main scanning direction; a Y-axis table for moving each of the plurality of carriage units in the Y-axis direction; and control means for controlling each of the function liquid droplet ejection heads, the X-axis table and the Y-axis table. The plurality of color-dependent function liquid droplet ejection heads of each of the carriage units is arranged such that a plurality of color-dependent partial imaging lines, each formed by a plurality of ejection nozzles, are connected to one after another in a predetermined order in the Y-axis direction so as to make up a single divided imaging line. The control means performs the imaging process by repeating a main scanning operation for driving each of the function liquid droplet ejection heads in synchronization with the substrate moving in the X-axis direction and a sub-scanning operation for moving each of the function liquid droplet ejection heads in the Y-axis direction through the carriage unit by about each of the partial imaging lines.

In this case, the color arrangement pattern is preferably of any one of stripe, mosaic, and delta arrangements.

According to the above arrangement, the plurality of color-dependent partial imaging lines are continuously connected to one another in a predetermined order (for example, in the order of R, G, and B) in the Y-axis direction and do not overlap with one another in the X-axis direction, whereby function liquid droplets of mutually different colors are not ejected and landed in respective pixel areas lying mutually adjacent in the X-axis direction through a common main scanning operation. Hence, even when function liquid droplets of different colors are respectively landed on a part of a bank section between pixel areas lying mutually adjacent in the X-axis direction, both function liquid droplets are ejected and landed through mutually different main scanning operations; hence, function liquid droplets ejected through a first main scanning operation are dried to a certain extent at the time when other function liquid droplets are landed by a second main scanning operation, whereby both function liquid droplets do not mix with each other. Accordingly, function liquid droplets of different colors are reliably prevented from mixing with each other between the pixel areas lying mutually adjacent also in the X-axis direction. Also, since function liquid droplets of a plurality of colors are simultaneously ejected and landed, imaging can be effectively performed with a single liquid droplet ejection apparatus. In addition, when function liquid of a single color is introduced in the plurality of droplet ejecting heads having the above-descried structure, imaging can be effectively made by moving the droplet ejecting heads by an imaging line without moving them by each partial imaging line in a sub-scanning operation.

When a color filter is manufactured, while three kinds of function liquid of R, G, and B are usually used as function liquid of a plurality of colors, four kinds of function liquid of three colors of R, G, and B colors and an additional C (cyanic) or E (emerald) color may be used so as to improve a color reproduction property. As a matter of course, function liquid of another combination of colors or of other colors may be used. Pixel areas are defined such that function liquid droplets of a plurality of colors (for example, three colors R, G, and B) are landed in the respective pixel areas. In this case, three pixel areas respectively having an R-function liquid droplet (i.e., function liquid droplet of red color), a G-function liquid droplet (i.e., function liquid droplet of green color), and a B-function liquid droplet (i.e., function liquid droplet of blue color) landed therein make up a so-called pixel.

It is preferable that each of the carriage units has the plurality of color-dependent function liquid droplet ejection heads placed on the carriage and that the plurality of color-dependent function liquid droplet ejection heads of each of the carriage units be arranged such that the plurality of color-dependent partial imaging lines, each formed by the plurality of ejection nozzles, are repeatedly connected one after another in a predetermined order in the Y-axis direction so as to make up a single divided imaging line.

According to the above arrangement, a plurality of the partial imaging lines of respectively different colors are repeatedly connected one another in the Y-axis direction in a predetermined order (for example, in the order of R, G, B, R, G, B, R, G, and B colors) so as to make up the divided imaging lines. Hence, each partial imaging line is shorter than one of the partial imaging lines of respective colors, which are connected one another in the Y-axis direction in a predetermined order so as to make up the divided imaging lines (e.g., of R, G, and B colors), thereby leading to a shorter moving distance of each function liquid droplet ejection head, and thus resulting in a shorter time of a sub-scanning operation.

In this case, when function liquid droplets ejected in two of the pixel areas lying mutually adjacent in the Y-axis direction have different colors from each other, the control means preferably controls the liquid droplet ejection apparatus such that function liquid droplets are ejected in the two pixel areas through mutually different main scanning operations.

According to the above arrangement, function liquid droplets of different colors are not ejected and landed in respective pixel areas lying mutually adjacent in the Y-axis direction through a common main scanning operation, thereby reliably preventing function liquid droplets of different colors from mixing with each other between the pixel areas lying mutually adjacent not only in the X-axis direction but also in the Y-axis direction.

In these cases, a drive source of the Y-axis table preferably includes a linear motor.

According to the above arrangement, the plurality of carriage units can be independently and also accurately moved.

In these cases, each of the carriage units preferably has a plurality of color-dependent function liquid tanks placed thereon, for feeding function liquid of a plurality of colors to each of the plurality of color-dependent function liquid droplet ejection heads.

According to the above arrangement, the length between the function liquid tank and the corresponding function liquid droplet ejection head can be reduced, and also, the layout of function liquid tubes between the function liquid tanks and the corresponding function liquid droplet ejection heads can be simplified. Thus, the function liquid droplet ejection heads can stably eject function liquid droplets.

A pressure regulator is preferably interposed between the function liquid tank and the function liquid droplet ejection head. With this structure, since a head pressure between the function liquid tank and the function liquid droplet ejection head does not excessively fluctuate, the function liquid droplet ejection head stably ejects function liquid droplets.

It is preferable that the liquid droplet ejection apparatus further include a flushing unit disposed on the X-axis table and flushing each of the ejection nozzles of the function liquid droplet ejection head upon a main scanning operation and that the flushing unit be formed so as to correspond to a head-ejection covering-range over which is covered, with respect to the Y-axis direction, by all of the function liquid droplet ejection heads of the plurality of carriage units in a sub-scanning operation.

According to the above arrangement, even when the carriage units are subjected to a sub-scanning operation and move in the Y-axis direction within the head-ejection covering-range, the flushing unit can receive function liquid droplets flushed from all function liquid droplet ejection heads placed on the plurality of carriage units, thereby preventing function liquid droplets from flying off in the vicinity of each function liquid droplet ejection head and also maintaining all function liquid droplet ejection heads in a satisfactory condition. When sub-scanning operations are performed n-times for performing an imaging process, the head-ejection covering-range is equivalent to the length of the imaging line extended in the Y-axis direction by n-times of the partial imaging line. The flushing unit is preferably formed in the X-axis direction so as to correspond to the length of the plurality of carriage units extending in the X-axis direction.

In this case, as described above, when the plurality of color-dependent function liquid droplet ejection heads of each carriage unit are arranged such that the plurality of color-dependent partial imaging lines are repeatedly connected one another in the Y-axis direction in a predetermined order so as to make up a single divided imaging line, each partial imaging line has a shorter length, thereby leading to a shorter head-ejection covering-range. Accordingly, the flushing unit has a shorter length in the Y-axis direction, thus contributing to reducing the space of the function liquid droplet ejection apparatus.

It is preferable that a maintenance area be formed on a moving trajectory of the carriage units moved by the Y-axis table so as to lie outside one of the sides of the X-axis table; that the liquid droplet ejection apparatus further includes maintenance means provided in the maintenance area; and that the control means controls the liquid droplet ejection apparatus such that at least one function liquid droplet ejection head not driven during an arbitrary single main scanning operation faces the maintenance means before the following main scanning operation so as to be subjected to a function-recovery process.

According to the above arrangement, even when function liquid of ejection nozzles of non-driven function liquid droplet ejection heads is dried during a main scanning operation, the ejection nozzles are prevented from clogging by applying a function-recovery process to these function liquid droplet ejection heads.

An arbitrary single main scanning operation is defined such that, for example, function liquid droplets are ejected and landed in pixel areas lying at the end of a substrate in the Y-axis direction not by function liquid droplet ejection heads placed on the outermost end of the corresponding carriage unit in the Y-axis direction, but by function liquid droplet ejection heads of other colors placed inside the foregoing ones. In this case, because of facing the substrate outside in the Y-axis direction, function liquid droplet ejection heads lying outside, with respect to the Y-axis direction, the function liquid droplet ejection heads of other colors driven for ejecting function liquid droplets in the pixel areas lying at the end of the substrate in the Y-axis direction are not driven for ejecting function liquid droplets in this main scanning operation. Accordingly, the function-recovery process may be applied to these function liquid droplet ejection heads before the following main scanning operation as performed in the structure of the liquid droplet ejection apparatus.

It is preferable that a pair of maintenance areas be provided on a moving trajectory of the carriage units moved by the Y-axis table so as to lie outside both sides of the X-axis table and that the liquid droplet ejection apparatus further includes a pair of maintenance means in the corresponding maintenance areas for applying a function-recovery process to the plurality of ejection nozzles of each function liquid droplet ejection head.

According to this arrangement, the plurality of carriage units can be maintained by dividing them into two groups, thereby quickly achieving a function-recovery process of the function liquid droplet ejection heads.

For example, at the time of replacing the function liquid droplet ejection heads with new ones, the carriage units having the function liquid droplet ejection heads placed thereon, which are needed to be replaced with new ones, can be arranged so as to face one of the pair maintenance means for achieving head replacement, and also, the other carriage units can be arranged so as to face the other maintenance means for achieving a function-recovery process, whereby suspending an operation of the liquid droplet ejection apparatus is not required.

The control means preferably controls the liquid droplet ejection apparatus such that the function liquid droplet ejection heads not driven during an arbitrary single main scanning operation are arranged so as to face the maintenance means for achieving a function-recovery process before the following main scanning operation.

According to another aspect of this invention, there is provided a method of manufacturing an electrooptical device comprising forming a film-deposited section of function liquid droplets on the substrate by using the liquid droplet ejection apparatus.

According to still another aspect of this invention, there is provided an electrooptical device comprising a film-deposited section formed on the substrate with function liquid droplets by using the above-described liquid droplet ejection apparatus.

According to the above arrangement, the electrooptical device is manufactured with the liquid droplet ejection apparatus imaging on the work while preventing function liquid droplets of different colors from mixing each other, thereby leading to manufacturing a reliable electrooptical device. Electrooptical devices (flat panel displays (FPDs)) include a color filter, a liquid-crystal display device, an organic electroluminescence (EL) device, a plasma display panel (PDP) device, an electron-emission device, and so forth. The electron-emission devices include so-called FED (field emission display) and SED (surface-conduction electron-emitter display).

According to still another aspect of this invention, there is provided an electronic apparatus having incorporated therein the above-described electrooptical device.

An electronic apparatus according to this invention includes an electrooptical device manufactured according to the above-described method.

BRIEF DESCRIPTION OF THE DRAWINGS

FIG. 3 is a schematic plan view of an imaging system;

FIG. 7 is a side view thereof;

FIG. 8 illustrates a plurality of carriage units, each including a head plate having other components placed thereon;

FIGS. 9A and 9B illustrate the carriage unit, wherein FIG. 9A is an external perspective view of the carriage unit, and FIG. 9B shows the carriage unit viewed from below;

FIGS. 12A and 12B illustrate function liquid feeding means, wherein FIG. 12A illustrates a pressure regulator and other components in the vicinity thereof, and FIG. 12B is a sectional view thereof;

FIG. 37 is a sectional view of an essential part of a display device serving as an electron-emission device (FED device)

DESCRIPTION OF THE PREFERRED EMBODIMENTS

A liquid droplet ejection apparatus according to a first embodiment of this invention will be described with reference to the attached drawings. The liquid droplet ejection apparatus according to this embodiment is installed in an imaging system incorporated in a production line of a flat panel display device (FPD) such as a liquid-crystal display device and forms a film-deposited section of function liquid droplets of three colors R, G, and B on a substrate such as a color filter by introducing function (or functional) liquid such as special ink or luminescent resin liquid into a function liquid droplet ejection head. A substrate (work or workpiece) serving as an ejection object (imaging object) onto which function liquid droplets are ejected by the liquid droplet ejection apparatus will be briefly described.

Figure 1:
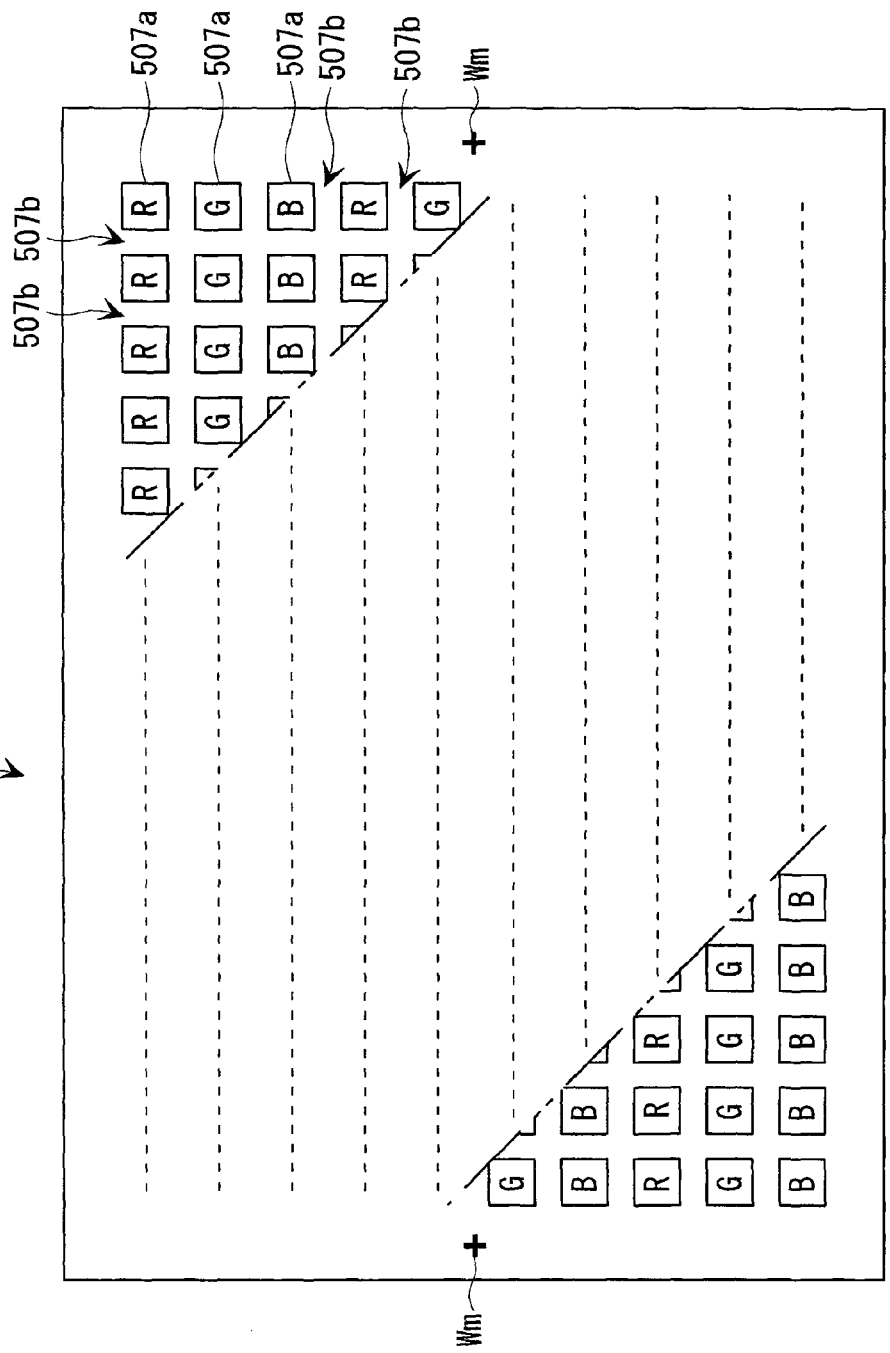
FIG. 1 is a schematic plan of a work (substrate)
Figure 2A:
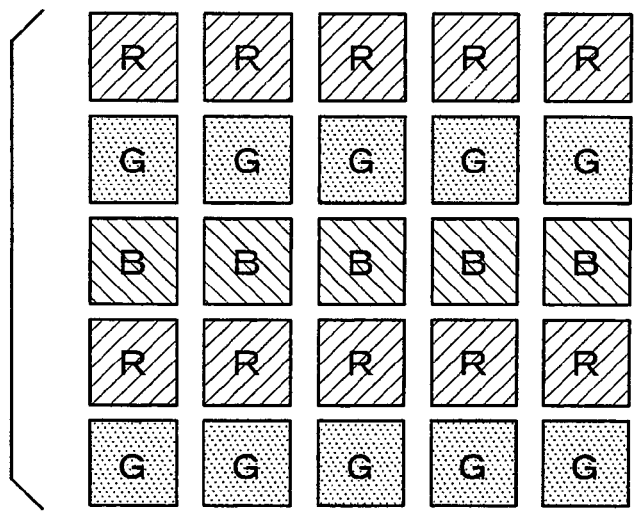
FIGS. 2A through 2C illustrate an example color arrangement pattern of a color filter, composed of three colors R, G, and B.
Figure 2B:
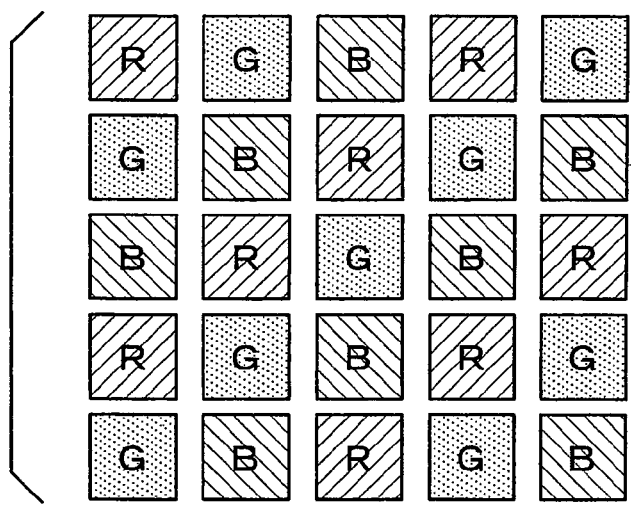
Figure 2C:
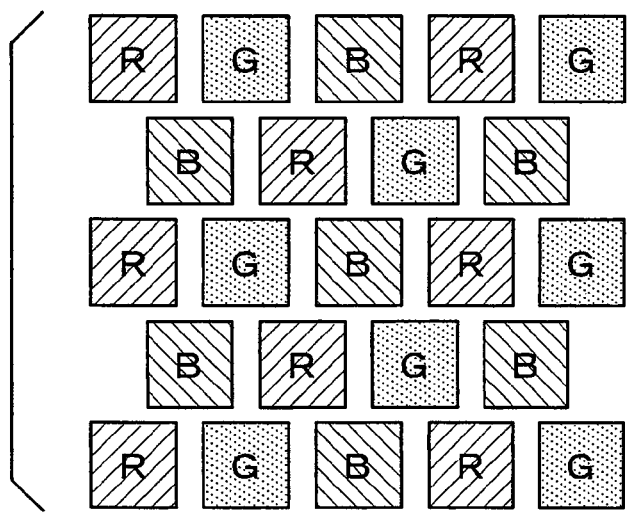
Figure 4:
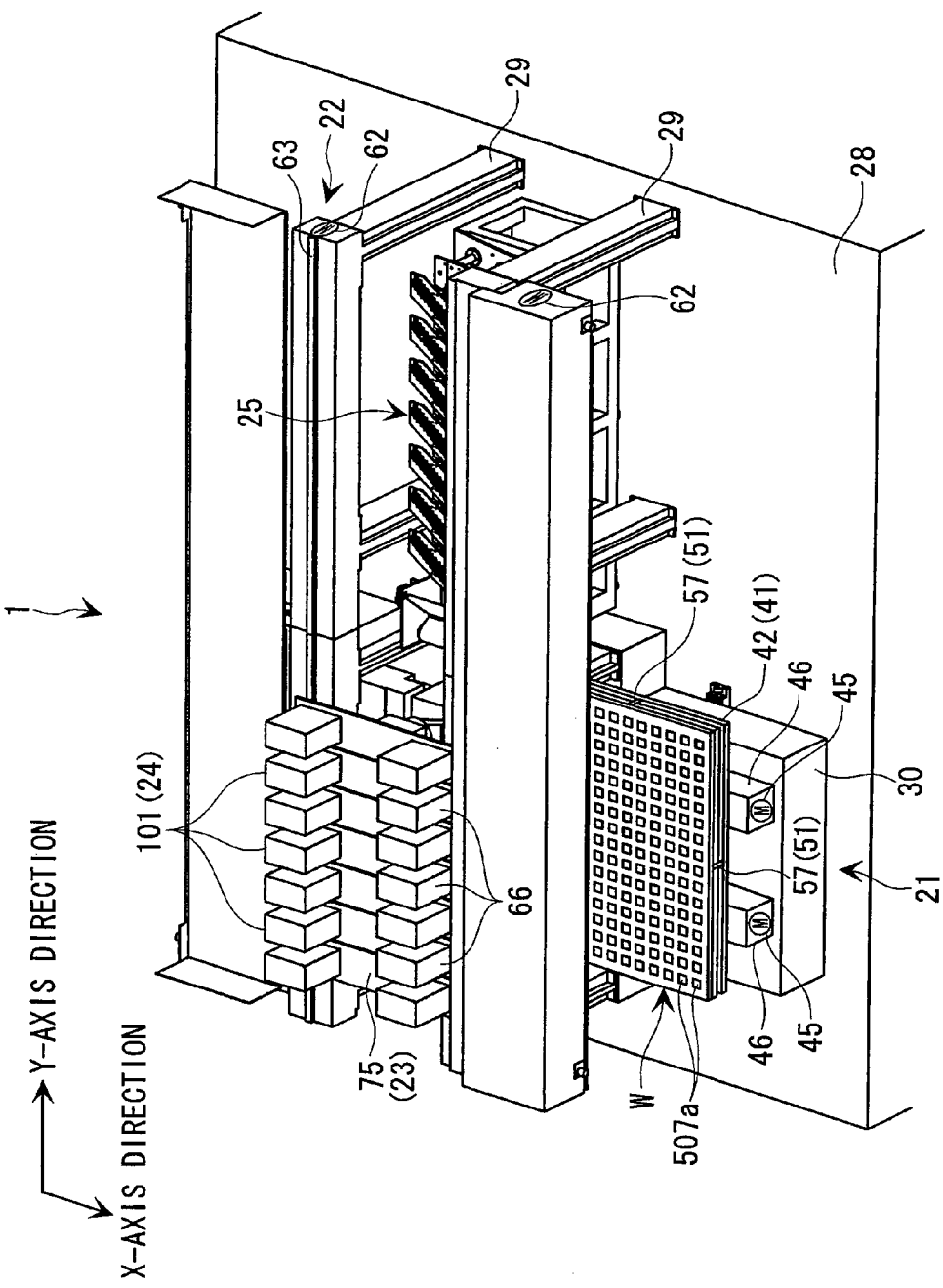
FIG. 4 is an external perspective view of a liquid droplet ejection apparatus according to a first embodiment of this invention.

As shown in FIG. 1, a work W is a transparent substrate (glass substrate) having dimensions of about 1500 mm long and 1800 mm wide and has a pair work alignment marks Wm formed respectively at the right and left peripheries thereof with which its position is recognized by a liquid droplet ejection apparatus 1 (see FIG. 4). The work W has a plurality of pixel areas 507*a* defined by a defining-wall section 507*b* (a bank-section) and arranged in a matrix pattern, in an area of its surface having dimensions of 1360 mm long and 1630 mm wide, excluding the above-mentions peripheries. Each pixel area 507*a* is formed as a depression having a square shape in plan view, is enclosed by the defining-wall section 507*b*, and serves as a landing area (see FIG. 22C) of function liquid droplets when a film deposited section, which will be described later, made up by three colors R (red), G (green), and B (blue) (coloring layers 508R, 508G, and 508B) is formed by a function liquid droplet ejection head 71. According to this embodiment, as shown in FIG. 2A, although a color arrangement pattern composed of the plurality of pixel areas 507*a* is of a stripe arrangement in which each horizontal row of the matrix of the pixel areas is made up by the mutually identical color areas, the pattern may be of a mosaic arrangement in which any three of the three pixel areas 507*a* aligning vertically or horizontally in the matrix are made up by three areas of three colors R, G, and B (see FIG. 2B). Alternatively, the pattern may be of a delta arrangement in which the plurality of pixel areas 507*a* is aligned in a zigzag pattern (see FIG. 2C).

An imaging system including the liquid droplet ejection apparatus will be briefly described. FIG. 3 is a diagrammatic plan view of an imaging systems S. As shown in the figure, the imaging system S is made up by three sets of imaging units Su and is used for manufacturing a color filter by forming the coloring layers 508R, 508G, and 508B of three colors R, G, and B on a work W (see FIG. 4) introduced in the system. The imaging units Su inherently correspond to the respective colors R, G, and B, and each imaging unit is designed so as to form one of the coloring layers corresponding one of the colors on a work W (a substrate) sequentially introduced in the system. Meanwhile, as will be described later, since each liquid droplet ejection apparatus 1 installed in the imaging system is constructed so as to eject (image with) three kinds function liquid (filter materials) of three colors, each imaging unit Su is capable of forming the coloring layers of three colors on a work W. That is, the imaging system eliminates a transfer operation of the work W among the imaging units Su, thereby effectively manufacturing a color filter.

Each imaging unit Su includes the liquid droplet ejection apparatus 1, a work-carrying in/out device 2 juxtaposed to the liquid droplet ejection apparatus 1, for carrying a work W in or out from the unit, and a host computer 3 connected to the respective devices, for controlling the overall imaging units Su, in order to form the three coloring layers 508R, 508G, and 508B of three colors. The liquid droplet ejection apparatus 1 is accommodated in a chamber device 4. The chamber device 4 is a so-called thermal chamber having the overall liquid droplet ejection apparatus 1 accommodated therein under temperature control so as to eject droplets onto a work W under the condition of a constant temperature. The chamber device 4 includes a box-shaped chamber main body 11 having the overall liquid droplet ejection apparatus 1 directly accommodated therein, an air conditioner 12 responsible for temperature control such that the temperature in the chamber main body 11 is constant, and a control board (not illustrated) controlling the air conditioner 12. Although not illustrated in the figure, the chamber main body 11 has an open/close door formed at the front part of the right side surface thereof, serving as a work-carrying in/out opening. For example, when a work W is introduced into the liquid droplet ejection apparatus 1, the work W can access to the liquid droplet ejection apparatus 1 accommodated in the chamber main body 11 through the open/close door.

The work-carrying in/out device 2 includes a robot arm 13 for transferring a work W, and, with the robot arm 13, transports an unimaged work W into the imaging unit Su through the open/close door so as to introduce it in the liquid droplet ejection apparatus 1, and also retrieves an imaged work W from the liquid droplet ejection apparatus 1 for transporting it outside the imaging unit Su.

Figure 14:
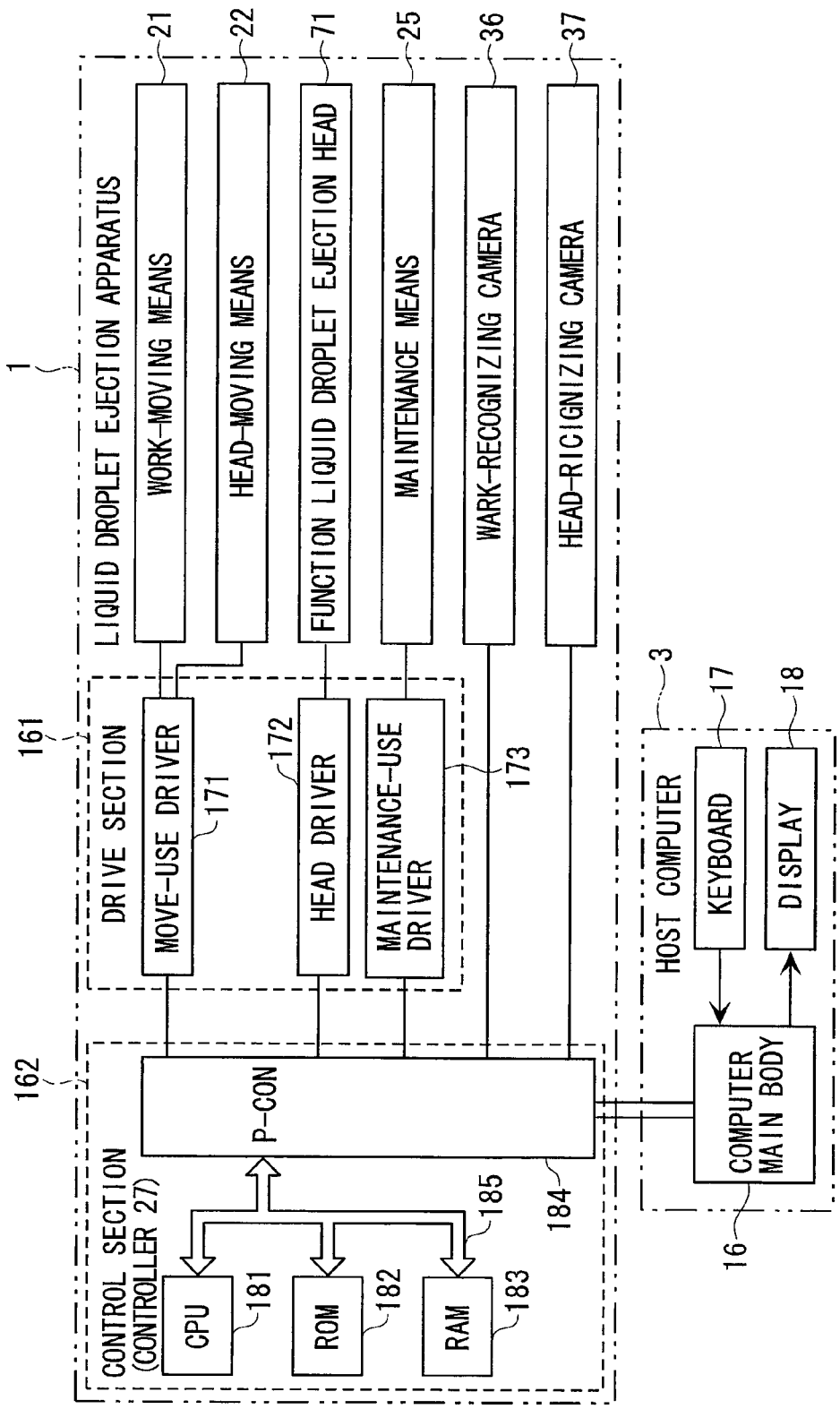
FIG. 14 is a block diagram illustrating a control system of the liquid droplet ejection apparatus.

The host computer 3 is configured by a personal computer and so forth and includes a keyboard 17, a display 18, and so forth other than a computer main body 16 (see FIG. 14).

An installation space 5 shown in the figure is used for installing a drying device, whereby the drying device for vaporizing a function-liquid solvent of function liquid ejected on a work W can be installed in the imaging unit Su if needed.

The liquid droplet ejection apparatus 1 according to a first embodiment of this invention will be described. As shown in FIGS. 4 to 7, the liquid droplet ejection apparatus 1 includes a large-sized common bed 28 installed on the floor; a setting table 41 disposed on the common bed 28 and setting a work W (see FIG. 4) thereon; work-moving means 21 (X-axis table)

reciprocating the work W in the X-axis direction through the setting table 41 (that is, scanning it in the main scanning direction); head-moving means 22 (Y-axis table) arranged in a manner of straddling the work-moving means 21; a plurality of (seven) carriage units 23, each having a plurality of (twelve) of the function liquid droplet ejection heads 71 placed thereon (see FIG. 8), movably and independently fixed to the head-moving means 22; function liquid feeding means 24 composed of seven function liquid feeding units 101, placed on the seven carriage units 23, and feeding the respective function liquid droplet ejection heads 71; maintenance means 25 disposed on the moving trajectory of the carriage units 23 moved by the head-moving means 22 and lying outside (in the figure, out on the right side of) the work-moving means 21, for maintaining the function liquid droplet ejection heads 71; and a flushing unit 26 disposed on the setting table 41, in charge of function recovery of the function liquid droplet ejection heads 71 together with the maintenance means.

Although not illustrated in the figures, the liquid droplet ejection apparatus 1 includes liquid feeding/recovering means which feeds liquid (function liquid and cleaning liquid) to each means and retrieves unnecessary liquid from the same; air feeding means feeding compressed air for driving and controlling each means; air sucking means for sucking a work W to the setting table 41 so as to set it on the same; a work-recognizing camera 36 recognizing the position of the work W; a head-recognizing camera 37 recognizing the positions of the carriage units 23; a controller 27 (a control section 162, see FIG. 14) connected to the host computer 3 so as to totally control the overall liquid droplet ejection apparatus 1, and so forth.

The liquid droplet ejection apparatus 1 has a structure in which, by driving the function liquid droplet ejection heads 71 in synchronization with driving the work-moving means 21, function liquid droplets of three colors R, G, and B are ejected so as to be landed in the pixel areas 507*a* formed on a work W for performing an imaging process of the work W, and, at the same time, during non-imaging time, for example, at the time of replacing a work with a new one, by driving the head-moving means 22, the carriage units 23 face the maintenance means 25, whereby the maintenance means 25 performs a maintenance process of the function liquid droplet ejection heads 71. As described above, since the liquid droplet ejection apparatus 1 is accommodated in the chamber device 4, most of processes including these imaging and maintaining processes are performed in the chamber device 4.

An area formed by moving trajectories of a work W moved by the work-moving means 21 and the carriage units 23 moved by the head-moving means 22 serves as an imaging area 31 for performing an imaging process therein. Also, an area lying on the moving trajectory of the carriage units 23 moved by the head-moving means 22, and outside the work-moving means 21 serves as a maintenance area 32 for a maintenance process, which will be performed by the maintenance means 25. The maintenance area 32 also serves as a head-replacement area for replacing the function liquid droplet ejection head 71 with new one. Meanwhile, the other end (lower side in the figure) of the work-moving means 21 serves as a work-carrying in/out area 33 for carrying a work W in or out the liquid droplet ejection apparatus 1, and the work-carrying in/out device 2 is disposed so as to face the work-carrying in/out area 33.

The work-moving means 21 is disposed on a stone surface plate 30 disposed on the common bed 28 and extending in the X-axis direction. The work-moving means 21 includes the setting table 41 including an absorption table 42 setting a work W thereon by absorption and a work θ-table 43 performing fine adjustment of the θ-position of the work W (θ-correction) through the absorption table 42; an X-axis air slider 44 slidably supporting the setting table 41 in the X-axis direction; a pair of right and left X-axis linear motors 45 extending in the X-axis direction and moving the work W in the X-axis direction through the setting table 41; a pair of X-axis guide rails 46 juxtaposed to the X-axis linear motors 45 and guiding move of the X-axis air slider 44; and an X-axis linear scale (not illustrated) detecting the position of the setting table 41. When driven, the pair of X-axis linear motors 45 move the X-axis air slider 44 in the X-axis direction while guiding the pair of X-axis guide rails 46 so as to move the work W set on the setting table 41 in the X-axis direction.

The absorption table 42 has work feeding/removing means 51 incorporated therein, for setting an unprocessed work W carried in the work-carrying in/out area 33 on the setting table 41 and for retrieving a processed work W from the setting table 41. The work feeding/removing means 51 includes a lift-up mechanism 56 placing and detaching the work W on and from the setting table 41; a pre-alignment mechanism 57 positioning (preliminarily aligning) an unprocessed work W placed on the absorption table 42 by the lift-up mechanism 56, relative to the absorption table 42, by sandwiching the work W from both the front and rear ends and the right and left ends of the work; and electricity-eliminating means (not illustrated) including an ionizer, for eliminating static electricity charged on the rear surface of the work W. The flushing unit 26 is supported by the X-axis air slider 44.

While being supported on a pair of front and rear support stands 29 extending in the Y-axis direction, the head-moving means 22 bridges the imaging area 31 and the maintenance area 32 and moves each of the seven carriage units 23 between the imaging area 31 and the maintenance area 32. The head-moving means 22 includes seven sets of Y-axis air sliders 61 supporting bridge plates 75 at both ends thereof, which will be described later, of the respective seven carriage units 23, so as to be aligned in the Y-axis direction; a pair of Y-axis linear motors 62 extending in the Y-axis direction and moving each bridge plate 75 in the Y-axis direction, through the corresponding set of the Y-axis air sliders 61; a pair of Y-axis guide rails 63 extending in the Y-axis direction and guiding move of the seven bridge plates 75; and a Y-axis linear scale (not illustrated) detecting the moving position of each carriage unit.

When the pair of Y-axis linear motors 62 is driven, the seven sets of Y-axis air sliders 61 are independently moved, whereby each of the seven carriage units 23 is individually moved in the Y-axis direction. Hence, this simple structure allows each of the seven carriage units 23 to be accurately moved independently from each other. As a matter of course, by simultaneously moving the seven sets of Y-axis air sliders 61 in the Y-axis direction, the seven carriage units 23 as a united body can be also moved in the Y-axis direction.

Each of the seven bridge plates 75 supported by the corresponding sets of the Y-axis air sliders 61 has head-use electrical units 66, each driving the twelve function liquid droplet ejection heads 71 placed on the corresponding carriage unit 23; and the function liquid feeding unit 101, disposed thereon. The seven head-use electrical units 66 are arranged in a zigzag pattern so as prevent interference with one another (for preventing noise), and the seven function liquid feeding units 101 are arranged in a zigzag pattern so as to face the respective head-use electrical units 66. Also, seven Y-axis cable carriers (not illustrated, Cableveyor: registered trade mark, made by Tsubakimoto Chain Co.) corresponding to the independently movable seven divided carriage units 23 and having a tube, a cable, and so forth connected the corresponding carriage unit 23 accommodated therein so as to follow the move of the corresponding carriage unit 23 are provided in two groups so as to correspond to the seven head-use electrical units 66 in a zigzag arrangement.

When the size of each head-use electrical unit 66 can be reduced, the seven head-use electrical units 66 may be arranged in a line close to the work-carrying in/out area 33. In this case, the seven function liquid feeding units 101 can be also arranged in a line close to the side opposite to the work-carrying in/out area 33 instead of zigzag arrangement, thereby easily achieving ink replacement.

Figure 6:
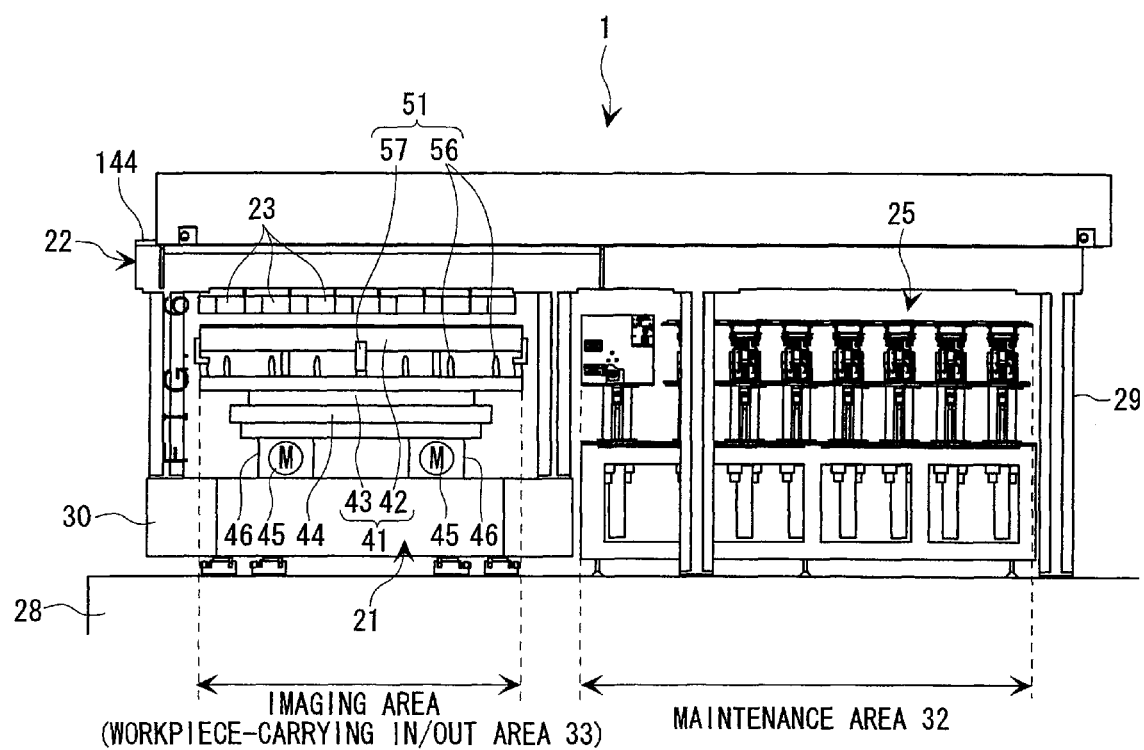
FIG. 6 is an elevational view thereof.

As shown in FIG. 6, the respective seven sets of Y-axis air sliders 61 of the seven carriage units 23 are supported by the head-moving means 22 and aligned in the Y-axis direction. Thus, all nozzles 95 (ejection nozzles, see FIG. 9B, 12×7 pieces in total) of all function liquid droplet ejection heads 71 of the seven carriage units make up a single imaging line L (see FIG. 10). With this structure, by independently moving the carriage units 23 from one another to the maintenance area 32, every carriage units 23 can be maintained by the maintenance means 25, and also, the function liquid droplet ejection heads 71 of every carriage units 23 can be replaced with new ones, thereby achieving a large-sized head unit capable of forming a wide imaging line (a long line) without deteriorating workability of maintaining and replacing the function liquid droplet ejection heads 71 with new ones.

As long as a single of the imaging line L is formed, the seven carriage units 23 may be arbitrarily arranged. Also, as a matter of course, the number of the carriage units 23 and the number of the function liquid droplet ejection heads 71 placed on the corresponding carriage unit 23 may be arbitrarily set.

Figure 9A:
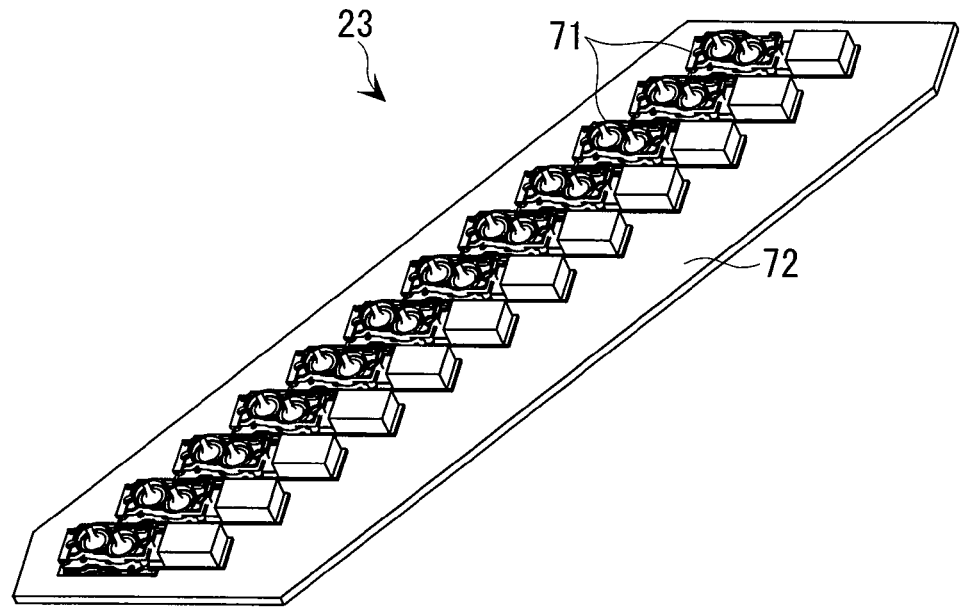
Figure 9B:
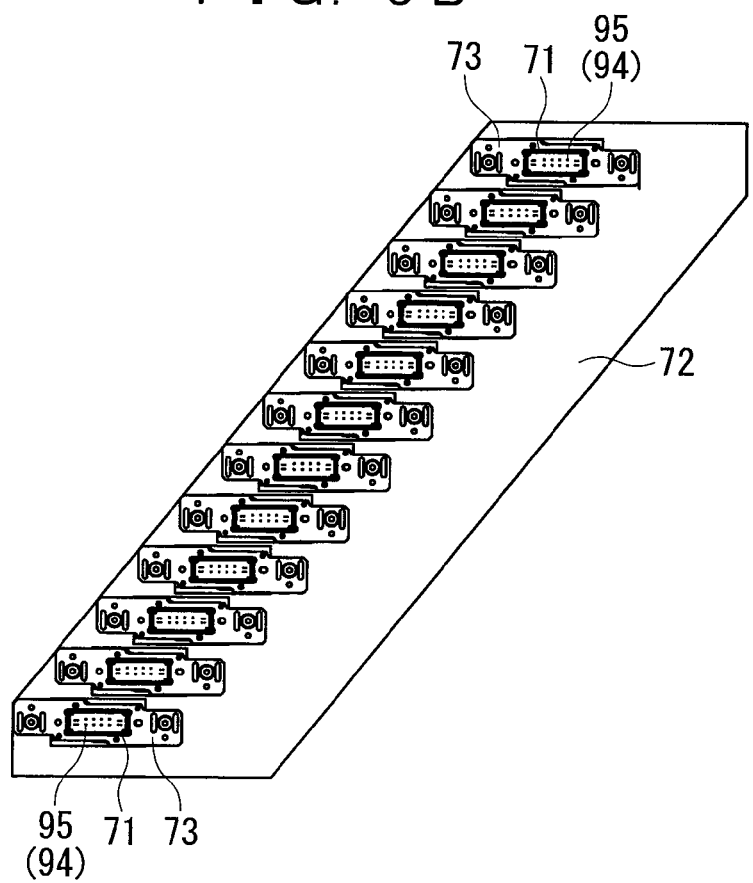

As shown in FIGS. 7 to 9, each carriage unit 23 includes the twelve function liquid droplet ejection heads 71; a head plate 72 supporting the twelve function liquid droplet ejection heads 71; twelve head-holding members 73 fixing the respective twelve function liquid droplet ejection heads 71 to the head plate 72 from the rear surface thereof; a carriage 74 supporting the head plate 72; and the bridge plate 75 having the carriage 74 suspended therefrom and supported by the corresponding set of the Y-axis air sliders 61 at both ends thereof. The carriage 74 includes a head θ-table 76 performing fine adjustment (θ-correction) of the θ-position of the function liquid droplet ejection heads 71 through the head plate 72.

The head plate 72 is formed of a thick plate composed of a stainless steel or the like, having an approximately parallelogram in plan view, positions the twelve function liquid droplet ejection heads 71, and has twelve fixing perforations (not illustrated) formed therein, for fixing the respective function liquid droplet ejection heads 71 by the corresponding head-holding members 73. The head plate 72 also has a valve unit 105 fixed thereon, which will be described later, of the function liquid feeding unit 101.

In a state of being placed on the carriage 74, each function liquid droplet ejection head 71 is positioned and fixed to the head plate 72 such that two nozzle rows 94, which will be described later, lie parallel to the Y-axis direction. The twelve function liquid droplet ejection heads 71 are arranged in a stepwise pattern in the X-axis and Y-axis directions by closely overlapping them one another in their width direction and also by shifting them one after another by half the length of the nozzle row 94 in their longitudinal direction. Thus, a plurality of the nozzles 95 lies continuously in the Y-axis direction and forms a divided imaging line LD (see FIG. 10); that is, the above-described imaging line L is made up by the seven-divided imaging lines LD lying continuously in the Y-axis direction.

In each function liquid droplet ejection head 71, due to the structure of an in-head flow path (not illustrated), which will be described later, an ejection amount of each of the nozzles 95 lying at both ends thereof is greater than that of the nozzle 95 lying at the central part thereof; hence, it is preferable that the nozzles 95 lying at both ends thereof be arranged so as to eject no function liquid droplets and the other nozzles 95 serve as ejection nozzles. In this case, the twelve function liquid droplet ejection heads 71 are arranged such that the nozzles 95 lying at both ends thereof overlap one another in the Y-axis direction.

As long as the plurality of the nozzles 95 of each of the twelve function liquid droplet ejection heads 71 placed on the head plate 72 continuously form the divided imaging line LD in the Y-axis direction, the function liquid droplet ejection heads 71 on the head plate 72 can be arbitrarily arranged. For example, as will be described in a second embodiment, the twelve function liquid droplet ejection heads 71 are possibly divided into two sets, each having six heads, in the Y-axis direction and also, the function liquid droplet ejection heads 71 of each set having six heads are arranged in a stepwise pattern (see FIG. 19). As described above, when a plurality of the function liquid droplet ejection heads 71 is divided into a plurality of sets and arranged, the head plate 72 has a reduced width in the X-axis direction. As a matter of course, the number of the function liquid droplet ejection heads 71 placed on the corresponding carriage unit 23 can be arbitrarily set.

Figure 10:
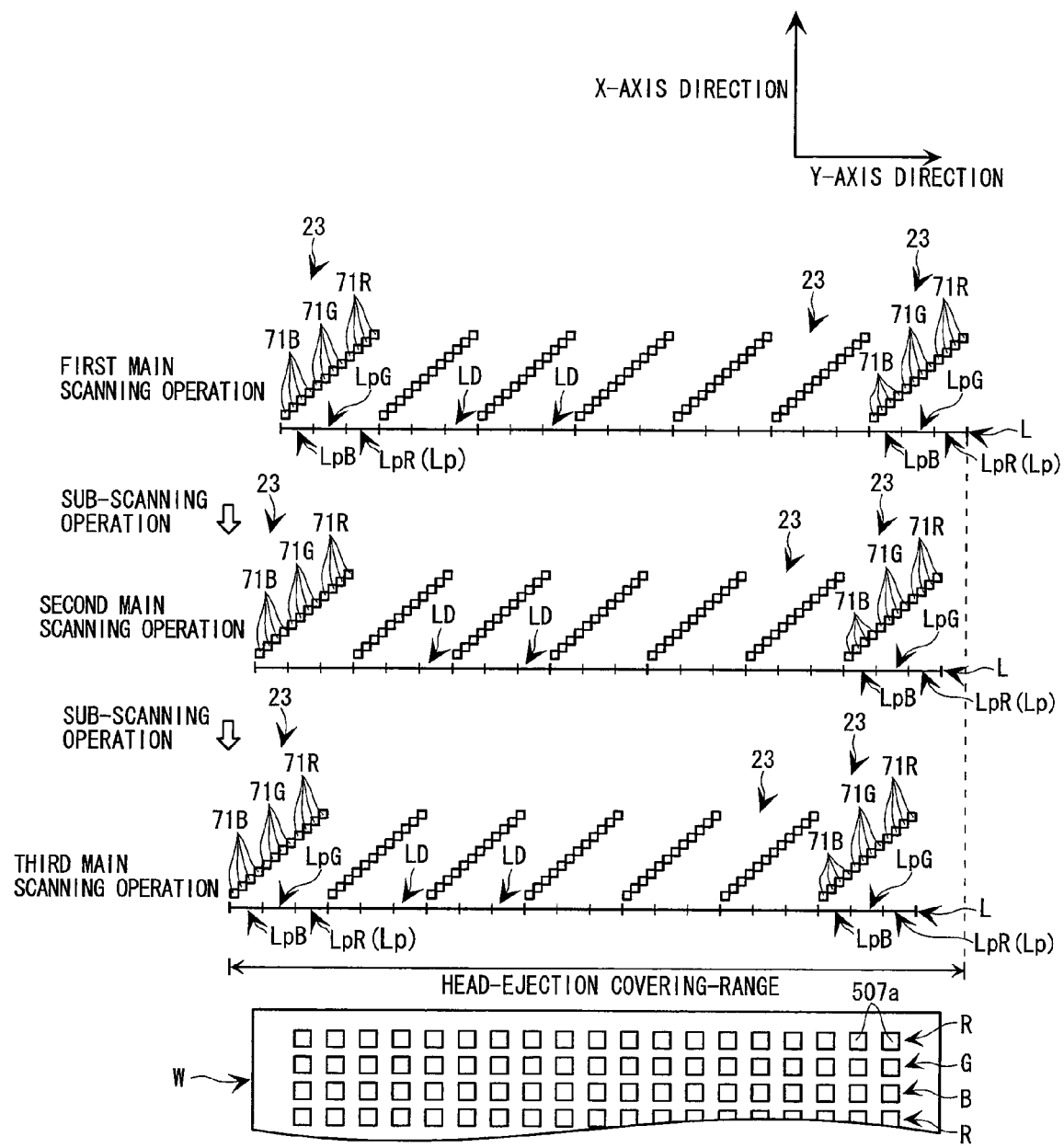
FIG. 10 illustrates sub-scanning operations for performing an imaging process, in which the seven carriage units move in the Y-axis direction relative to a work.

FIG. 10 illustrates a sub-scanning operation in which, relative to a work W, the seven carriage units 23 move in the Y-axis direction for performing an imaging process. As shown in the figure, the twelve function liquid droplet ejection heads 71 of each carriage unit 23, in a unit of four pieces, serve as R-related function liquid droplet ejection heads 71R, G-related function liquid droplet ejection heads 71G, and B-related function liquid droplet ejection heads 71B respectively having three kinds of function liquid of three colors R, G, and B introduced therein, in order from the right side of the figure. That is, the twelve function liquid droplet ejection heads 71 of each carriage unit 23 are arranged such that partial imaging lines Lp of the respective colors are formed by a plurality of the nozzles 95 of all (four) function liquid droplet ejection head 71 for each color, and the partial imaging lines LpR, LpG, and LpB of the three colors R, G, and B are connected one another in the Y-axis direction, in order from the right side of the figure, so as to make up a single of the divided imaging line LD. Thus, as the overall seven carriage units 23, the seven partial imaging lines Lp for each color are connected one another in the Y-axis direction in order of R, G, and B colors and make up a single of the imaging line L.

The imaging line L is set so as to have a length equivalent to extended one of the long side (about 1630 mm) of the area of the surface of the work W, having the pixel areas 507a formed thereon, extended by two times the length (90 mm) the partial imaging line Lp, resulting in about 1900 mm, whereby function liquid droplet can be ejected so as to be landed on the entire work W through a common main scanning operation.

In this embodiment, as described above, the color arrangement pattern composed of the plurality of pixel areas 507a is formed such that, while any three pixels arranged in the X-axis direction serve as color pixels of three colors R, G, and B, the plurality of color-dependent function liquid droplet ejection heads 71 are arranged so as to be shifted one after another in the Y-axis direction; hence, function liquid droplet cannot be landed in all pixel areas 507a through a common main scanning operation, whereby at least three main scanning operations must be independently performed. During each time period among the three main scanning operations, two sub-scanning operations are performed so as to move each function liquid droplet ejection head 71 by a length of the partial imaging line Lp in the Y-axis direction through the corresponding carriage unit 23. These operations will be described in detail later. Accordingly, the seven carriage units 23 move in the Y-axis direction by a length of two times the partial imaging line Lp through three main scanning operations (and two sub-scanning operations among the three main scanning operations. That is, on the occasion of performing an imaging process, all function liquid droplet ejection head 71 of the seven carriage units 23 cover a range (a head-ejection covering-range Rh) equivalent to the length of an extended one of the imaging line L extended by two times (times of the number of sub-scanning operations) the partial imaging line Lp in the Y-axis direction.

Although, in FIG. 10, a single of the pixel area 507a corresponds to the three function liquid droplet ejection head 71 with respect to the Y-axis direction, due to limitation of making the imaging, a plurality of the pixel areas 507a practically corresponds to a single of the function liquid droplet ejection heads 71.

Figure 11:
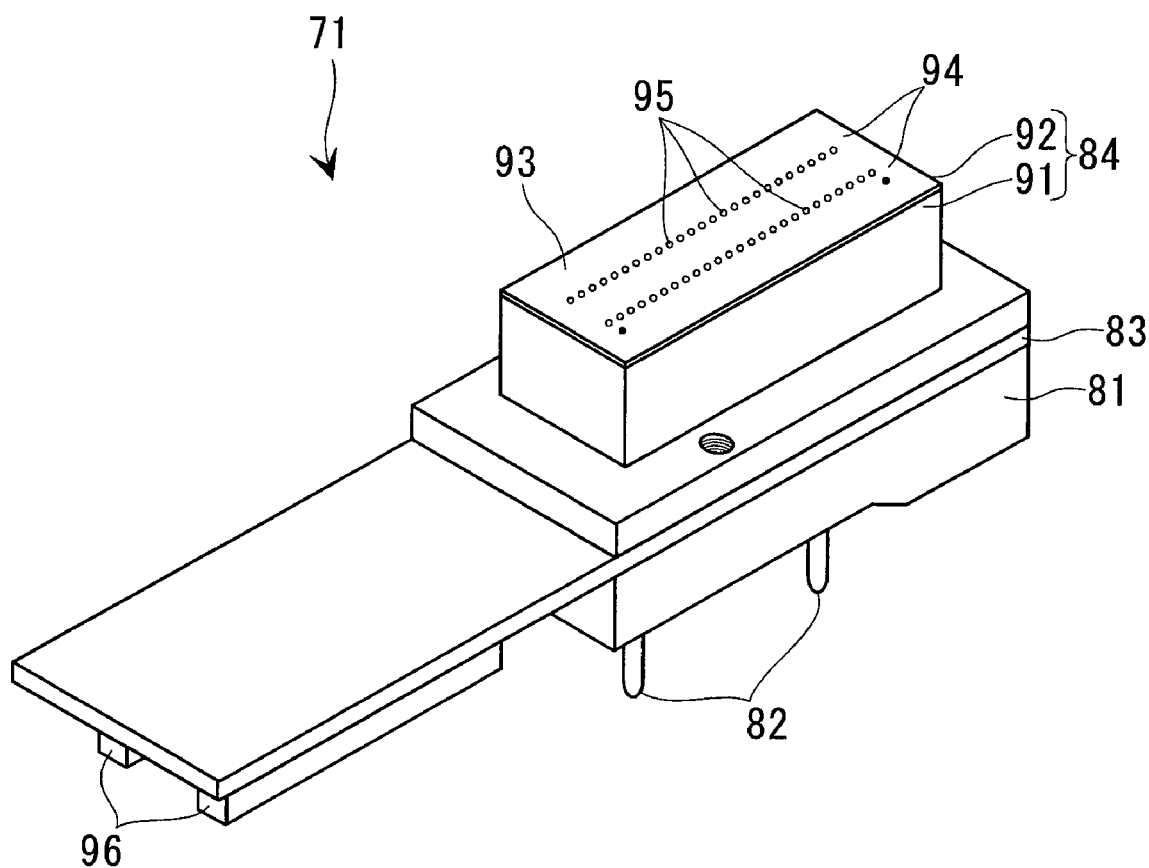
FIG. 11 is an external perspective view of a function liquid droplet ejection head.

As shown in FIG. 11, the function liquid droplet ejection head 71 is of a so-called duplex type and includes a function liquid introduction section 81 including duplex-type connecting needles 82; a duplex-type head substrate 83 in connection to the function liquid introduction section 81; and a head main body 84 connected to the lower part (the upper part in the figure) of the function liquid introduction section 81 and having a liquid path formed therein, filled with function liquid. The connecting needles 82 are connected to a function liquid tank 103, which will be described later, and feed function liquid to the liquid path in the function liquid droplet ejection head 71. The head main body 84 includes a cavity 91 composed of a piezoelectric element and so forth; and a nozzle plate 92 having a nozzle surface 93 having the two nozzle rows 94 formed thereon so as to be parallel to each other. Each nozzle row 94 is made up by a plurality (180 pieces) of the nozzles 95 arranged at an equal pitch. The head substrate 83 has duplex-type connectors 96 disposed therein, connected to the head-use electrical unit 66 with a flexible flat cable. When the function liquid droplet ejection head 71 is driven for ejecting function liquid droplets by applying a drive waveform on the cavity 91, a pumping action of the cavity 91 causes the nozzles 95 to eject function liquid droplets.

Figure 5:
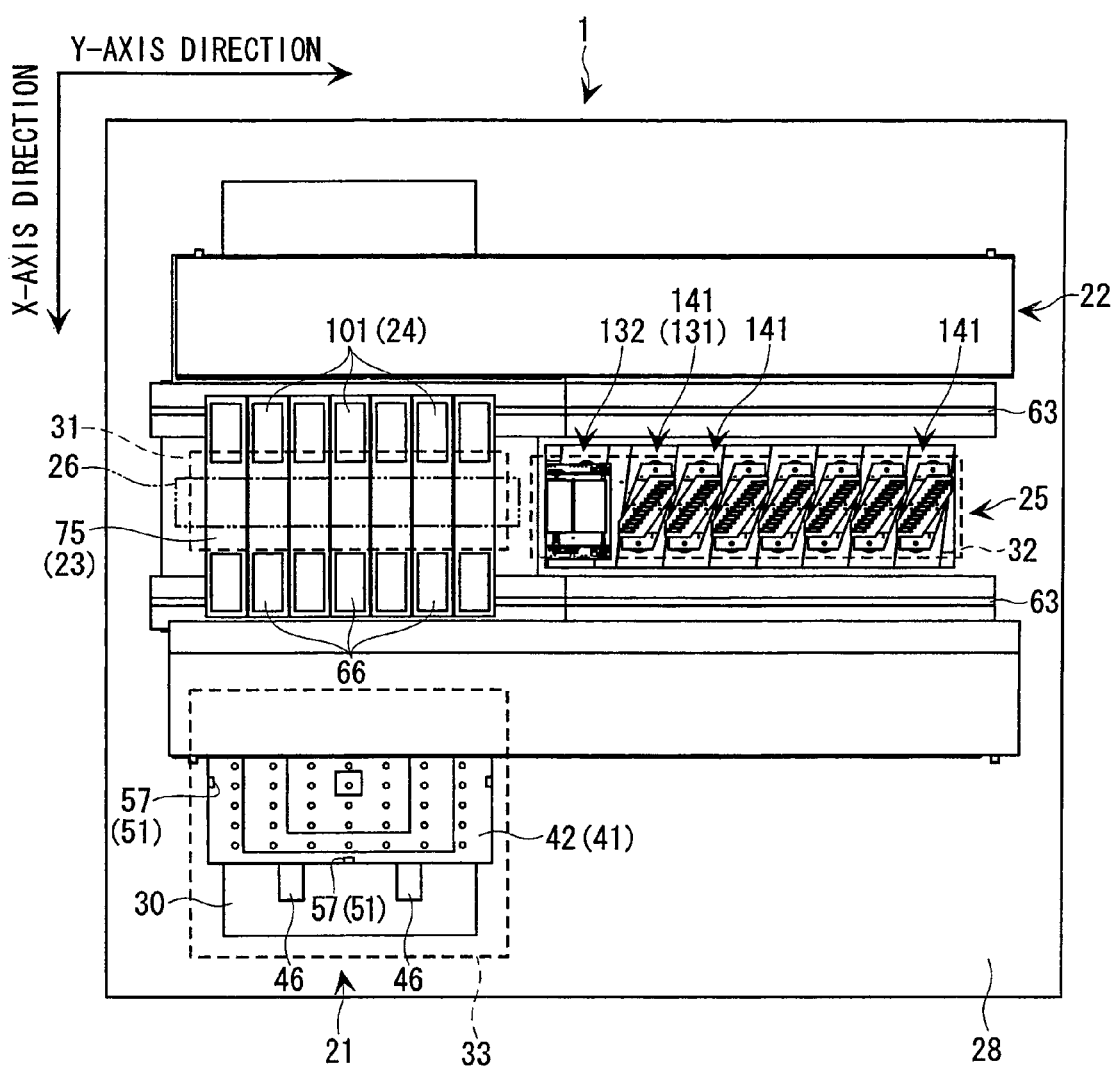
FIG. 5 is a plan view thereof.

As shown in FIGS. 4 and 5, the function liquid feeding means 24 is made up by the seven function liquid feeding units 101 corresponding to the respective seven carriage units 23. As shown in FIGS. 8 and 12, each function liquid feeding unit 101 includes a tank unit 102 including a plurality of (twelve) function liquid tanks 103 storing function liquid; twelve function liquid feeding tubes 104 connecting one of the twelve function liquid tanks 103 and the corresponding one of the twelve function liquid droplet ejection heads 71 to each other; and the valve unit 105 including twelve pressure regulators 106 disposed in the respective twelve function liquid feeding tube 104. A unit of four of the twelve function liquid tanks 103 of each tank unit 102 stores a corresponding one of three kinds of function liquid of three colors. Thus, function liquid in each function liquid tank 103 is introduced in the corresponding function liquid droplet ejection head 71 through the function liquid feeding tube 104. For example, the R-related function liquid droplet ejection head 71R is connected to the function liquid tank 103 storing R-color function liquid and accordingly has R-color function liquid introduced therein.

It is preferable that the function liquid tank 103 be of a resin cartridge type having a function liquid pack accommodated therein, in which function liquid is packed in a vacuumed state and that function liquid be previously deaerated.

As shown in FIG. 8, the valve unit 105 is disposed on the head plate 72 and includes the twelve pressure regulators 106 and twelve valve-fixing units 107 fixing the corresponding twelve pressure-regulators 106 to the head plate 72. The twelve pressure-regulators 106 are disposed on the head plate 72 so as to be arranged in a stepwise pattern in following-suit of the stepwise arrangement of the twelve function liquid droplet ejection heads 71. By arranging the twelve pressure regulators 106 in following-suit of the arrangement of the twelve function liquid droplet ejection heads 71 as described above, the function liquid feeding tubes 104 between the function liquid droplet ejection heads 71 and the corresponding pressure regulator 106 have the common length, whereby function liquid having the common pressure as one another is fed to the twelve function liquid droplet ejection heads.

While each function liquid tank 103 is placed on the bridge plate 75 in this embodiment, it may be placed on the head plate 72. This arrangement makes the length of the function liquid feeding tube 104 extending from the function liquid tank 103 to the function liquid droplet ejection head 71 shorter, thereby leading to effective use of function liquid.

Figure 12A:
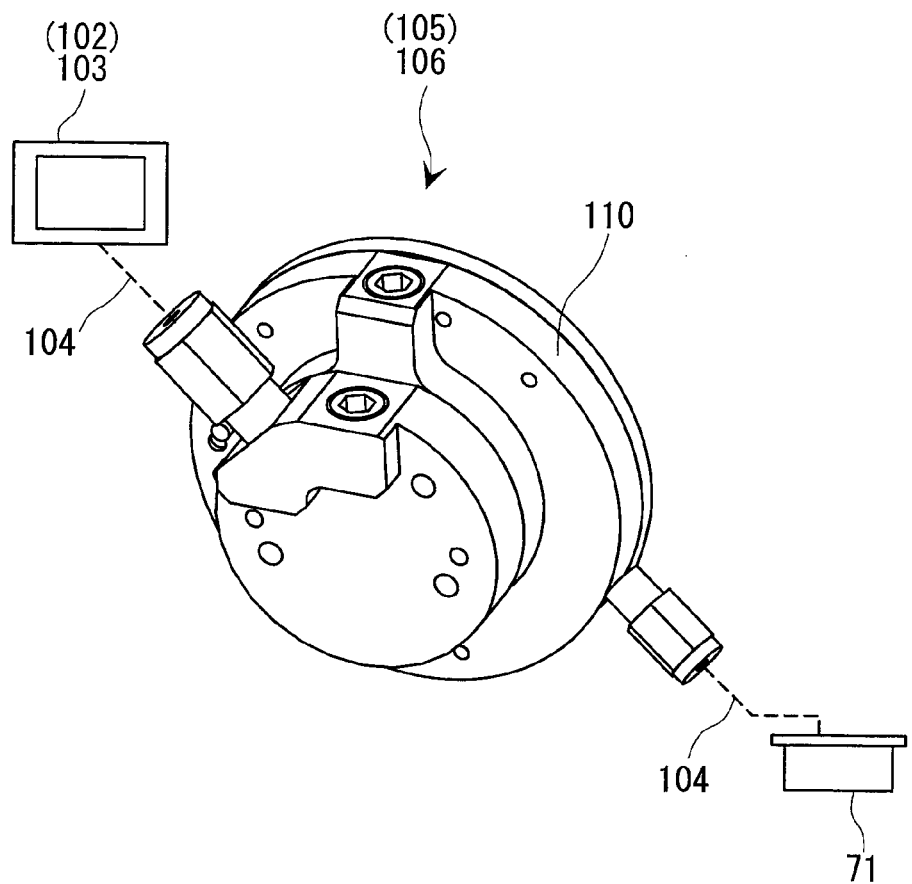
Figure 12B:
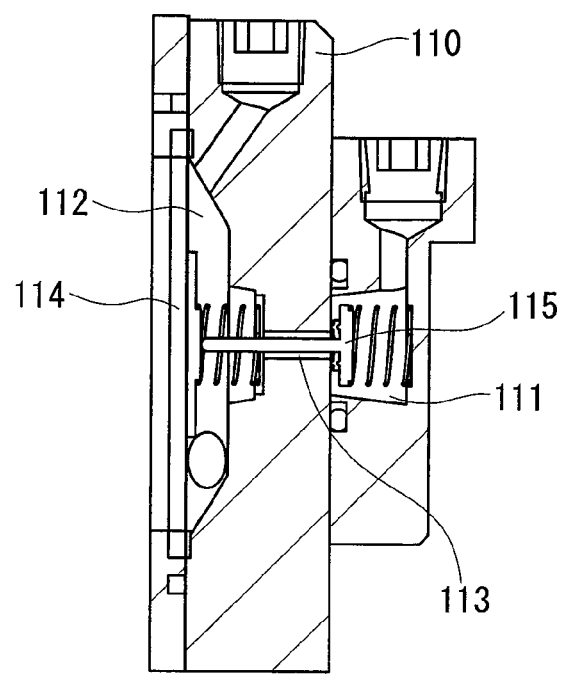

As shown in FIGS. 12A and 12B, each pressure regulator 106 has a structure in which a valve housing 110 has a first chamber 111 in communication with the function liquid tank 103; a second chamber 112 in communication with the function liquid droplet ejection head 71; and a communication flow-path 113 allowing the first chamber 111 and the second chamber 112 to communicate with each other, formed therein. The second chamber 112 has a diaphragm 114 disposed on one of its surfaces so as to face outwards, and a valve disk 115 performing an opening/closing action with the diaphragm 114 is disposed in the communication flow-path 113.

Function liquid introduced from the function liquid tank 103 into the first chamber 111 is fed to the function liquid droplet ejection head 71 through the second chamber 112. On this occasion, the diaphragm 114 is deformed due to the pressure in the chamber device 4 (generally, the atmospheric pressure). With this deformation, the valve disk 115 disposed in the communication flow-path 113 performs an opening/closing action, and the pressure in the second chamber 112 is adjusted such that function liquid in the second chamber 112 has a slight negative pressure. By disposing the above-described pressure regulator 106 between the function liquid tank 103 and the function liquid droplet ejection head 71, the head pressure between the function liquid tank 103 and the function liquid droplet ejection head 71 does not fluctuate excessively, thereby allowing function liquid to be stably ejected from the function liquid droplet ejection head 71. The valve unit 105 is not limited to being disposed on the head plate 72 and may be alternately disposed on the bridge plate 75.

As shown in FIGS. 5 and 7, the flushing unit 26 is provided for receiving function liquid droplets ejected by a flushing operation, that is, ejected by a preliminary (disposal) ejection operation of the function liquid droplet ejection head 71, especially for receiving function liquid ejected by a regular flushing operation performed, for example, during replacing a work W with new one. The flushing unit 26 lies at the leading side of a work W on the setting table 41, defined when the work W moves forward (moves from the lower to upper sides in the figure), is disposed along the long side of the setting table 41 (extending in the Y-axis direction), and includes a regular flushing box 121 directly receiving function liquid and a box-supporting member 122 fixed to the X-axis air slider 44 and supporting the regular flushing box 121.

The regular flushing box 121 is formed in a box shape having a rectangular shape in plan view and has a member (not illustrated) absorbent to function liquid, disposed at the bottom surface thereof. The long side (extending in the Y-axis direction) of the regular flushing box 121 is formed so as to correspond to the head-ejection covering-range Rh. With this arrangement, even when the carriage unit 23 performs a sub-scanning operation and then moves in the Y-axis direction in the head-ejection covering-range Rh, the regular flushing box 121 can receive flushed function liquid ejected from all function liquid droplet ejection heads 71 placed on the seven carriage units 23. The short side of the regular flushing box 121 (extending in the X-axis direction) is also preferably formed so as to correspond to the length of the seven carriage units 23 extending in the X-axis direction.

Although not illustrated in the figures, the absorption table 42 has a pre-ejection flushing box disposed thereon close to the imaging area 31. When a work W moves forwards in the X-axis direction, the carriage unit 23 faces the pre-ejection flushing box and then the work W. Hence, a pre-ejection flushing operation can be performed immediately before facing the work W, thereby effectively preventing the nozzles from clogging. The long side of the pre-ejection flushing box (extending in the Y-axis direction) is formed so as to correspond to the head-ejection covering-range Rh in the same fashion as the regular flushing box 121.

Although, in this embodiment, function liquid droplets are ejected and landed onto a work W only when the work W moves forwards, function liquid droplets may be ejected from the function liquid droplet ejection head 71 also when a work W moves backwards (from the upper to lower sides in FIG. 5). In this case, a pair of the pre-ejection flushing boxes is preferably provided so as to sandwich the setting table 41 in the X-axis direction. With this structure, a flushing operation can be performed immediately before drive for ejecting function liquid droplets in accordance with reciprocal move of a work W.

As described above, the flushing operations is made up by the pre-ejection flushing operation performed immediately before ejecting function liquid droplets onto (imaging on) a work W and the regular flushing operation performed when an imaging operation performed onto a work W is temporarily suspended, for example, at the time of replacing the work W with new one.

Figure 13:
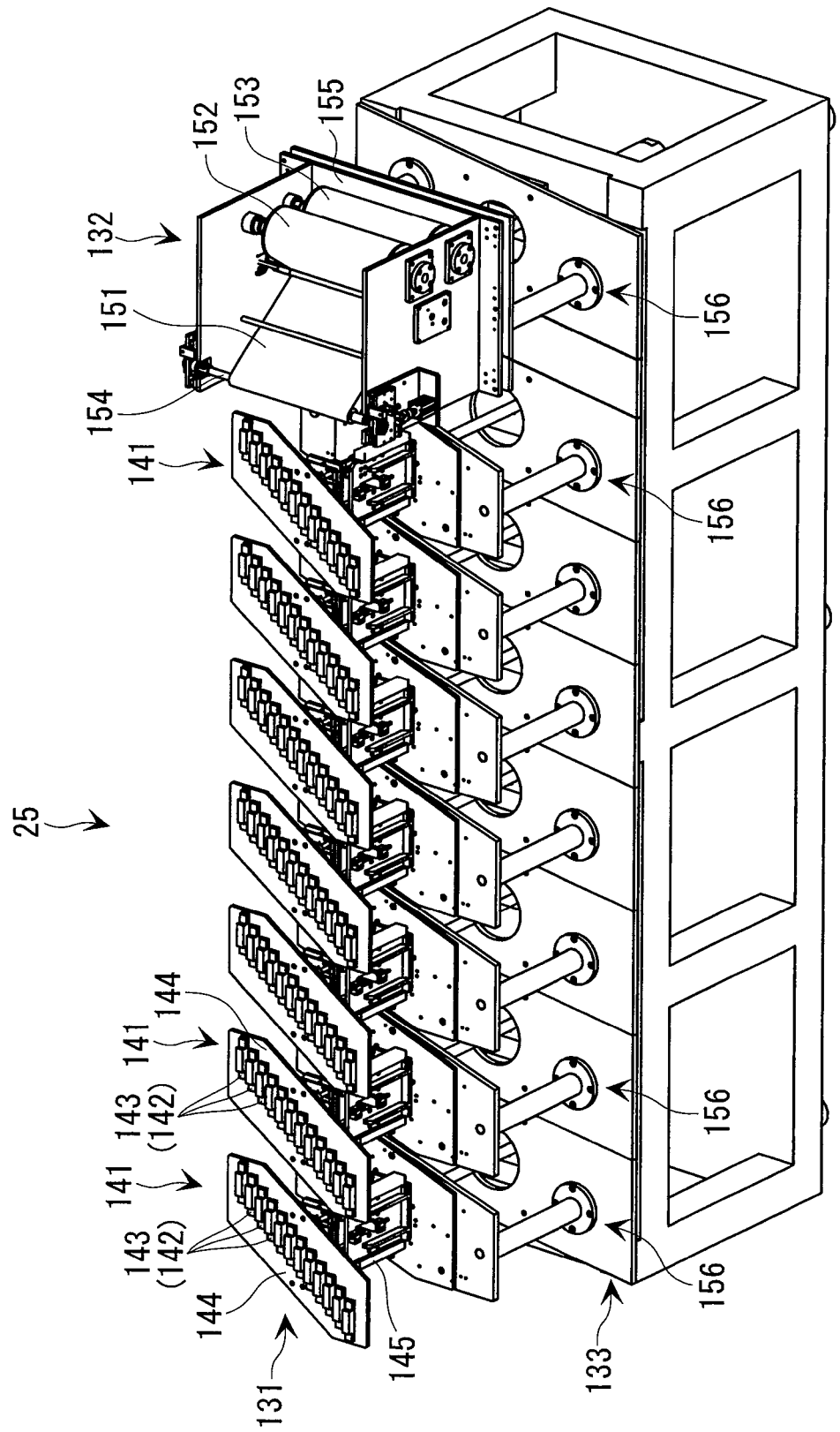
FIG. 13 is an external perspective view of maintenance means.

Referring now to FIG. 13, the maintenance means 25 will be described. The maintenance means 25 includes a suction unit 131, a wiping unit 132, and a unit elevation mechanism 133, which are all disposed in the maintenance area 32 (see FIGS. 5 and 6).

The suction unit 131 serves for sucking the function liquid droplet ejection heads 71 so as to forcefully expel function liquid from the same. The suction unit 131 is made up by seven divided suction units 141 so as to correspond to the seven carriage units 23. The seven divided suction units 141 are arranged in the Y-axis direction in following-suit of the arrangement of the seven carriage units 23 and are also individually supported by the unit elevation mechanism 133 so as to be elevatable.

Each divided suction unit 141 faces the corresponding carriage unit 23 from the lower side thereof and includes a cap unit 142 including twelve caps 143 sealing the corresponding nozzle surfaces 93 of the twelve function liquid droplet ejection heads 71; a cap-supporting member 145 supporting the cap unit 142 so as to be elevatable; and an ejector (not illustrated) applying a suction force on the function liquid droplet ejection heads 71 through the respective sealing caps 143.

The cap unit 142 has a structure in which a cap base 144 having the twelve caps 143 disposed thereon so as to correspond to the arrangement of the twelve function liquid droplet ejection heads 71 placed on the corresponding the carriage unit 23. With this structure, as the overall suction unit 131, the caps 143 having a number of twelve multiplied by seven (12×7 pieces) are arranged in following-suit of the arrangement pattern of all function liquid droplet ejection heads 71 placed on the seven carriage units 23, whereby the caps 143 corresponding to all function liquid droplet ejection heads 71 can be use for sealing the same at once. By driving the ejector in a state in which the nozzle surfaces 93 are sealed by the respective caps 143, function liquid is sucked from the nozzles 95. With this operation, function liquid having an increased viscosity in the function liquid droplet ejection head 71 can be removed. As will be described later, since the nozzle surfaces 93 of some of the function liquid droplet ejection heads 71 sucked by the suction unit 131 sometimes have function liquid droplets accreted thereon, the function liquid droplet ejection heads 71 are arranged so as to face the wiping unit 132 for undergoing a wiping operation.

The suction unit 131 is provided not only for sucking the function liquid droplet ejection heads 71 but also for receiving function liquid expelled by the regular flushing operation as described above. In other words, each cap 143 of the suction unit 131 serves also as the flushing box. The suction unit 131 can be also used for preventing the nozzles 95 from drying by sealing the nozzle surfaces 93 of the function liquid droplet ejection heads 71 by the corresponding caps 143, for example, during a non-imaging process of the liquid droplet ejection apparatus 1.

The wiping unit 132 is disposed between the imaging area 31 and the suction unit 131, that is, close to the imaging area 31 in the maintenance area 32, and, with a wiping sheet 151, wipes dirty nozzle surfaces having function liquid droplets accreted thereon, for example, by sucking the function liquid droplet ejection heads 71. With such an arrangement, the wiping unit 132 can successively face the carriage units 23 sucked by the suction unit 131 and moving individually to the imaging area 3, thereby allowing the function liquid droplet ejection heads 71 to be subjected to a wiping process.

Also, the wiping unit 132 includes a delivery reel 152 (an upper one in the figure) delivering out the wiping sheet 151 (in its extending direction); a take-up reel 153 (lower one in the figure) taking up the delivered wiping sheet 151; a cleaning-liquid feeding unit (not illustrated) dispersing cleaning liquid across the delivered wiping sheet 151; a wipe-out unit 154 facing the function liquid droplet ejection heads 71 from the lower side thereof and wiping out the nozzle surfaces 93 with the wiping sheet 151; and a wiping frame 155 supporting these components. Cleaning-liquid fed to the wiping sheet 151 is a solvent of relatively volatile function liquid, thereby effectively eliminating functional drupelets accreted on the nozzle surfaces 93 of the function liquid droplet ejection heads 71.

By driving the head-moving means 22 so as to cause the carriage units 23 to successively face the wiping unit 132 one by one, by bringing the wiping sheet 151 having cleaning liquid contained therein in a state of contacting with the nozzle surfaces 93 of the twelve function liquid droplet ejection heads 71, and also by moving the carriage unit 23 in the Y-axis direction (toward the imaging area 31) with the head-moving means 22, the nozzle surfaces 93 are wiped out by the wiping sheet 151. With this arrangement, the twelve function liquid droplet ejection heads 71 placed on the corresponding carriage unit 23 are successively wiped. Since a wiping operation is performed in a direction in agreement with that of the nozzle rows 94 (in the Y-axis direction), mutually different kinds of function liquid are not wiped by the common part of the wiping sheet 151, thereby preventing the different kinds of function liquid from mixing with each other on the nozzle surfaces. 93.

The unit elevation mechanism 133 includes eight divided unit elevation mechanisms 156 individually supporting the seven divided suction units 141 of the suction unit 131 and the wiping unit 132 so as to be elevatable. Each divided unit elevation mechanism 156 is made up by a cylinder and so forth and individually elevates the seven divided suction units 141 and the wiping unit 132 between a predetermined maintenance position (an access position) for maintaining the function liquid droplet ejection head 71 and a predetermined retraction position of the same. During replacing the function liquid droplet ejection head 71 with new one, by driving each divided unit elevation mechanism 156 so as to move down the suction unit 131 and the wiping unit 132, a working area is kept above the suction unit 131 and the wiping unit 132.

As described above, since the function liquid droplet ejection head 71 undergoes a sucking operation by the suction unit 131 and a wiping operation by the wiping unit 132, the ejecting feature of the function liquid droplet ejection heads 71 of each carriage unit 23 can be satisfactorily maintained. In addition, the suction unit 131 is made up by the seven divided suction units 141 so as to correspond to the seven carriage units 23, thereby achieving easy assembling work of each divided suction unit 141.

While the maintenance means is provided in a single of the maintenance area 32 in this embodiment, as shown in FIGS. 5 and 6, a pair of the maintenance areas 32 may be provided on the moving trajectory of the carriage units 23 moved by the head-moving means 22 and outside both sides of the work-moving means 21 (the imaging area 31) such that the maintenance areas 32 have the respective maintenance means 25 disposed therein. With this structure, the seven carriage units 23 can be maintained by dividing them into two groups (for example, one group of three pieces and the other group of four pieces), a function-recovery process of the function liquid droplet ejection heads 71 can be quickly performed. Also, for example, during replacing the function liquid droplet ejection head 71 with new one, one group of the carriage units 23 can be arranged so as to face one of the pair of the maintenance means 25 for achieving head replacement, and, at the same time, the other group of the carriage units 23 can be arranged so as to face the other maintenance means 25 for achieving the function-recovery process of the function liquid droplet ejection heads 71 of these carriage units 23, thereby leading to no requirement of suspending an operation of the liquid droplet ejection apparatus 1. In the case of providing the pair of maintenance areas 32 as described above, the number of the divided suction units 141 making up the suction unit 131 of each maintenance means can be three or four.

Referring now to FIG. 14, the control system of the overall liquid droplet ejection apparatus 1 will be described. The control system of the liquid droplet ejection apparatus 1 basically includes the foregoing host computer 3; the function liquid droplet ejection heads 71, a drive section 161 including a variety of drivers and driving the work-moving means 21, the head-moving means 22, the maintenance means 25, and so forth; and the control section 162 (the controller 27) totally controlling the overall liquid droplet ejection apparatus 1 including the drive section 161.

The drive section 161 includes a move-use driver 171 individually controlling drive of a motor of each of the work-moving means 21 and the head-moving means 22; a head driver 172 controlling drive of the function liquid droplet ejection heads 71 for ejecting function liquid; a maintenance-use driver 173 controlling drive of each of the suction unit 131 of the maintenance means 25, the wiping unit 132, and the unit elevation mechanism 133.

The control section 162 includes a CPU 181; a ROM 182; a RAM 183; and a P-CON 184, and these components are connected to one another with a bus 185. The ROM 182 has a control program area storing, for example, a control program processed by the CPU 181 and a control data area storing control data for performing an imaging operation, a function-recovery process, and the like.

The RAM 183 has a variety of storing sections such as an imaging-data storing section storing imaging data for imaging on a work W and a positional-data storing section storing positional data of the work and the function liquid droplet ejection heads 71, other than a variety of register groups. Also, the RAM 183 serves as a working area for processing the controls. The P-CON 184 has the work-recognizing camera 36, the head-recognizing camera 37, and the like, connected thereto, in addition to the variety of drivers of the drive section 161. Also, the RAM 183 has a logical circuit incorporated therein, for compensating the function of the CPU 181 and processing an interface signal with a peripheral circuit. Hence, the P-CON 184 takes a variety of commands or the like from the host computer 3 in the bus 185 directly or after processing them and, in conjunction with the CPU 181, outputs data or a control signal, outputted from the CPU 181 and the like to the bus 185, to the drive section 161 directly or after processing them.

The CPU 181 receives a variety of detection signals, a variety of commands, a variety of data and so forth through the P-CON 184 in accordance with the control program stored in the ROM 182, processes a variety of data and the like stored in the RAM 183, and then outputs a variety of signals to the drive section 161 and so forth through the P-CON 184, thus controlling the overall liquid droplet ejection apparatus 1. For example, the CPU 181 controls the function liquid droplet ejection heads 71, the work-moving means 21, and the head-moving means 22 so as to image (or draw) on a work W under predetermined imaging and moving conditions.

A series of imaging process performed by the liquid droplet ejection apparatus 1 will be described. An unprocessed work W lying in the work-carrying in/out area 33 is first introduced on the setting table 41 by the work-carrying in/out device 2. On the almost same occasion, the seven carriage units 23 are moved to the imaging area 31 (a home position) by driving the head-moving means 22. Subsequently, as a preliminary preparation for ejecting function liquid droplets, the position of the work W set on the absorption table 42 is corrected in the X-axis and θ-axis directions by the work-moving means 21 and the work θ-table 43, respectively, and also, the position of each carriage unit 23 is corrected in the Y-axis and the θ-axis directions by the head-moving means 22 and by the head θ-table 76, respectively. Correction of the positions brings about a state in which the plurality of pixel areas 507a formed on the work W is arranged in the X-axis and Y-axis directions so as to form a matrix pattern.

Figure 15A:
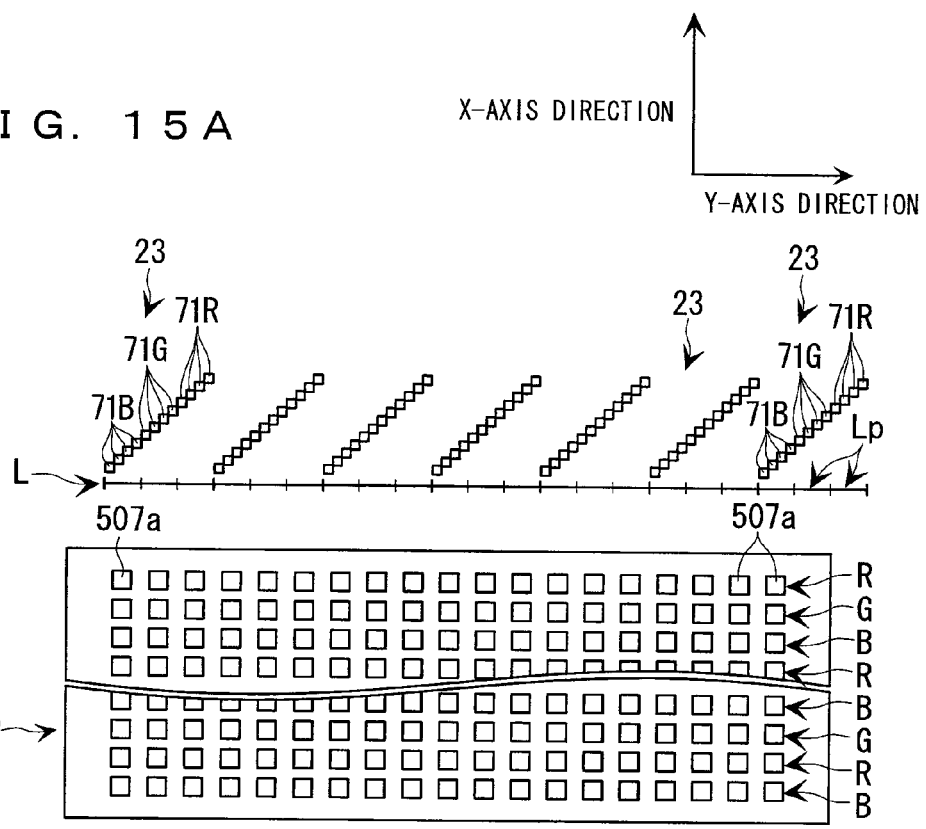
FIGS. 15A and 15B illustrate a first main scanning operation for performing an imaging process with the liquid droplet ejection apparatus.
Figure 15B:
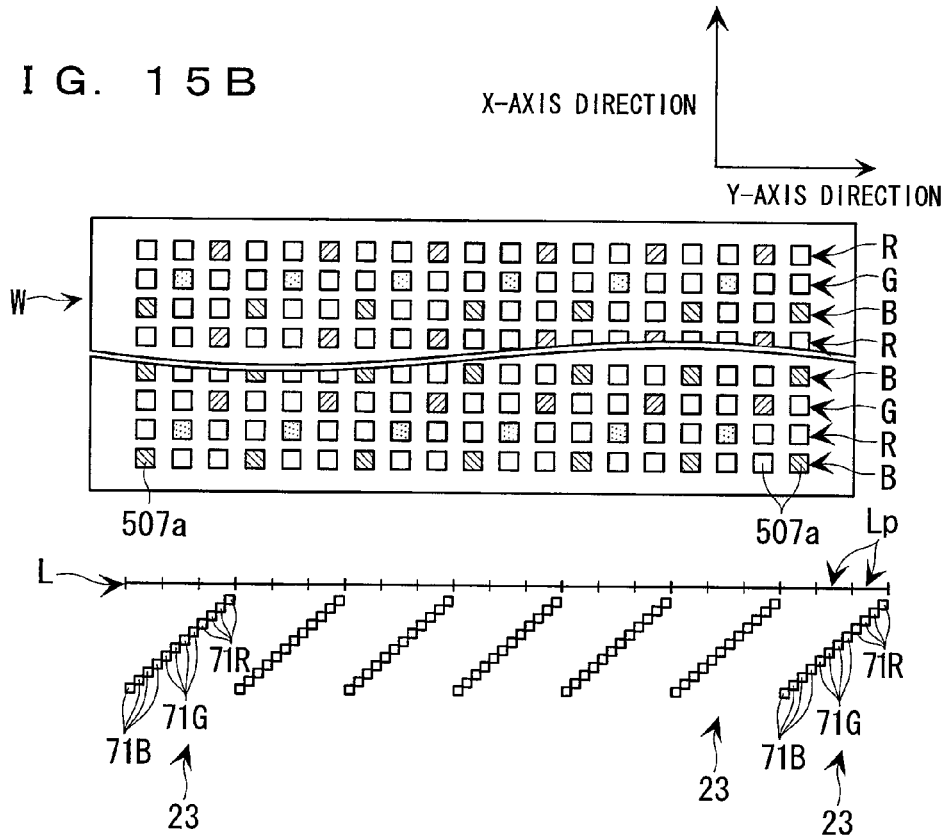

As shown in FIGS. 15A and 15B, since the color arrangement pattern is of stripe arrangement according to this embodiment, pixel rows of respective colors are formed in the Y-axis direction. In other words, adjacent three pixels are arranged so as to serve as three color pixels of R, G, and B colors in the X-axis direction. When the seven carriage units 23 lie at the home position as described above, the right-end B-related function liquid droplet ejection heads 71B of the carriage unit 23 shown at the right end in the figure face the pixel areas 507a shown at the right end in the figure, and the R-related and G-related function liquid droplet ejection heads 71R and 71G lying outside (out on the right side of) the above-described ejection heads 71B in the Y-axis direction lie outside the pixel areas 507a in the Y-axis direction. On this occasion, the left-end B-related function liquid droplet ejection heads 71B of the carriage unit 23 shown at the left end in the figure face the pixel areas 507a at the left end in the figure (see FIG. 15A).

In this state, under control of the controller 27 (the control section 162), the plurality of pixel areas 507a is subjected to a main scanning operation by the liquid droplet ejection apparatus 1 in synchronization with forward-move of the work W in the X-axis direction moved by the work-moving means 21, for achieving simultaneously ejecting and landing of function liquid droplets of three colors R, G, and B on the basis of the stripe alignment color pattern. Meanwhile, while the pixel areas 507a of the three colors of R, G, and B are alternately arranged in the X-axis direction, a plurality of the color-dependent partial imaging lines Lp lies continuously in the Y-axis direction, whereby function liquid droplets of mutually different colors are not ejected in the pixel areas 507a, lying mutually adjacent in the X-axis direction, through a common main scanning operation. In other words, each function liquid droplet ejection head 71 ejects a function liquid droplet only in a single of the three pixel areas 507a lying in the X-axis direction (see FIG. 15B).

Figure 16A:
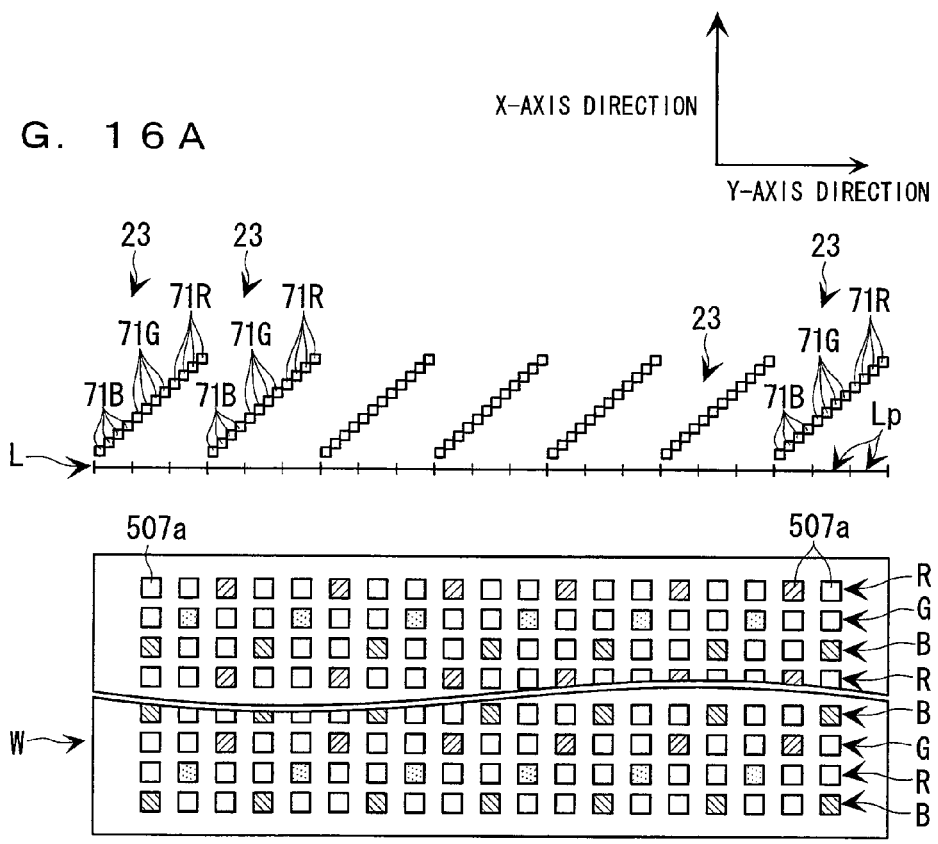
FIGS. 16A and 16B illustrate a second main scanning operation, following the first main scanning operation shown in FIGS. 15A and 15B.
Figure 16B:
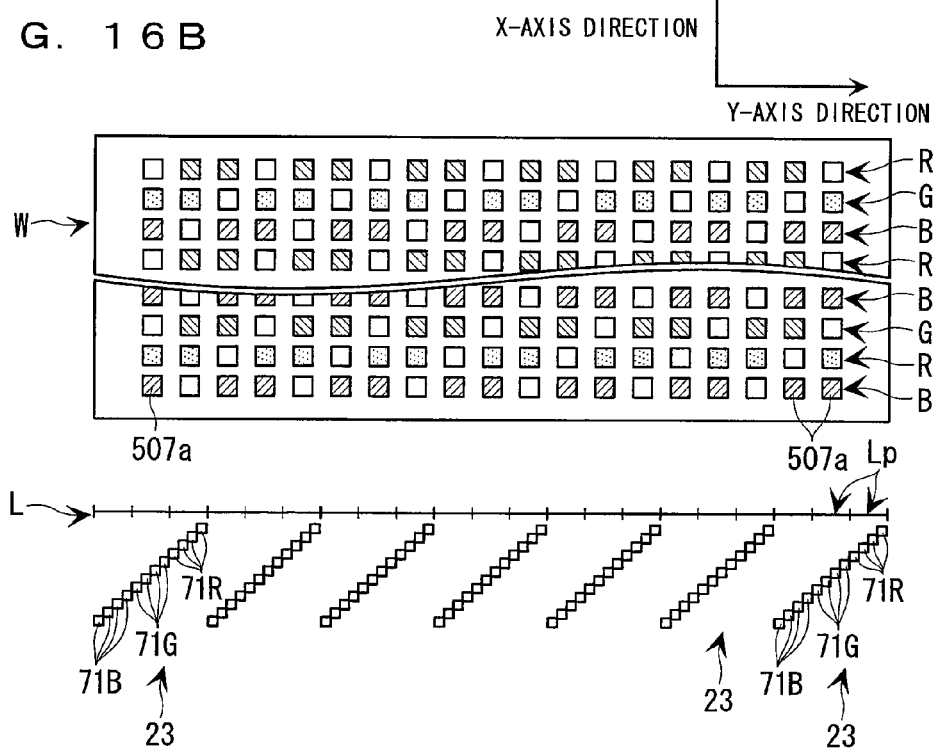

Upon finishing a first main scanning operation (forward move of the work W), the work W is moved backwards by the work-moving means 21, and also, by driving the head-moving means 22, the seven carriage units 23 as a united body are moved in the Y-axis direction (leftwards in the figure) by the length of the partial imaging line Lp (equivalent to four function liquid droplet ejection heads) for performing a sub-scanning. As shown in FIGS. 16A and 16B, through this sub-scanning operation, the G-related function liquid droplet ejection heads 71G face the pixel areas 507a in which B-color function liquid is landed through the first main scanning operation; the B-related function liquid droplet ejection heads 71B face the pixel areas 507a in which R-color function liquid is landed through the same operation; and the R-related function liquid droplet ejection heads 71R face the pixel areas 507 in which G-color function liquid is landed through the same operation. While the G-related function liquid droplet ejection heads 71G lying outside (out on the right side of) the pixel areas 507a in the Y-axis direction through the first main scanning operation face the pixel areas 507a lying at the right end in the figure, the R-related function liquid droplet ejection heads 71R still lie outside the pixel areas 507a in the Y-axis direction. Also, the left end B-related function liquid droplet ejection heads 71B of the carriage unit 23 shown at the left end in the figure facing the pixel areas 507a shown at the left end in the figure during the first main scanning operation lie outside (out on the left side of) the pixel areas 507a in the Y-axis direction, and the G-related function liquid droplet ejection heads 71G adjacent to the B-related heads 71B on the right face the pixel areas 507a shown at the left end in the figure (see FIG. 16A).

In this state, in the same fashion as the first main scanning operation, a second main scanning operation is performed (see FIG. 16B). Although the G-related function liquid droplet ejection heads 71G lying outside the pixel areas 507a (close to the maintenance area 32) in the Y-axis direction during the first main scanning operation eject no function liquid droplets in the pixel areas 507a during this operation, a pre-ejection flushing operation is applied to the pre-ejection flushing box immediately before facing the work W during the first and second main scanning operations, thereby appropriately ejecting function liquid droplets in the pixel areas 507a during the second main scanning operation without a drying problem of the nozzles 95.

During a time period between the first and second main scanning operations, a maintenance process may be performed by the suction unit 131 and the wiping unit 132 by moving only the carriage unit 23 shown at the right end in the figure to the maintenance area 32. With this arrangement, even when the nozzles 95 of, for example, the R-related function liquid droplet ejection heads 71R and the G-related function liquid droplet ejection heads 71G performing no ejection drive during the first main scanning operation are dried to an extent in which their function recovery cannot be fully achieved only by applying a pre-ejection flushing operation thereto immediately before the second main scanning operation, their ejecting functions can be appropriately recovered. During a maintenance process of the function liquid droplet ejection heads 71 of the right-end carriage unit 23, the function liquid droplet ejection heads 71 of the other carriage units 23 lie preferably on standby while the regular flushing box 121 performs a flushing action if needed. Also, even when the function liquid droplet ejection heads 71 performing no ejection drive lie out the right-end carriage unit 23 because of their ejection pattern, a maintenance process may be performed with the suction unit 131 and the wiping unit 132 by moving the carriage unit 23 having the function liquid droplet ejection heads 71 placed thereon (and the other carriage units 23 closer to the maintenance area 32 than the above-described ones) to the maintenance area 32.

Figure 17A:
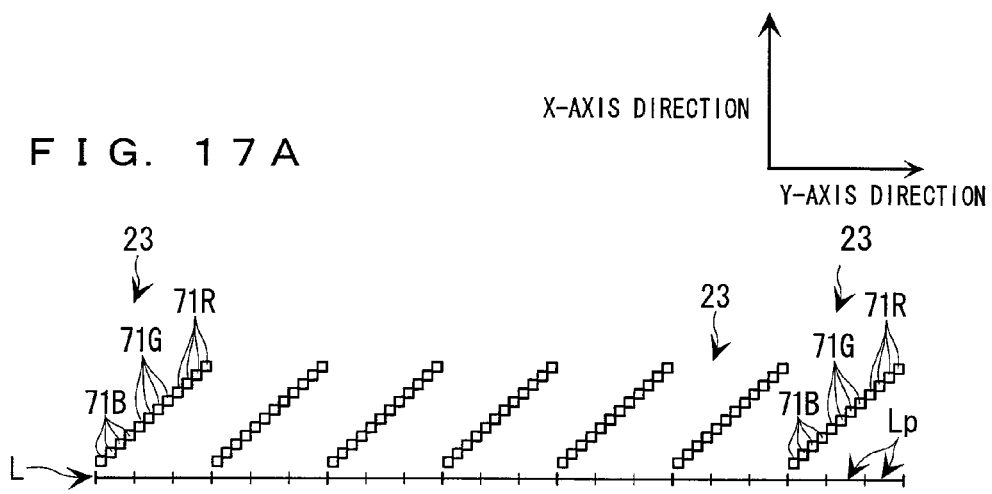
FIGS. 17A and 17B illustrate a third main scanning operation following the second main scanning operation shown in FIGS. 16A and 16B.
Figure 17B:
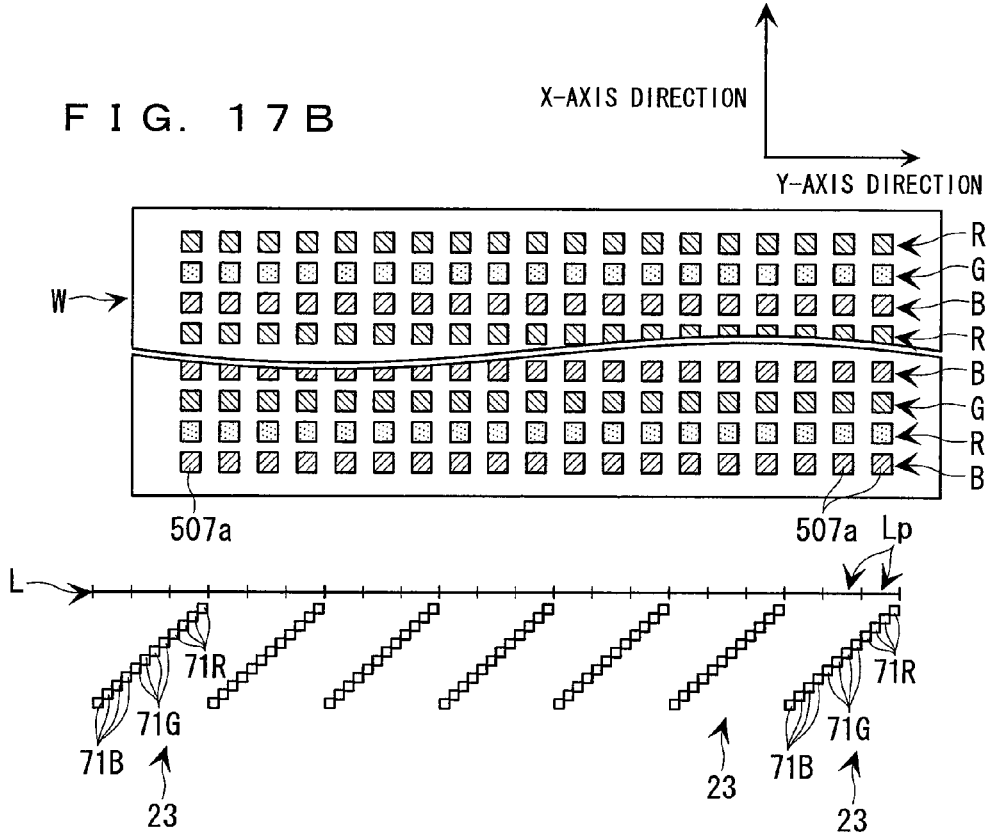

Upon finishing the second main scanning operation, a sub-scanning operation in which the work W is moved backwards in the X-axis direction by the work-moving means 21, and, at the same time, by driving the head-moving means 22, the seven carriage units 23 as a united body are moved in the Y-axis direction (leftwards in the figure) by a length of the partial imaging line Lp (equivalent to the four function liquid droplet ejection heads). As shown in FIGS. 17A and 17B, with this sub-scanning operation, the R-related function liquid droplet ejection heads 71R face the pixel areas 507a in which G-color function liquid is landed through the second main scanning operation; the G-related function liquid droplet ejection heads 71G face the pixel areas 507a in which B-color function liquid is landed through the same operation; and the B-related function liquid droplet ejection heads 71B face the pixel areas 507a in which R-color function liquid is landed through the same operation. The R-related function liquid droplet ejection heads 71R lying outside (out on the right side of) the pixel areas 507a in the Y-axis direction during the second main scanning operation face the pixel areas 507a shown at the right end in the figure. Also, the left end G-related function liquid droplet ejection heads 71G of the carriage unit 23 shown at the left end in the figure, facing the pixel areas 507a shown at the left end in the figure during the second main scanning operation, lie outside (out on the left side of) the pixel areas 507a in the Y-axis direction, and the R-related function liquid droplet ejection heads 71R adjacent to the G-related heads 71G on the right face the pixel areas 507a shown at the right end in the figure (see FIG. 17A).

In this state, in the same fashion as the second main scanning operation a third main scanning operation is performed (see FIG. 17B). Although the R-related function liquid droplet ejection heads 71R lying outside the pixel areas 507a in the Y-axis direction (towards the maintenance area 32) during the second main scanning operation eject no function liquid droplets in the pixel areas 507a during the common period, pre-ejection flushing operations are applied to the pre-ejection flushing box immediately before facing the work W during the first to third main scanning operations, thereby appropriately ejecting function liquid droplets in the pixel areas 507a during the third main scanning operation without a drying problem of the nozzles 95.

Also, in this case, by moving only the carriage unit 23 shown at the right end in the figure to the maintenance area 32, a maintenance process may be performed by the suction unit 131 and the wiping unit 132 between the second and third main scanning operations. In addition, as described above, when a pair of the maintenance areas 32 is provided outside both sides of the imaging area 31, by moving only the carriage unit 23 lying shown at the left end in the figure to the maintenance area 32 lying on the left side in the figure, a maintenance process may be performed.

As described above, ejection and landing of function liquid droplets in all pixel areas 507a formed on the work W are finished without ejecting and landing the function liquid droplets of mutually different colors between the pixel areas 507a lying mutually adjacent in the X-axis direction through a common main scanning operation. Hence, even when, for example, R-color function liquid droplets are landed on a part of the defining-wall section 507b lying between the pixel areas 507a lying mutually adjacent in the X-axis direction through the first main scanning operation and also even when G-color function liquid droplets are landed on the same through the second main scanning operation, the R-color function liquid droplets landed through the first main scanning operation are dried to a certain extent at the time of landing of the G-color function liquid droplets through the second main scanning operation, whereby both kinds of function liquid are prevented from mixing with each other. As a result, function liquid droplets of mutually different colors are reliably prevented from mixing with each other between the pixel areas 507a lying mutually adjacent in the X-axis direction.

Function liquid droplets may be ejected and landed in each pixel area 507a plural times through a common main scanning operation by reciprocating the work W plural times. In this case, each carriage unit 23 is preferably moved slightly in the Y-axis direction every reciprocating moves. With this arrangement, function liquid droplets can be ejected and landed in across the entire area of each pixel area 507a. Although, in FIGS. 15 to 17, a single of the pixel area 507a corresponds to three of the function liquid droplet ejection heads 71 with respect to the Y-axis direction, due to limitation of making the imaging, a plurality of the pixel areas 507a practically corresponds to a single of the function liquid droplet ejection heads 71 as described above.

In this embodiment, as described above, since the color arrangement pattern composed of the pixels is of a stripe arrangement and a row of each pixels of each color is formed in the Y-axis direction, function liquid droplets of mutually different colors are not landed in each of the pixel areas 507a lying mutually adjacent in the Y-axis direction. In the case where the color arrangement pattern composed of the pixels is of a mosaic arrangement or a delta arrangement, since pixels of different colors area are arranged in the Y-axis direction, when function liquid droplets are landed in two of the pixel areas 507a lying mutually adjacent in the Y-axis direction and corresponding to the function liquid droplet ejection heads 71 of different colors lying mutually adjacent in the Y-axis direction through a common main scanning operation, there is a risk that two kinds of function liquid droplets of different colors are respectively landed on a part of the defining-wall section 507b lying between the adjacent pixel areas and are mixed with each other on the above-described part. In such a case, function liquid droplets of different colors are preferably ejected in the two pixel areas 507a through mutually different main scanning operations. Such an operation is especially effective when a large amount of function liquid droplets are ejected in the pixel areas 507.

Figure 18A:
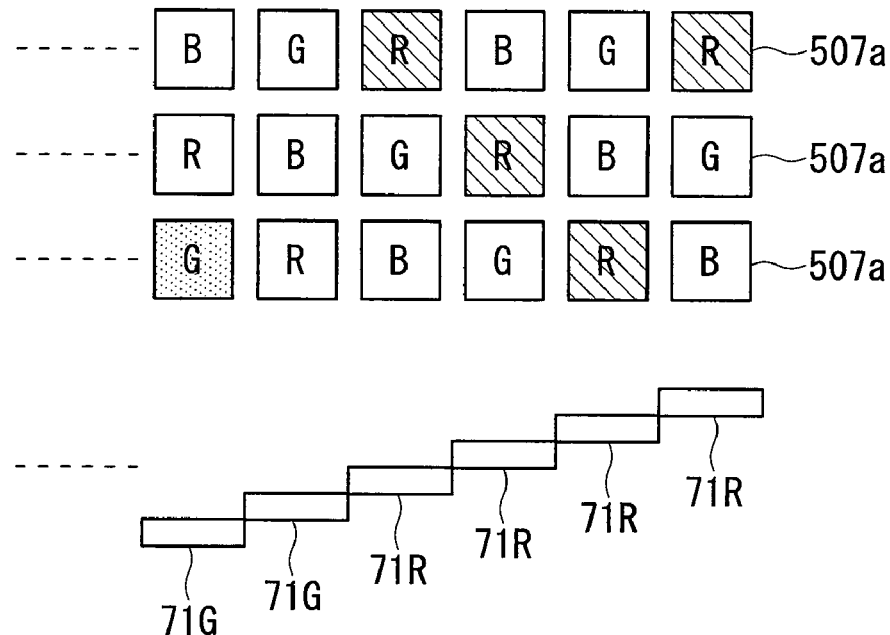
FIGS. 18A and 18B illustrate an imaging process performed by the liquid droplet ejection apparatus when a color arrangement pattern of the color filer, composed of three colors R, G, and B is of a mosaic arrangement.
Figure 18B:
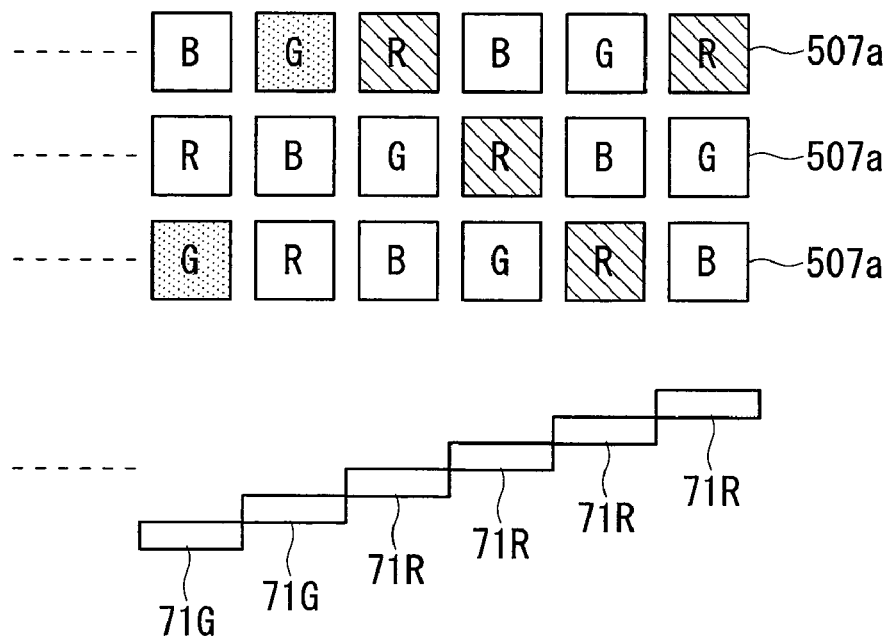

As shown in FIGS. 18A and 18B, when the color arrangement pattern of the pixels is of a mosaic arrangement, for example, with respect to two of the pixel areas 507a lying mutually adjacent in the Y-axis direction respectively corresponding to the R-related and G-related function liquid droplet ejection heads 71R and 71G mutually adjacent in the Y-axis direction, through the first main scanning operation, the G-related function liquid droplet ejection heads 71G (a part of the nozzles 95 of the ejection heads 71G) is not driven, and the R-related function liquid droplet ejection heads 71R are driven for ejecting R-color function liquid droplets (see FIG. 18A). Through the second main scanning operation, the R-related function liquid droplet ejection heads 71R are not driven, and the G-related function liquid droplet ejection heads 71B are driven for ejecting G-color function liquid droplets (see FIG. 18B). With this arrangement, through a common main scanning operation, function liquid droplets of mutually different colors are not landed between the pixel areas 507a lying mutually adjacent in the Y-axis direction. As a result, function liquid droplets of mutually different colors are reliably prevented from mixing with each other between the pixel areas 507a lying mutually adjacent not only in the X-axis direction but also in the Y-axis direction.

Although, in FIGS. 18A and 18B, due to limitation of making the imaging, a single of the pixel area 507a corresponds to a single of the function liquid droplet ejection heads 71 in the Y-axis direction, as described above, a single of the function liquid droplet ejection heads 71 practically corresponds to a plurality of the pixel areas 507a.

Figure 19:
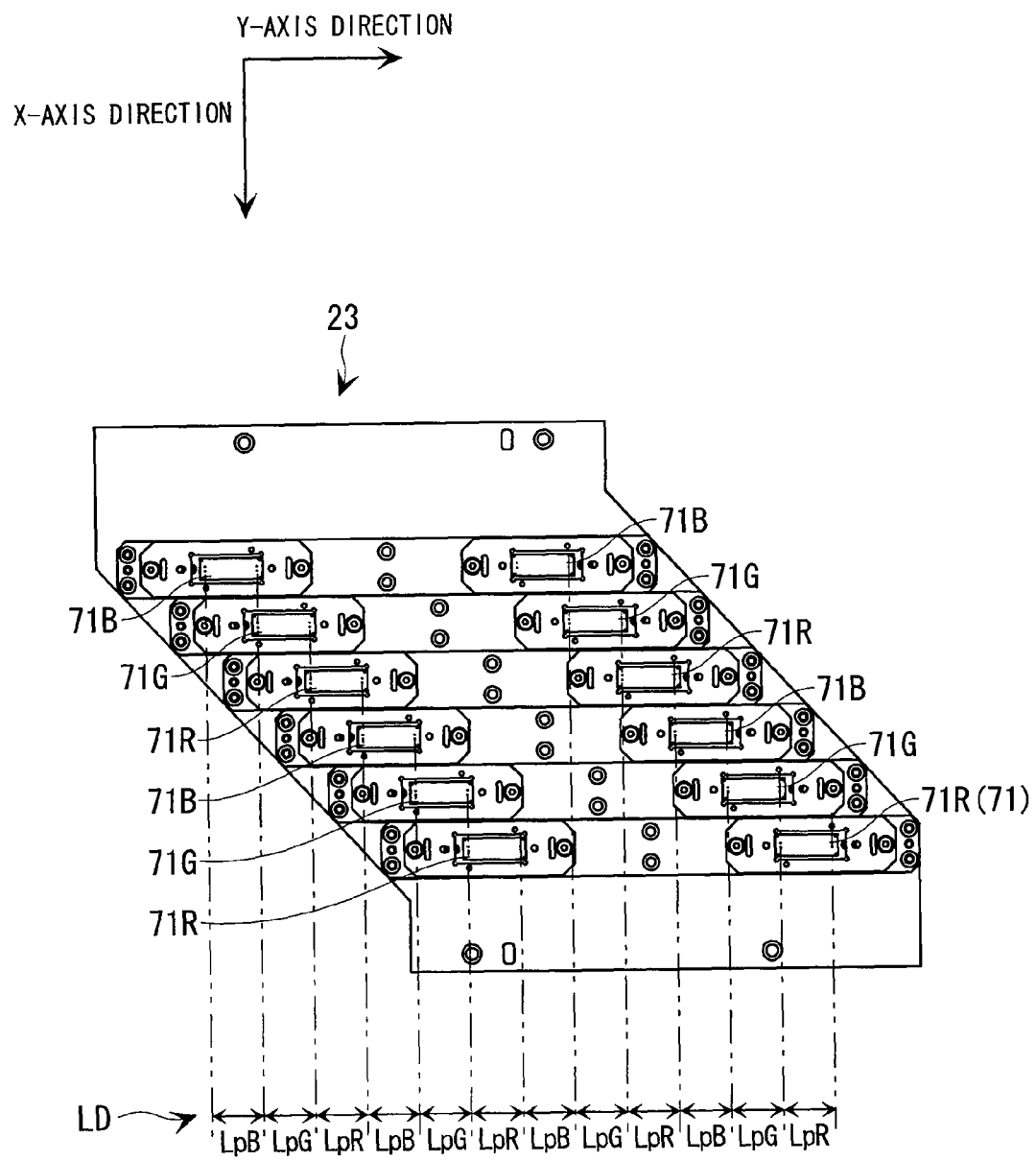
FIG. 19 is a bottom view of a carriage unit of a liquid droplet ejection apparatus according to a second embodiment.
Figure 20:
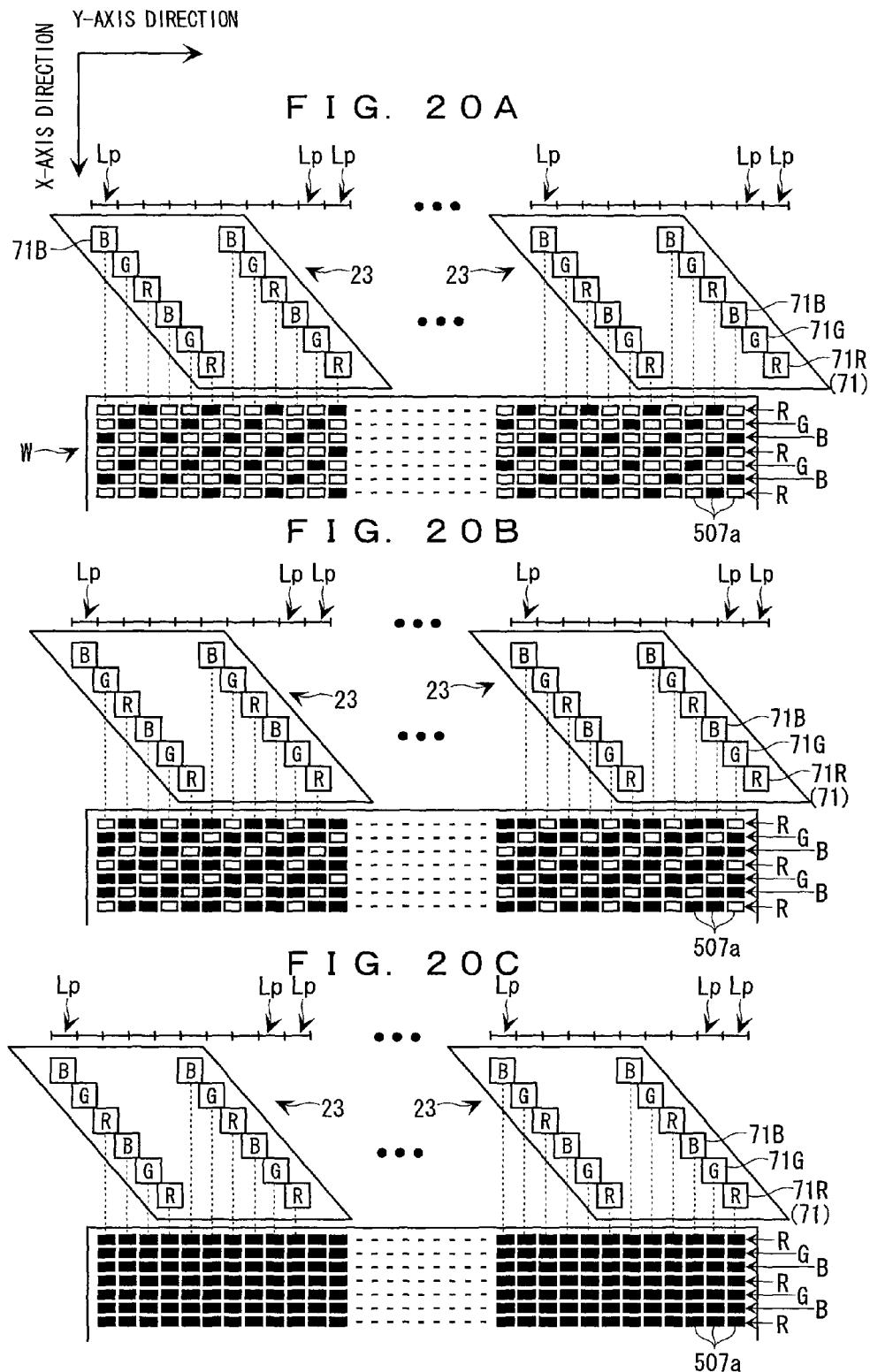
FIGS. 20A through 20C illustrate an imaging process performed by the liquid droplet ejection apparatus according to the second embodiment.

Referring now to FIGS. 19 and 20, a liquid droplet ejection apparatus according to the second embodiment will be described. Although a liquid droplet ejection apparatus 1 according to the second embodiment has substantially the same structure as that of the liquid droplet ejection apparatus 1 according to the first embodiment. There is a difference between them. That is, in the first embodiment, the twelve function liquid droplet ejection heads 71 of each carriage units 23 are arranged in a single stepwise row, and, in a unit of four pieces, serve as the R-related function liquid droplet ejection heads 71R, the G-related function liquid droplet ejection heads 71G, and the B-related function liquid droplet ejection heads 71B having respective three kinds of function liquid of three colors introduced therein (see FIGS. 9 and 10). Whereas, in the second embodiment, the twelve function liquid droplet ejection heads 71 are divided into two sets six heads each in the Y-axis direction, and, at the same time, the six function liquid droplet ejection heads 71 of each set are arranged in a stepwise pattern so as to serve as the R-related function liquid droplet ejection head 71R, the G-related function liquid droplet ejection head 71G, and the B-related function liquid droplet ejection head 71B having the respective three kinds of function liquid of three colors introduced therein, in a unit of a single piece in order from the right side in FIG. 19.

In other words, according to the second embodiment, the twelve function liquid droplet ejection heads 71 of each carriage units 23 are arranged such that a plurality of the nozzles 95 of the four function liquid droplet ejection heads 71 of respective colors forms the four partial imaging lines Lp of respective colors, and the partial imaging lines LpR, LpG, and LpB of three colors are repeatedly connected one another in the Y-axis direction four times, in order from the right side in the figure in that order, so as to form a single of the divided imaging lines LD. With this arrangement, each partial imaging line Lp is shorter than that in the first embodiment.

Referring now to FIGS. 20A through 20C, a series of imaging process of the liquid droplet ejection apparatus 1 according to the second embodiment will be described. In the same fashion as described above, a work is first set on the absorption table 42, and the positions of the work and each of the carriage units 23 are corrected.

On this occasion, the right-end B-related function liquid droplet ejection heads 71B of the carriage unit 23 shown at the right end in the figure face the pixel areas 507a at the right end in the figure, and the R-related function liquid droplet ejection heads 71R and the G-related function liquid droplet ejection heads 71G lie outside (on the right of) the above-described pixel areas 507a in the Y-axis direction. Also, the left end B-related function liquid droplet ejection heads 71B of the carriage unit 23 shown at the left end in the figure face the pixel areas 507a at the left end in the figure. In this state, a first main scanning operation is performed, and function liquid droplets are ejected in only a single of the pixel area 507a of the three pixel areas 507a arranged in the X-axis direction by each function liquid droplet ejection head 71 (see FIG. 20A).

Upon finish of the first main scanning operation, a sub-scanning operation in which the seven carriage units 23 as a united body are moved in the Y-axis direction (leftwards in the figure) by a length of a partial imaging line Lp (equivalent to a single function liquid droplet ejection head) such that the G-related function liquid droplet ejection heads 71G face the pixel areas 507a having B-function liquid landed therein through the first main scanning operation; the B-related function liquid droplet ejection heads 71B face the pixel areas 507a having R-function liquid landed therein through the same operation; and the R-related function liquid droplet ejection heads 71R face the pixels 507a having G-function liquid landed therein through the same operation. In other words, with the liquid droplet ejection apparatus 1 according to the second embodiment, since each partial imaging line Lp is shorter length than in the first embodiment, each function liquid droplet ejection head 71 (the carriage unit 23) moves shorter through the sub-scanning operation, thereby leading to a shorter time of the sub-scanning operation.

Upon a pre-ejection flushing operation in the same fashion as in the first embodiment, a second main scanning operation is performed such that G-function liquid is landed in the pixel areas 507a adjacent to the pixel areas 507a having B-function liquid landed therein through the first main scanning operation; B-function liquid is landed in the pixel areas 507a adjacent to the pixel areas 507a having R-function liquid landed therein through the same operation; and R-function liquid is landed in the pixel areas 507a adjacent to the pixel areas 507a having G-function liquid landed therein through the same operation (see FIG. 20B).

Upon finish of the second main scanning operation, a sub-scanning operation in which the seven carriage units 23 as a united body are moved in the Y-axis direction (leftwards in the figure) by a length of a partial imaging line Lp (equivalent to a single function liquid droplet ejection head) such that the G-related function liquid droplet ejection heads 71G face the pixel areas 507a having B-function liquid landed therein through the second main scanning operation; the B-related function liquid droplet ejection heads 71B face the pixel areas 507a having R-function liquid landed therein through the same operation; and the R-related function liquid droplet ejection heads 71R face the pixels 507a having G-function liquid landed therein through the same operation. Likewise, since each partial imaging line Lp is shorter than in the first embodiment, each function liquid droplet ejection head 71 (the carriage unit 23) moves shorter in the sub-scanning operation, thereby leading to a shorter time of the sub-scanning operation.

Upon a pre-ejection flushing operation in the same fashion as described above, a third main scanning operation is performed such that G-function liquid is landed in the pixel areas 507a adjacent to the pixel areas 507a having B-function liquid landed therein through the second main scanning operation; B-function liquid is landed in the pixel areas 507a adjacent to the pixel areas 507a having R-function liquid landed therein through the same operation; and R-function liquid is landed in the pixel areas 507a adjacent to the pixel areas 507a having G-function liquid landed therein through the same operation (see FIG. 20C).

As described above, the imaging process according to the second embodiment is performed in the same fashion as in the first embodiment, excluding a difference in moving distances of the function liquid droplet ejection heads, and ejection and landing of function liquid droplets in all pixel areas 507a formed on the work W are finished without ejecting and landing function liquid droplets of mutually different colors between the pixel areas 507a lying mutually adjacent in the X-axis direction through a common main scanning operation. Accordingly, function liquid droplets of different colors are reliably prevented from mixing with each other between the pixel areas 507a lying mutually adjacent in the X-axis direction.

Also, according to the second embodiment, since each partial imaging line Lp is shorter than in the first embodiment, the head-ejection covering-range Rh (equivalent to the length of an extended one of the imaging line L extended by two times (times of the number of sub-scanning operations) the partial imaging line Lp in the Y-axis direction) has a shorter length. Accordingly, the pre-ejection flushing box has a shorter length in the Y-axis direction, thereby leading to a reduced space of the liquid droplet ejection apparatus.

Further, also, according to the second embodiment, between the first and second main scanning operations and between the second and third main scanning operations, a maintenance process may be performed by moving only the carriage unit 23 shown at the right end in the figure to the maintenance area 32. While a wiping operation is performed in a direction in agreement with that of the nozzle rows 94 (extending in the Y-axis direction) also in the second embodiment, since function liquid of a common color is introduced in the function liquid droplet ejection heads 71, arranged at the same position in the X-axis direction, of the carriage unit 23, (see FIGS. 19 and 20), mutually different kinds of function liquid are not wiped by a common part of the wiping sheet 151, thereby preventing different kinds of function liquid from mixing with each other on the nozzle surface. 93.

As descried above, with the liquid droplet ejection apparatus 1 according to this embodiment, when function liquid droplets of three colors R, G, and B are simultaneously ejected and landed on a work W, even when function liquid droplets are not exactly landed in each pixel area 507a, function liquid droplets of different colors are prevented from mixing with each other.

The structures of a color filter, a liquid-crystal display device, an organic EL device, a (PDP) device, an electron-emission device such as an FED or SED device, an active matrix substrate incorporated in these display devices, and the like as examples electrooptical devices (flat panel displays) manufactured by using the liquid droplet ejection apparatus 1 according to this embodiment, and methods for manufacturing these components will be described. The active matrix substrate has thin film transistors, and source and data wires electrically connected to the thin film transistors, formed therein.

Figure 21:
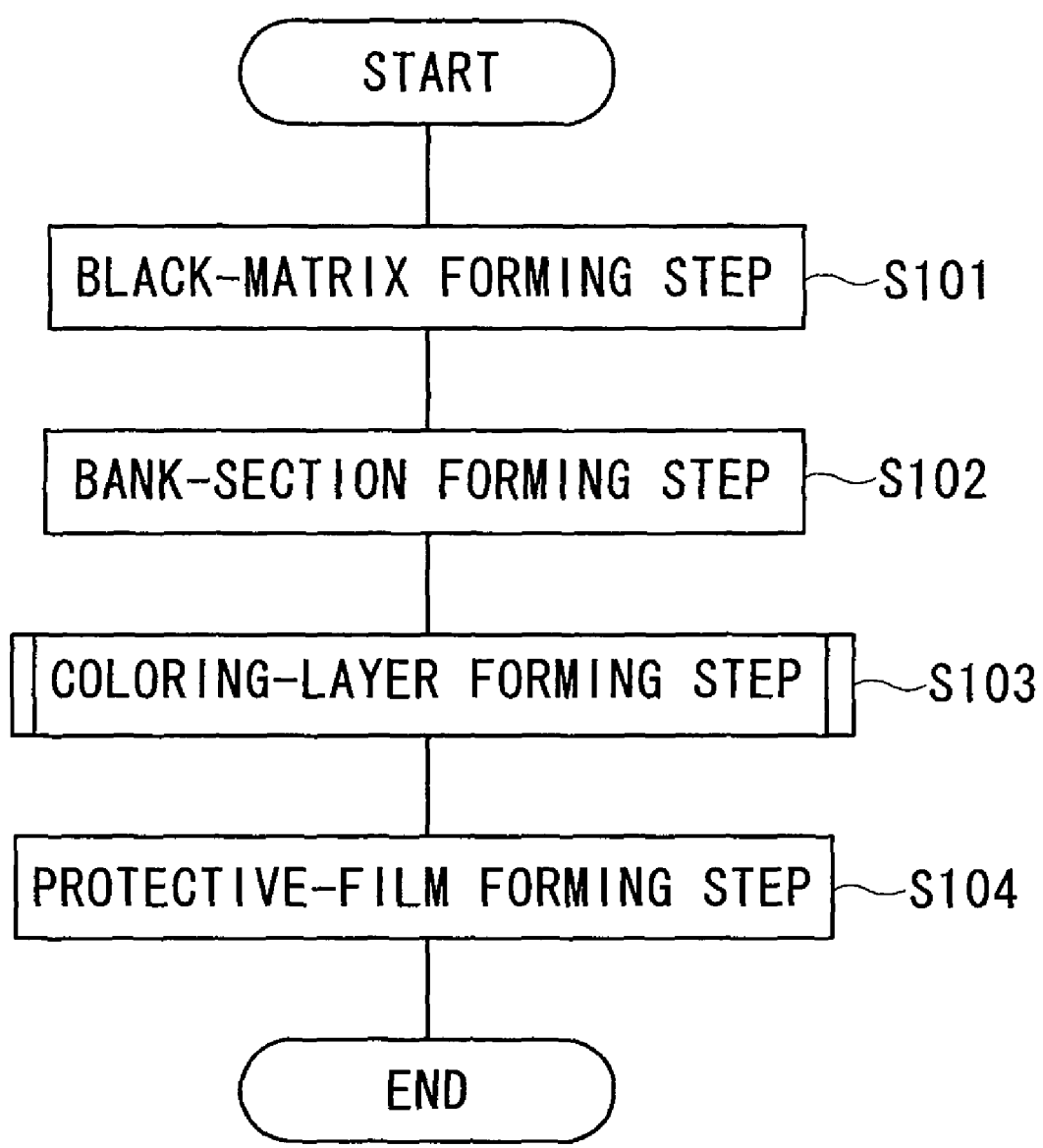
FIG. 21 is a flow chart illustrating a process of manufacturing a color filter.

A method of manufacturing a color filter incorporated into a liquid-crystal display device, an organic EL device, and the like will be described. FIG. 21 illustrates a flowchart of a manufacturing process of the color filter, and FIGS. 22A through 22E are schematic sectional views of a color filter 500 (a filter substrate 500A) according to this embodiment, illustrating the process in order of its manufacturing steps.

Figure 22A:
FIGS. 22A through 22E are schematic sectional views of the color filter, illustrating it in the order of its manufacturing steps.

In a black-matrix forming step S101, a black-matrix 502 is formed on a substrate (W) 501 as shown in FIG. 22A. The black-matrix 502 is composed of chromium metal, a laminate of chromium metal and chromic oxide, resin black, or the like. The black-matrix 502 composed of a thin metal film is formed by spattering, chemical vapor deposition, or the like. Also, the black-matrix 502 composed of a resin thin film is formed by gravure printing, photo resist, thermal transfer, or the like.

Figure 22B:
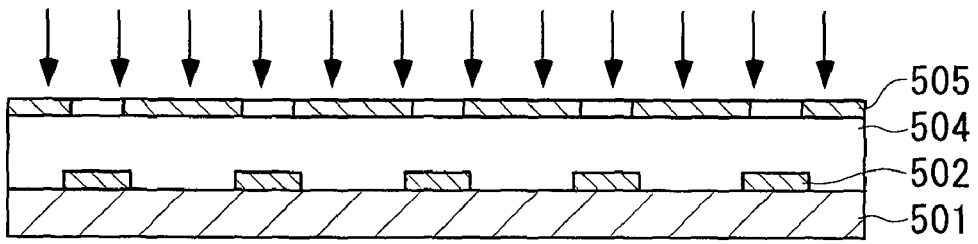

Subsequently, in a bank-section forming step S102, a bank-section 503 is formed so as to overlie on the black-matrix 502. In other words, as shown in FIG. 22B, a resist layer 504 composed of negative-type transparent photosensitive resin is formed so as to cover the substrate 501 and the black-matrix 502. Then, the uncompleted color filter is exposed in a state in which its upper surface is covered by a mask film 505 formed in a matrix pattern.

Figure 22C:
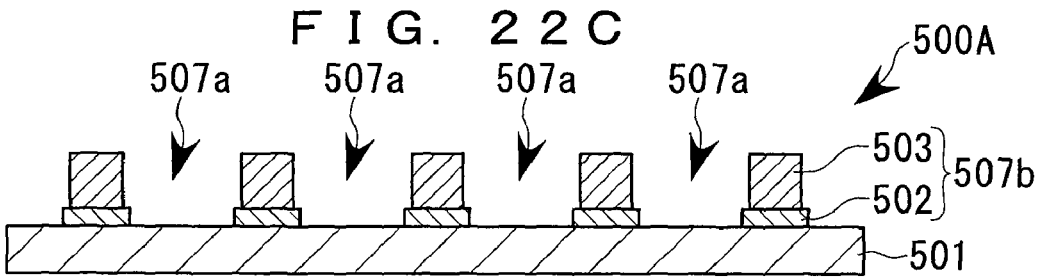

Further, as shown in FIG. 22C, the resist layer 504 is patterned by etching an unexposed part of the resist layer 504, leading to forming the bank-section 503. When the black-matrix is composed of resin black, the black-matrix serves also as the bank-section 503.

The bank-section 503 and the black-matrix 502 lying below the bank-section 503 serve as a defining-wall section 507b defining the respective pixel areas 507a so as to define landing areas of function liquid droplets when coloring layers (a deposited-film section) 508R, 508G, and 508B are formed by the function liquid droplet ejection heads 71 in a coloring-layer forming step which is performed later.

The filter substrate 500A is obtained through the above-described black-matrix and bank-section forming steps.

In this embodiment, the bank section 503 is composed of a resin material whose coated surface is lyophobic (hydrophobic). Also, the surface of the substrate (glass substrate) 501 is lyophilic (hydrophilic), whereby a variance in landing positions of droplets in each of pixel areas 507a encircled by the bank-section 503 (the defining wall 507b) is automatically corrected in a coloring-layer forming step, which will be described later.

Figure 22D:
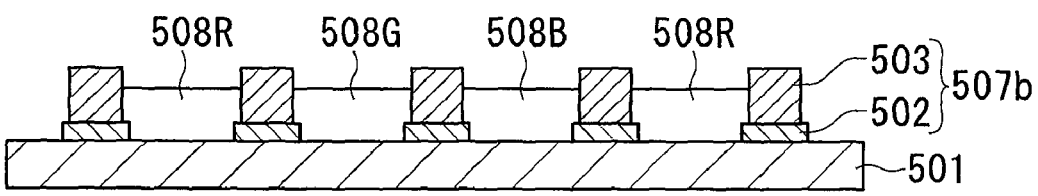

Then, as shown in FIG. 22D, in the coloring-layer forming step S103, function liquid droplets are ejected by the function liquid droplet ejection heads 71 so as to be landed in respective pixel areas 507a encircled by the defining wall 507. In this case, with the function liquid droplet ejection heads 71, function liquid (filter material) of three colors (R, G, and B) is introduced and the corresponding function liquid droplets are ejected. The color arrangement pattern composed of three colors R, G, and B can be of a stripe arrangement, a mosaic arrangement, a delta arrangement, or the like.

Figure 22E:
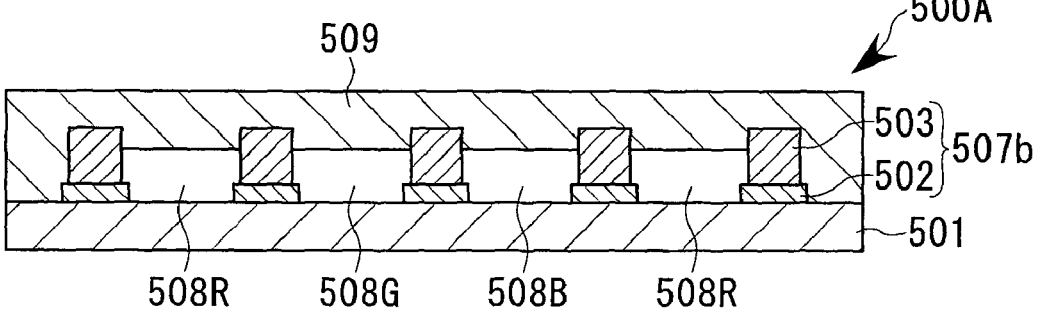

Subsequently, by fixing the function liquid by drying (for example, by heating), the coloring layers 508R, 508G, and 508B of the three colors are formed. When the coloring layers 508R, 508G, and 508B are formed, the process moves to a protective-film forming step S104. As shown in FIG. 22E, a protective film 509 is formed so as to cover the upper surfaces of the substrate 501, the defining wall 507b, and the coloring layers 508R, 508G, and 508B.

In other words, after coating liquid for the protective film is ejected across the entire surface of the substrate 501 having the coloring layers 508R, 508G, and 508B formed therein, the liquid is dried and the protective film 509 is formed.

Then, after the protective film 509 is formed, the color filter 500 is moved to the following film-depositing step in which a film composed of ITO (indium tin oxide) or the like and serving as transparent electrodes is deposited.

Figure 23:
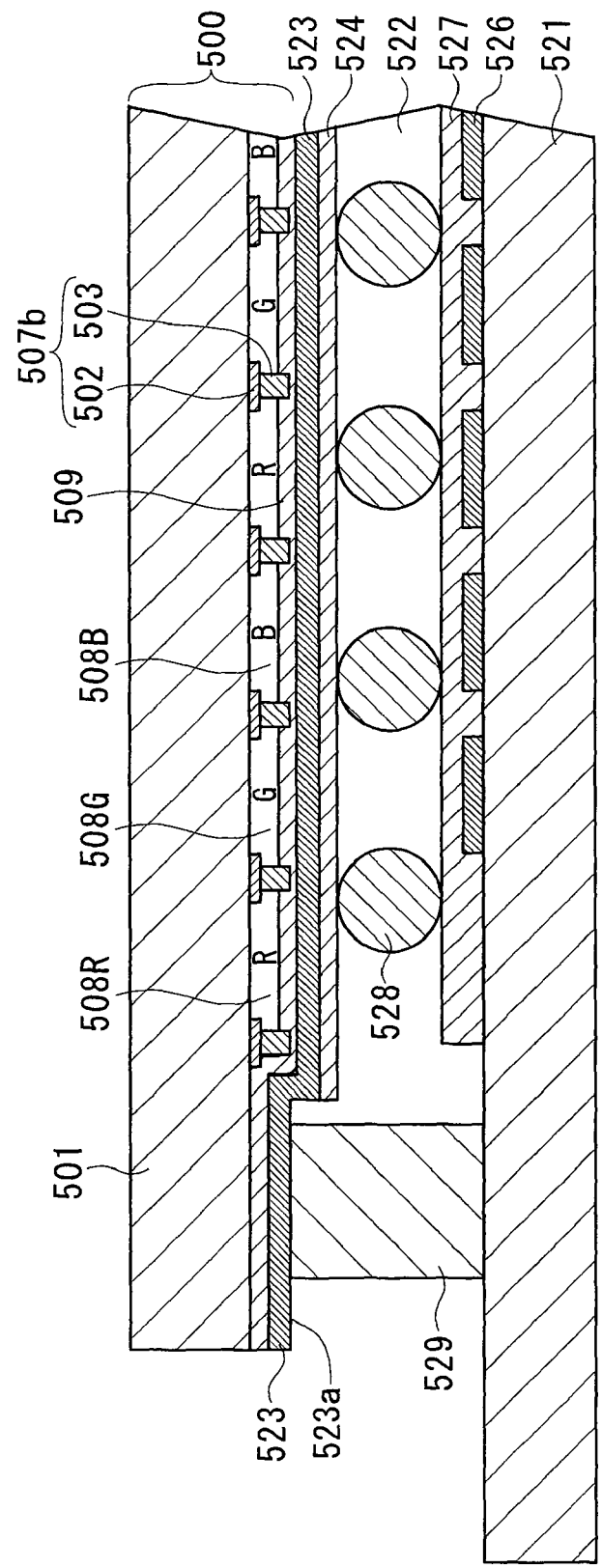
FIG. 23 is a sectional view of an essential part of a first example of liquid crystal device including the color filter according to this invention, illustrating the general structure of the first example liquid crystal device.

FIG. 23 is a sectional view of an essential part of a passive-matrix liquid crystal device (liquid crystal device) 520 as a first example liquid-crystal display device having the foregoing color filter 500 incorporated therein, illustrating the general structure of the same. When accessory components such as a liquid-crystal driving IC, a backlight, a support member are placed on the liquid crystal device 520, a transmissive liquid-crystal display device serving as a final product is achieved. Since the color filter 500 is identical to those shown in FIGS. 22A through 22E, the corresponding parts are denoted by the same reference numbers, and the descriptions thereof will be omitted.

The liquid crystal device 520 is generally made up by the color filter 500, a counter substrate 521 composed of a glass substrate or the like, and a liquid crystal layer 522 sandwiched by the above two components and composed of super twisted nematic (STN) liquid crystal composition, and the color filter 500 lies in the upper part of the figure (close to an observer).

Although not illustrated in the figure, polarizers are disposed on the respective outer surfaces (the respective surfaces opposite to the liquid crystal layer 522) of the counter substrate 521 and the color filter 500, and also, a backlight is disposed outside one of the polarizers lying close to the counter substrate 521.

On the protective film 509 of the color filter 500 (close to the liquid crystal layer), a plurality of strip-shaped first electrodes 523 extending long in the horizontal direction in FIG. 23 is formed at a predetermined interval, and a first alignment film 524 is formed so as to cover the surfaces of the first electrodes 523 opposite to the color filter 500.

At the same time, on the surface of the counter substrate 521 opposing the color filter 500, a plurality of strip-shaped second electrodes 526, each extending long in a direction perpendicular to the first electrodes 523 of the color filter 500 is formed at a predetermined interval, and a second alignment film 527 is formed so as to cover the surfaces of the second electrodes 526 close to the liquid crystal layer 522. The first and second electrodes 523 and 526 are composed of a transparent conductive material such as ITO.

Spacers 528 disposed in the liquid crystal layer 522 maintain the thickness (the cell gap) of the liquid crystal layer 522 constant. A sealant 529 prevents liquid crystal composition in the liquid crystal layer 522 from leaking outside. One end of each of the first electrodes 523 extends outside the sealant 529 so as to serve as a routing wire 523a.

Thus, intersections made by the first and second electrodes 523 and 526 serve as pixels, and the coloring layers 508R, 508G, and 508B of the color filter 500 are arranged so as to lie at the intersections serving as the corresponding pixels.

In the general manufacturing process, the first electrodes 523 are patterned and the first alignment film 524 is coated on the color filter 500 so as to prepare a section including the color filter 500. In addition to this, the second electrodes 526 are patterned and the second alignment film 527 is coated on the counter substrate 521 so as to prepare a section including the counter substrate 521. Then, the spacers 528 and the sealant 529 are formed in a section including the counter substrate 521, and the above-described two sections are bonded to each other in this state. After liquid crystal constituting the liquid crystal layer 522 is filled in the liquid crystal layer 522 through an inlet of the sealant 529, the inlet is closed. Subsequently, both polarizers and the backlight are deposited.

With the liquid droplet ejection apparatus 1 according to this embodiment, for example, a spacer material (function liquid) making up the foregoing cell gap is applied, and, before bonding the section including the color filter 500 to the section including the counter substrate 521, liquid crystal (function liquid) can be also uniformly applied in the area enclosed by the sealant 529. Also, the foregoing sealant 529 can be printed with the function liquid droplet ejection heads 71. In addition, both first and second alignment films 524 and 527 can be also coated with the function liquid droplet ejection heads 71.

Figure 24:
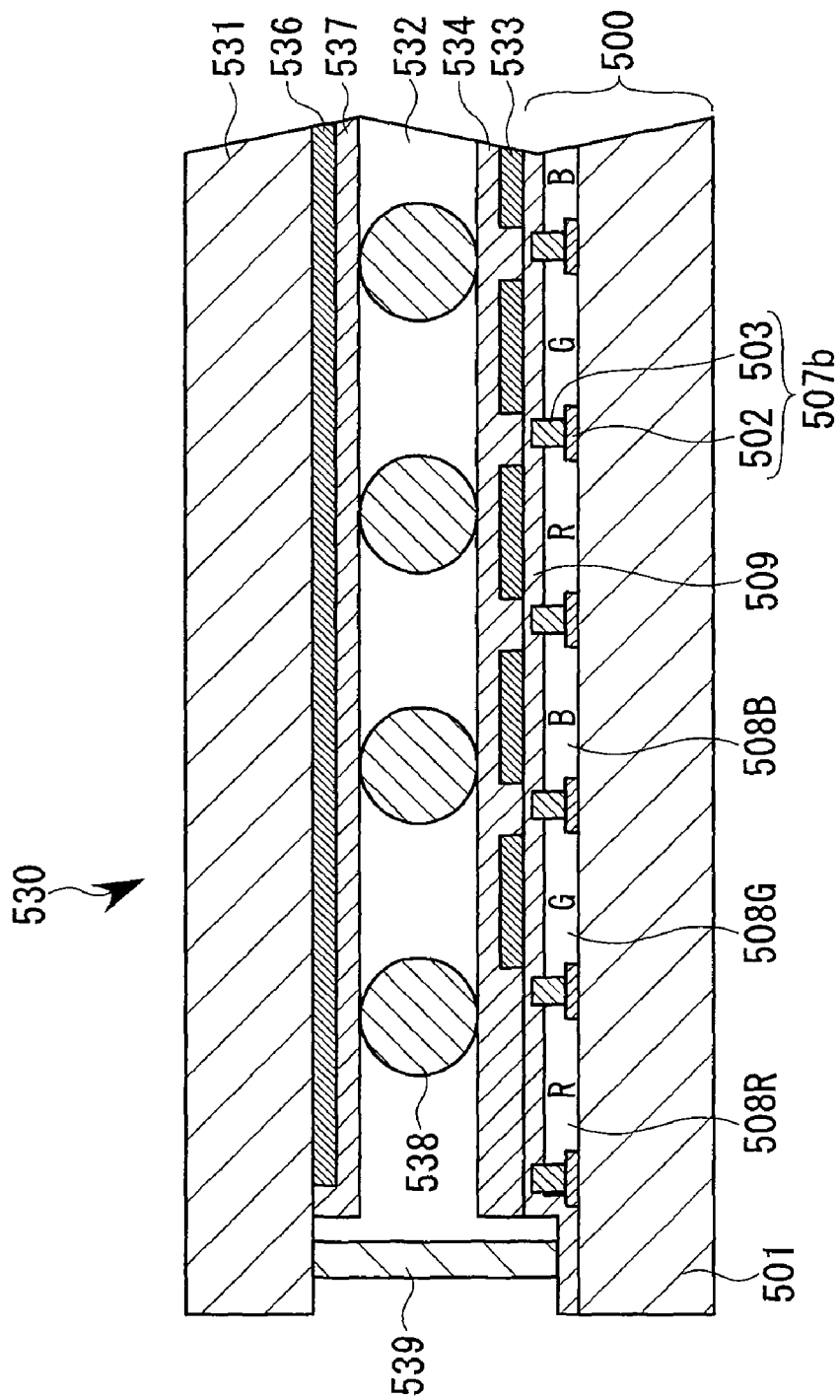
FIG. 24 is a sectional view of the general structure of an essential part of a second example of liquid crystal device including the color filter according to this invention.

FIG. 24 is a sectional view of the general structure of an essential part of a second example liquid crystal device 530 including the color filter 500 according to this embodiment.

The liquid crystal device 530 is greatly different from the liquid crystal device 520 in that the color filter 500 is disposed in the lower part of the figure (opposite to an observer).

The liquid crystal device 530 has a general structure in which a liquid crystal layer 532 composed of STN liquid crystal is sandwiched between the color filter 500 and a counter substrate 531 composed of a glass substrate or the like. Although not illustrated in the figure, polarizers and so forth are disposed on the outer surfaces of the counter substrate 531 and the color filter 500.

On the protective film 509 of the color filter 500 (close to the liquid crystal layer 532), a plurality of strip-shaped first electrodes 533 extending long in a direction perpendicular to the plane of the figure is formed at a predetermined interval, and a first alignment film 534 is formed so as to cover the surfaces of the first electrodes 533 close to the liquid crystal layer 532.

On the surface of the counter substrate 531 opposing the color filter 500, a plurality of strip-shaped second electrodes 536 extending perpendicular to the first electrodes 533 close to the color filter 500 is formed at a predetermined interval, and a second alignment film 537 is formed so as to cover the surfaces of the second electrodes 536 close to the liquid crystal layer 532.

In the liquid crystal layer 532, spacers 538 maintaining the thickness of the liquid crystal layer 532 constant and a sealant 539 preventing a liquid crystal composition in the liquid crystal layer 532 from leaking outside are disposed.

In the same fashion as the liquid crystal device 520, intersections made by the first electrodes 533 and the second electrodes 536 serve as pixels, and the coloring layers 508R, 508G, and 508B of the color filter 500 are arranged so as to lie at the intersections serving as the corresponding pixels.

Figure 25:
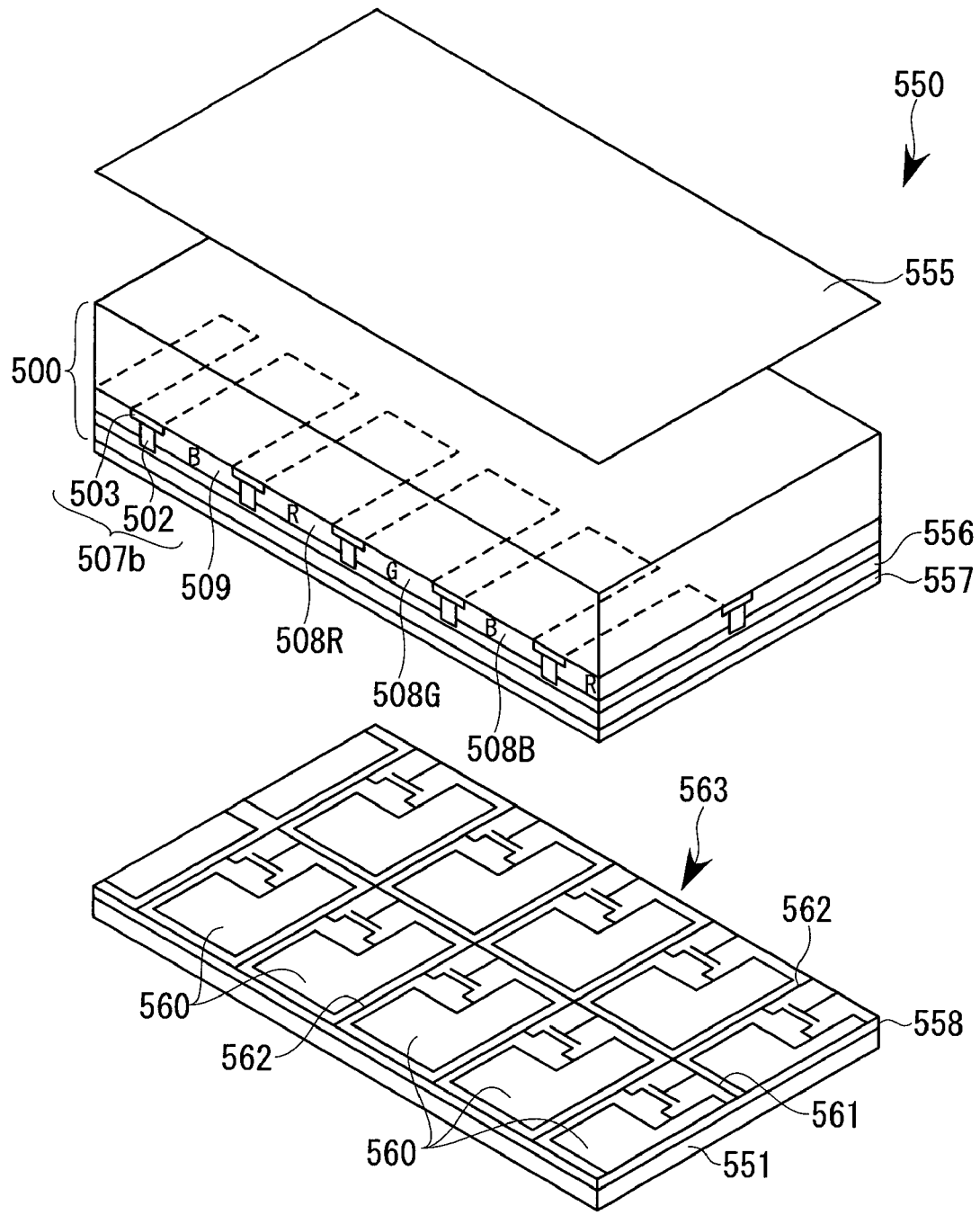
FIG. 25 is a sectional view of the general structure of an essential part of a third example of liquid crystal device including the color filter according to this invention.

FIG. 25 is an exploded perspective view of the general structure of a transmissive TFT (thin film transistor) liquid crystal device 550 as a third example liquid crystal device including the color filter 500 according to this invention.

The liquid crystal device 550 has a structure in which the color filter 500 lies in the upper part of the figure (close to an observer).

The liquid crystal device 550 generally includes the color filter 500; a counter substrate 551 disposed so as to oppose the color filter 500; a liquid crystal layer (not illustrated) sandwiched between above two components; a polarizer 555 disposed on the upper surface of the color filter 500 (close to an observer); and a polarizer (not illustrated) disposed on the lower surface of the counter substrate 551.

On the surface of the protective film 509 (close to the counter substrate 551) of the color filter 500, liquid-crystal driving electrodes 556 are formed. The electrodes 556 are composed of a transparent conductive material such as ITO, and serves as a full surface electrode covering the entire area where pixel electrodes 560, which will be described later, are formed. Also, an alignment film 557 is disposed so as to cover the surfaces of the electrodes 556 opposite to the pixel electrodes 560.

The counter substrate 551 has an insulating layer 558 on the surface thereof opposing the color filter 500. The insulating layer 558 has scanning lines 561 and signal lines 562 formed thereon so as to lie perpendicular to each other. The pixel electrodes 560 are formed in areas encircled by the scanning lines 561 and the signal lines 562. Although an alignment film is formed on the pixel electrodes 560 in an actual liquid crystal device, it is omitted in the figure.

Also, a thin film transistor 563 including a source electrode, a drain electrode, a semiconductor, and a gate electrode is formed in a section encircled by a cut of the pixel electrode 560, each of the scanning lines 561, and each of the signal lines 562. By applying signals on the scanning lines 561 and the signal lines 562, the thin film transistor 563 is turned on or off so as to perform current-exciting control of the pixel electrodes 560.

Although each of the foregoing example liquid crystal devices 520, 530, and 550 is of a transmissive type, it can be of a reflective type or a transflective type by providing a reflective layer or a transflective layer.

Figure 26:
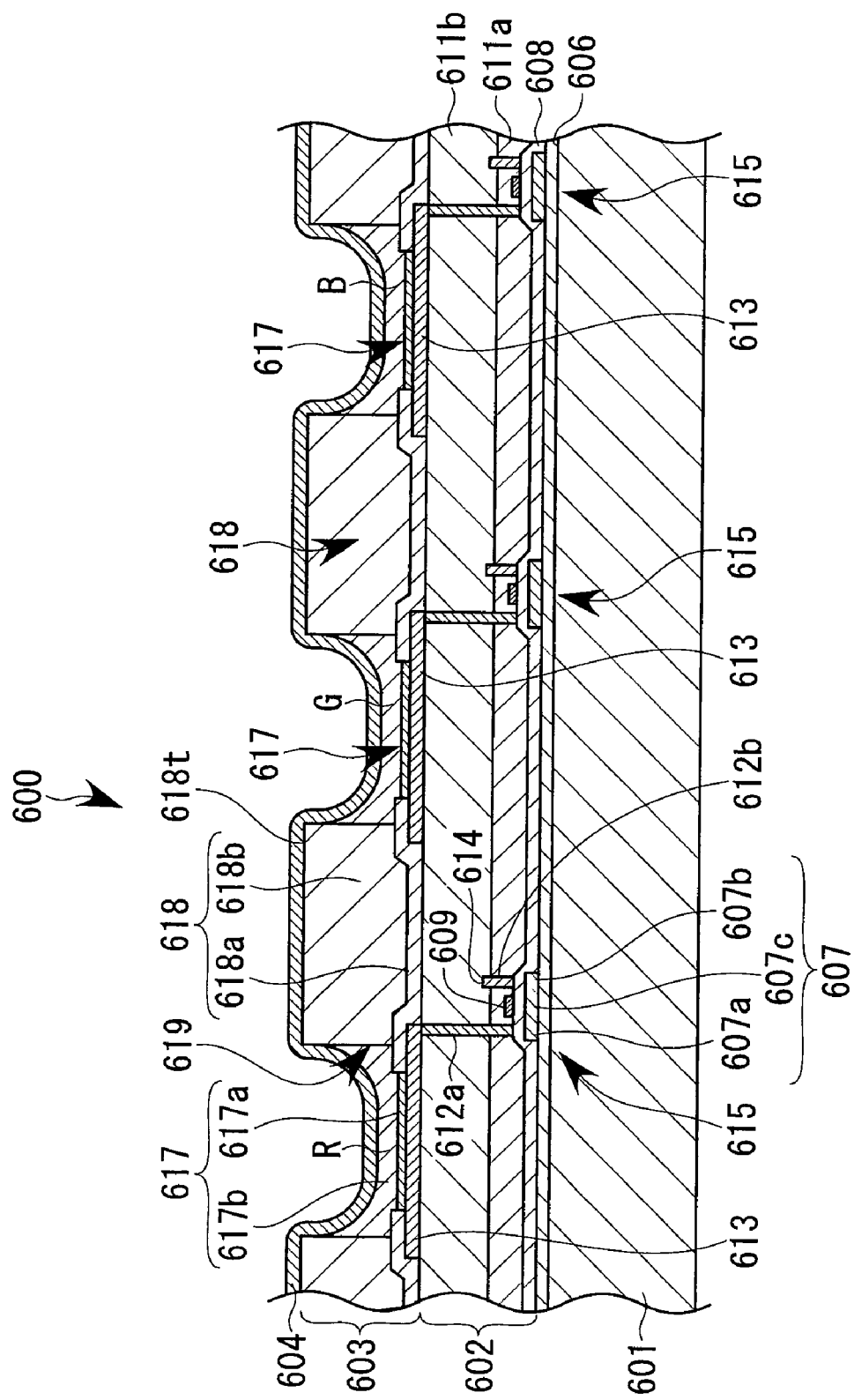
FIG. 26 is a sectional view of an essential part of a display device serving as an organic EL device.

FIG. 26 is a sectional view of an essential part of a display area (hereinafter, simply referred to as a display device 600) of an organic EL device.

The display device 600 has a general structure in which a substrate (W) 601 has a circuit-element section 602, a light-emitting element section 603, and a cathode 604 deposited thereon.

In the display device 600, light emitted from the light-emitting element section 603 toward the substrate 601 passes through the circuit-element section 602 and the substrate 601 and is emitted toward an observer, while light emitted from the light-emitting element section 603 toward the opposite side to the substrate 601 is reflected from the cathode 604, then passes through the circuit-element section 602 and the substrate 601, and is emitted toward the observer.

The circuit-element section 602 and the substrate 601 have a substrate-protecting film 606 formed therebetween, composed of a silicon oxide film. The substrate-protecting film 606 has island-shaped semiconductor films 607 formed thereon (close to the light-emitting element section 603), composed of polycrystalline silicon. Each semiconductor film 607 has a source area 607a and a drain area 607b respectively formed in the left and right areas thereof by implanting highly concentrated cations, and the central part thereof having no cations implanted therein serves as a channel area 607c.

The circuit-element section 602 has a transparent gate-insulating film 608 formed therein, covering the substrate-protecting film 606 and the semiconductor films 607, in addition to having gate electrodes 609 composed of metal such as Al, Mo, Ta, Ti, or W, each formed at a position on the gate-insulating film 708 so as to correspond to the channel area 607c of each semiconductor film 607. The gate electrode 609 and the gate-insulating film 608 have transparent first and second interlayer insulating films 611a and 611b formed thereon. Also, the first and second interlayer insulating films 611a and 611b have contact holes 612a and 762b perforated therein so as to communicate with the source area 607a and the drain area 607b of the semiconductor films 607, respectively.

The second interlayer insulating film 611b has transparent pixel electrodes 613 formed thereon in a predetermined pattern, composed of ITO or the like, and each pixel electrode 613 is connected to the source area 607a through the contact hole 612a.

The first interlayer insulating film 611a has a power line 614 disposed thereon and connected to the drain area 607b through the contact hole 612b.

As described above, the circuit-element section 602 has driving thin-film transistors 615 formed therein, connected to the respective pixel electrodes 613.

The light-emitting element section 603 has a general structure in which each of a plurality of the pixel electrodes 613 has a function layer 617 deposited thereon, and each pixel electrode 613 and the function layer 617 have a bank section 618 interposed therebetween so as to define the corresponding function layer 617.

The pixel electrode 613, the function layer 617, and the cathode 604 disposed on the function layer 617 make up a light-emitting element. The pixel electrodes 613 are patterned in a rectangular shape in plan view, and any two of the pixel electrodes 613 have the bank section 618 formed therebetween.

The bank section 618 is made up by an inorganic bank layer 618a (a first bank layer) composed of an inorganic material such as SiO, $SiO_2$, or $TiO_2$ and an organic bank layer 618b (a second bank layer) (a) deposited on the inorganic bank layer 618a, (b) composed of, for example, acrylic resin resist or polyimide resin resist, each having excellent thermal resistance and solvent resistance, (c) and having a trapezoidal cross-section. A part of the bank section 618 overlies the periphery of each pixel electrode 613.

Any mutually adjacent two parts of the bank section 618 have an opening 619 therebetween, formed so as to be gradually widened upwards relative to the pixel electrodes 613.

The function layer 617 is made up by a hole-injecting/transporting layer 617a and a light-emitting layer 617b formed on the hole-injecting/transporting layer 617a, both lying above the corresponding pixel electrode 613 and in the opening 619 in a deposited state. Another function layer having another function may be additionally formed so as to lie adjacent to the light-emitting layer 617b. For example, an electron-transporting layer may be formed. The hole-injecting/transporting layer 617a transports holes from the pixel electrode 613 and injects them into the light-emitting layer 617b. The hole-injecting/transporting layer 617a is formed by ejecting a first composition (function liquid) containing a forming material. The forming material can be a known one.

The light-emitting layer 617b emits light of any one of colors red (R), green (G), and blue (B) and is formed by ejecting a second composition (function liquid) containing a forming material of the light-emitting layer 617b (composed of a light-emitting material). Known material insoluble to the hole-injecting/transporting layer 617a is preferably used as a solvent (a nonpolar solvent) of the second composition. By using such a nonpolar solvent in the second composition of the light-emitting layer 617b, the light-emitting layer 617b can be formed without causing the hole-injecting/transporting layer 617a to be dissolved again.

With this structure, since holes injected from the hole-injecting/transporting layer 617a and electrons injected from the cathode 604 are coupled again in the light-emitting layer 617b, light is emitted from this layer.

The cathode 604 is formed so as to cover the entire surface of the light-emitting element section 603 and serves so as to pass electric current to the function layer 617 together with the pixel electrode 613 as a pair. The cathode 604 has a sealing member (not illustrated) disposed thereabove.

Referring now to FIGS. 27 to 35, the manufacturing process of the display device 600 will be described.

Figure 27:
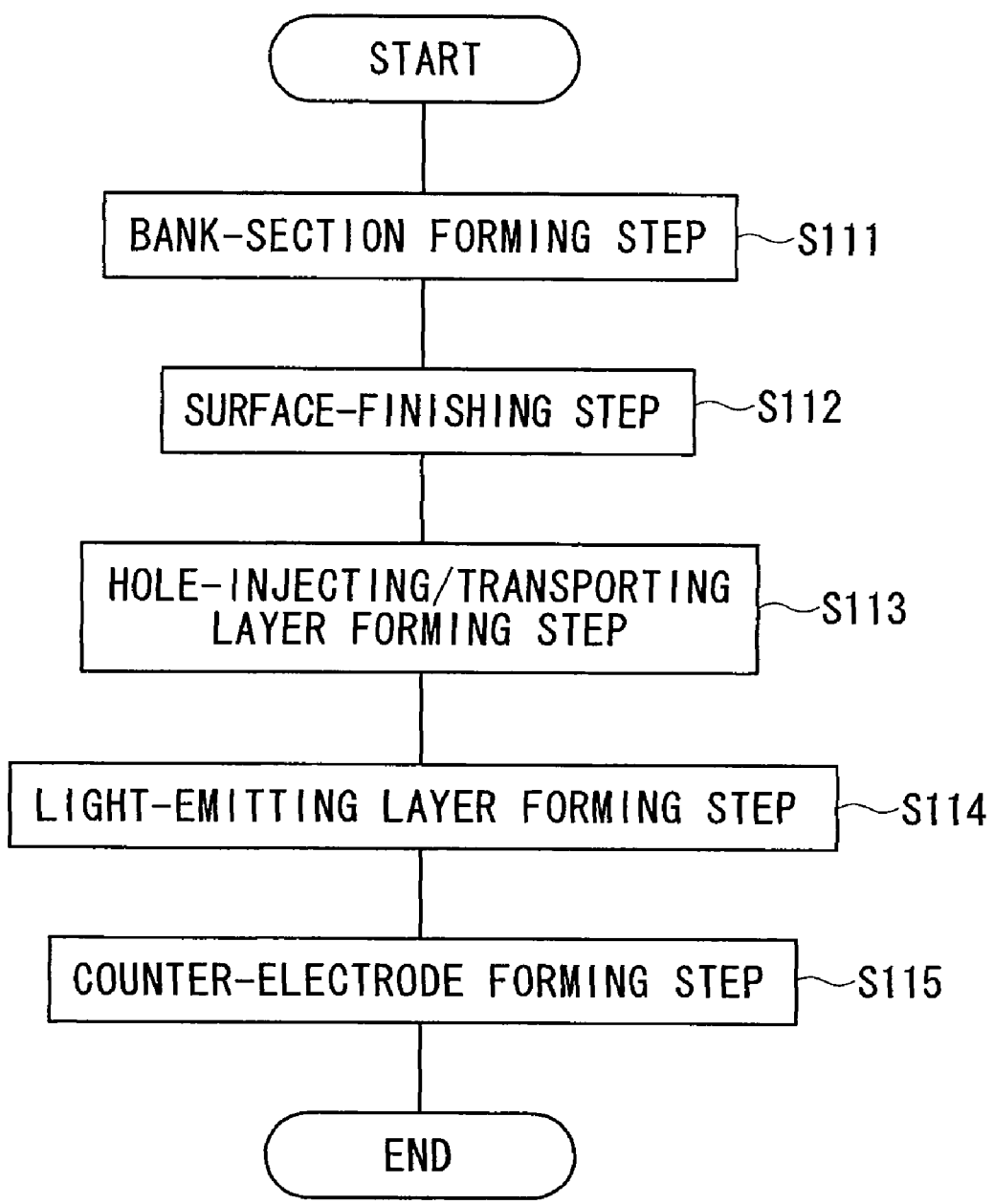
FIG. 27 is a flow chart illustrating a manufacturing process of the display device serving as the organic EL device.

As shown in FIG. 27, the display device 600 is manufactured through a bank-section forming step S111, a surface-finishing step S112, a hole-injecting/transporting layer forming step S113, a light-emitting layer forming step S114, and a counter-electrode forming step S115. The manufacturing process is not limited to that illustrated in the figure, and some steps may be eliminated from or added to the process.

Figure 28:
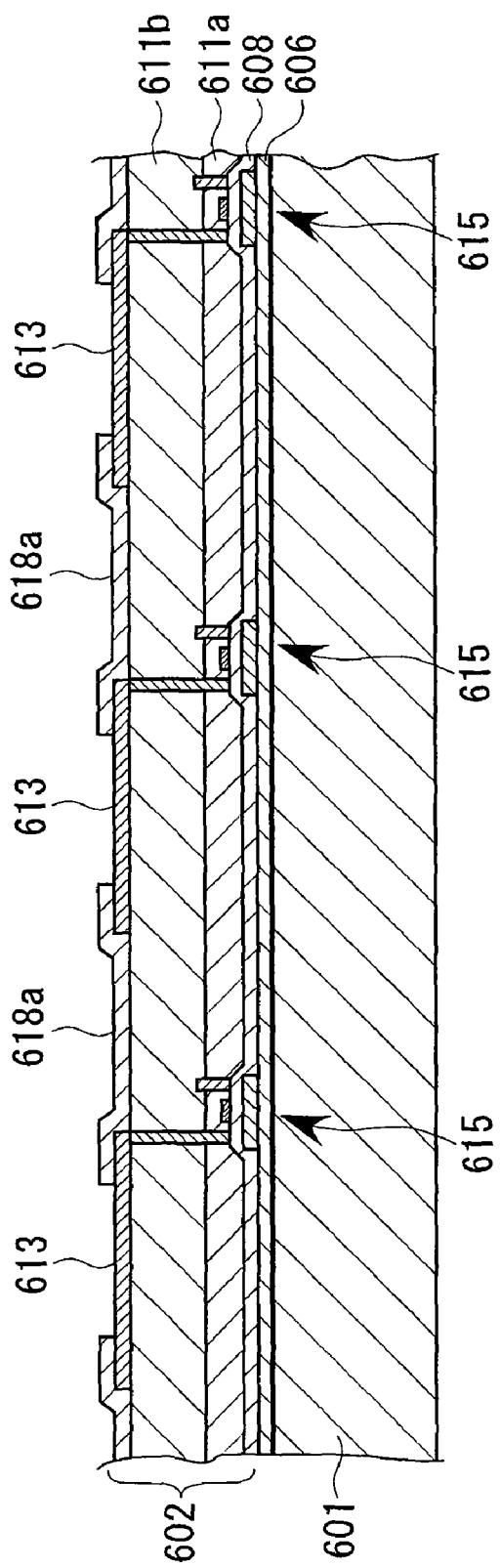
FIG. 28 is a sectional view showing the step of forming an inorganic bank layer.

As shown in FIG. 28, in the bank-section forming step S111, the inorganic bank layer 618a is formed on the second interlayer insulating film 611b such that an inorganic film is formed at its forming position and is then patterned by lithography or the like. On this occasion, a part of the inorganic bank layer 618a overlaps with the periphery of the corresponding pixel electrode 613.

Figure 29:
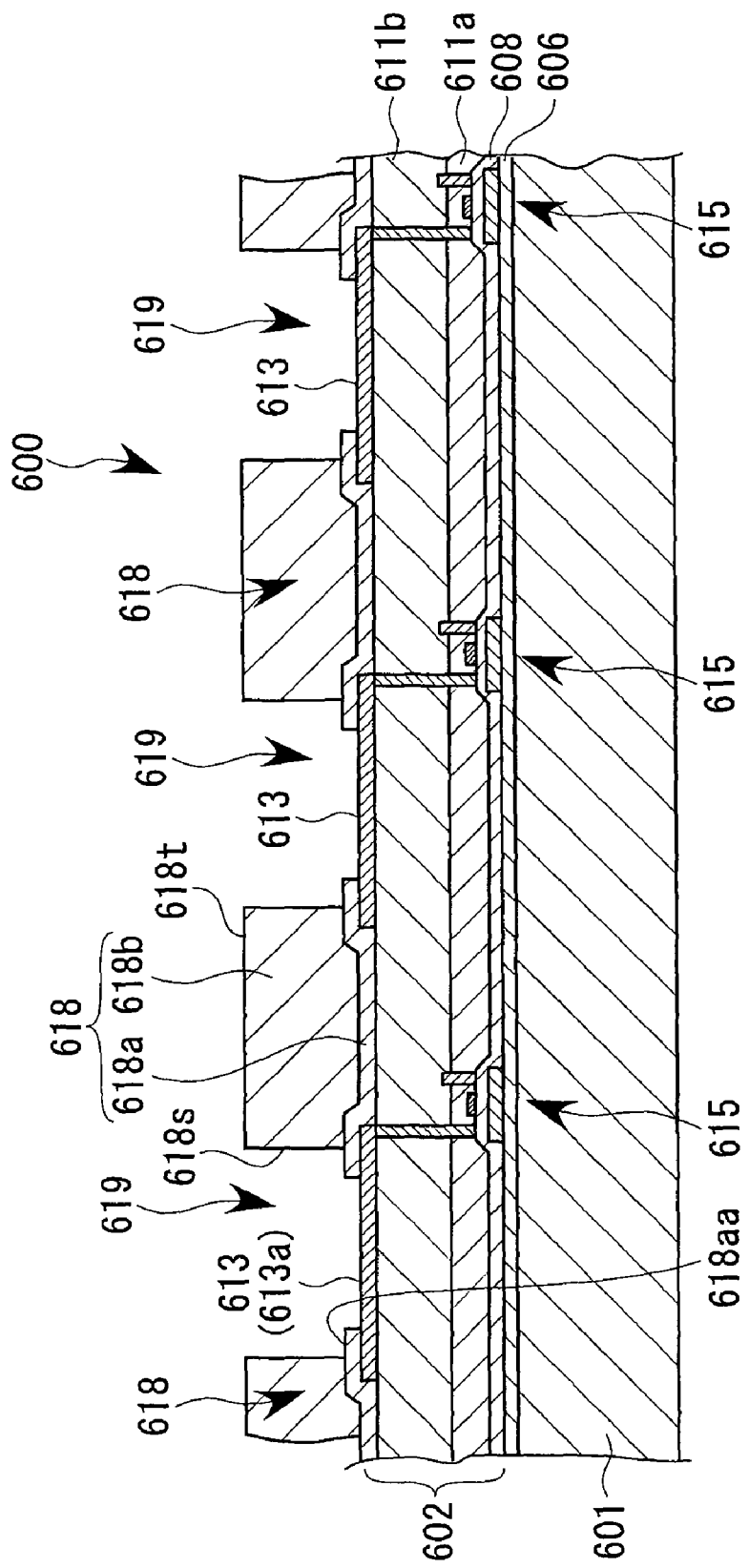
FIG. 29 is a sectional view showing the step of forming an organic bank layer.

When the inorganic bank layer 618a is formed, as shown in FIG. 29, the organic bank layer 618b is formed on the inorganic bank layer 618a. The organic bank layer 618b is also formed by way of patterning by lithography or the like in the same fashion as the inorganic bank layer 618a.

The bank section 618 is formed as described above. In accordance with forming the bank section 618, any mutually adjacent two parts of bank section 618 have the opening 619 formed therebetween so as to open upwards relative to the pixel electrodes 613. This opening 619 defines a pixel area.

In the surface-finishing step S112, lyophilic and liquid-repellent treatments are performed. The lyophilic treatment is applied on a first deposited section 618aa of the inorganic bank layer 618a and an electrode surface 613a of the pixel electrode 613, and the surfaces of these areas are finished so as to be lyophilic by plasma treatment using oxygen as a process gas, for example. The plasma treatment serves also so as to clean ITO making up the pixel electrodes 613.

Also, the liquid-repellent treatment is applied on wall surfaces 618s and an upper surface 618t of the organic bank layer 618b, and these surfaces are finished so as to be liquid-repellent by plasma treatment using, e.g., methane tetra-fluoride as a process gas.

By carrying out the surface-finishing step, when the function layer 617 is formed with the function liquid droplet ejection head 71, function liquid droplets can be more reliably landed in the corresponding pixel area, and also, the function liquid droplets landed in the pixel area are prevented from leaking from the opening 619.

Thus, a display-device substrate 600A is obtained by carrying out the above-described steps. The display-device substrate 600A is placed on the setting table 41 of the liquid droplet ejection apparatus 1 shown in FIG. 1, and the hole-injecting/transporting layer forming step S113 and the light-emitting layer forming step S114, which will be described below, are carried out.

Figure 30:
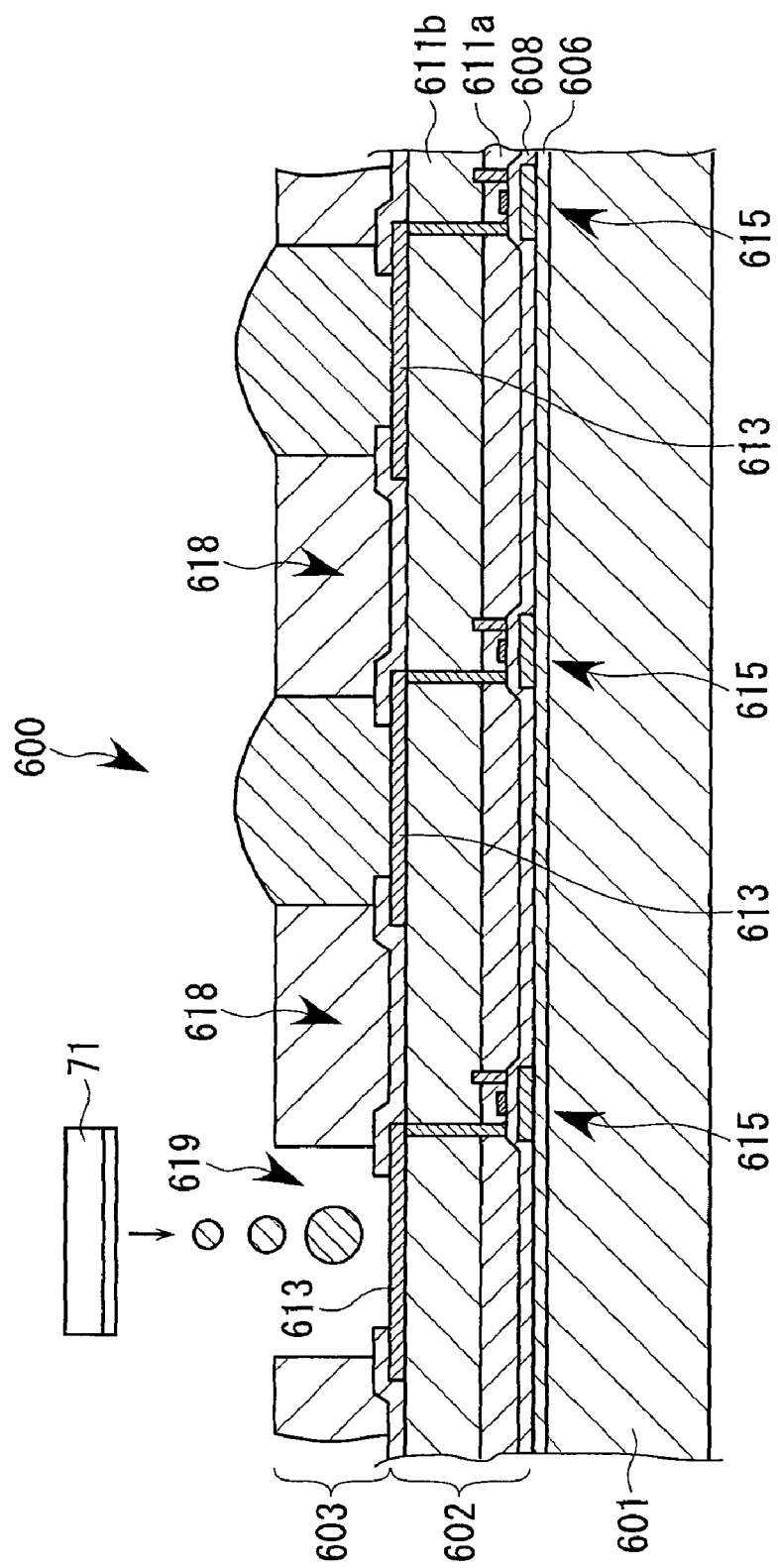
FIG. 30 is a sectional view showing the step of forming a hole injection-transport layer.
Figure 31:
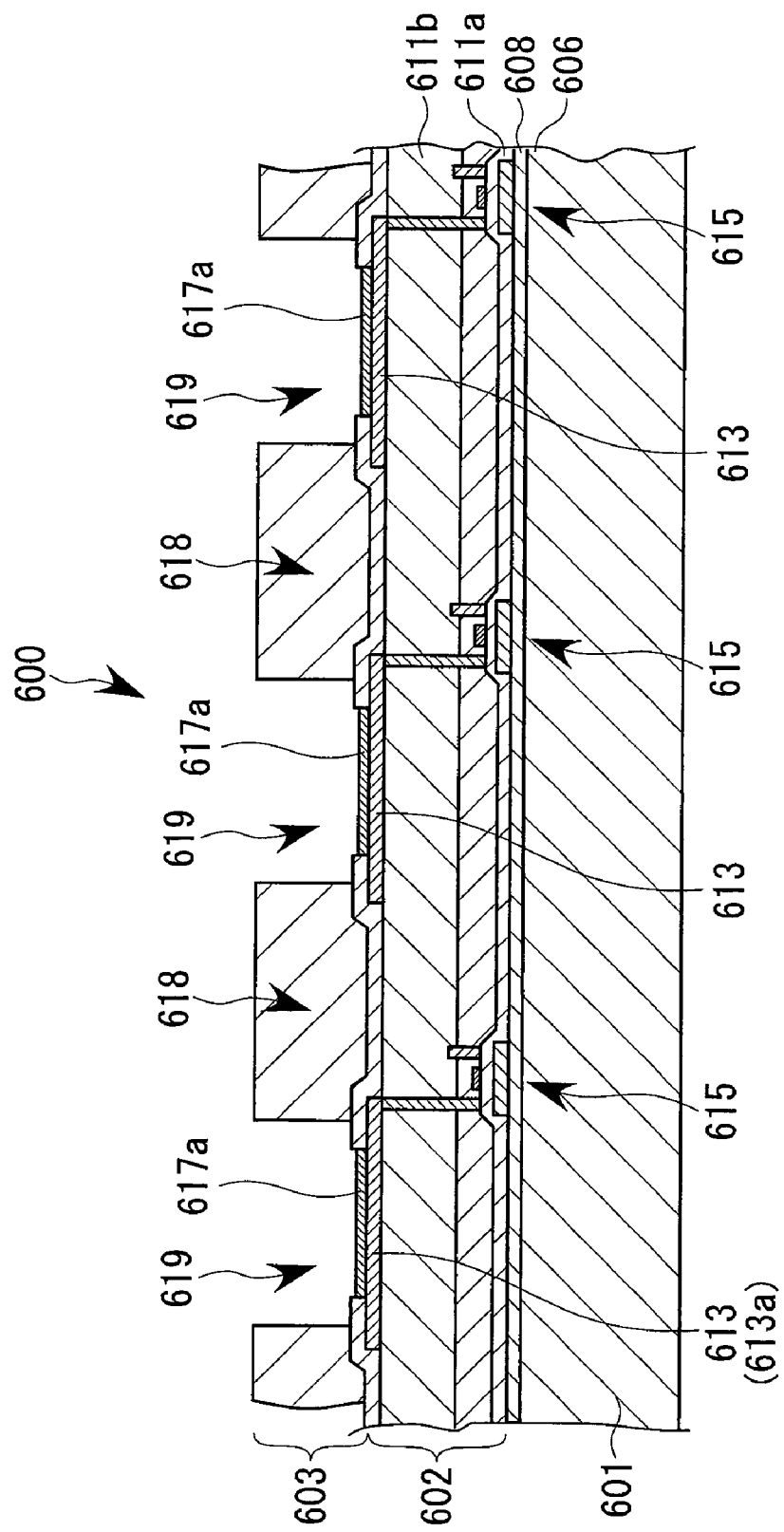
FIG. 31 is a sectional view showing the state in which the hole injection-transport layer is formed.

As shown in FIG. 30, in the hole-injecting/transporting layer forming step S113, the function liquid droplet ejection head 71 ejects the first composition containing the forming material of the hole-injecting/transporting layer 617a in the corresponding opening 619 making up a pixel area. Then, a polar solvent contained in the first composition is vaporized by drying and heating so as to form the hole-injecting/transporting layer 617a on the pixel electrode 613 (the electrode surface 613a) as shown in FIG. 31.

The light-emitting layer forming step S114 will be described. In the light-emitting layer forming step S114, as described above, in order to prevent the hole-injecting/transporting layer 617a from being dissolved again, a nonpolar solvent insoluble to the hole-injecting/transporting layer 767a is used as a second composition upon forming the light-emitting layer 617b.

In the meantime, since the hole-injecting/transporting layer 617a has low affinity to a nonpolar solvent, even when the second composition containing a nonpolar solvent is ejected on the hole-injecting/transporting layer 617a, there is a risk that the hole-injecting/transporting layer 617a and the light-emitting layer 617b are not closely attached to each other, or the light-emitting layer 617b is not uniformly coated.

In order to improve the affinity of the surface the hole-injecting/transporting layer 617a to the nonpolar solvent and the light-emitting layer forming material, a surface finishing treatment (a surface-improving treatment) is preferably carried out prior to forming the light-emitting layer 617b. The surface finishing treatment is carried out by applying a surface-improving material identical or similar to the second composition used upon forming the light-emitting layer 617b on the hole-injecting/transporting layer 617a and then by drying it.

With such treatments, the surface of the hole-injecting/transporting layer 617a has affinity to a nonpolar solvent, whereby the second composition containing the light-emitting layer forming material can be uniformly applied on the hole-injecting/transporting layer 617a in the following steps.

Figure 32:
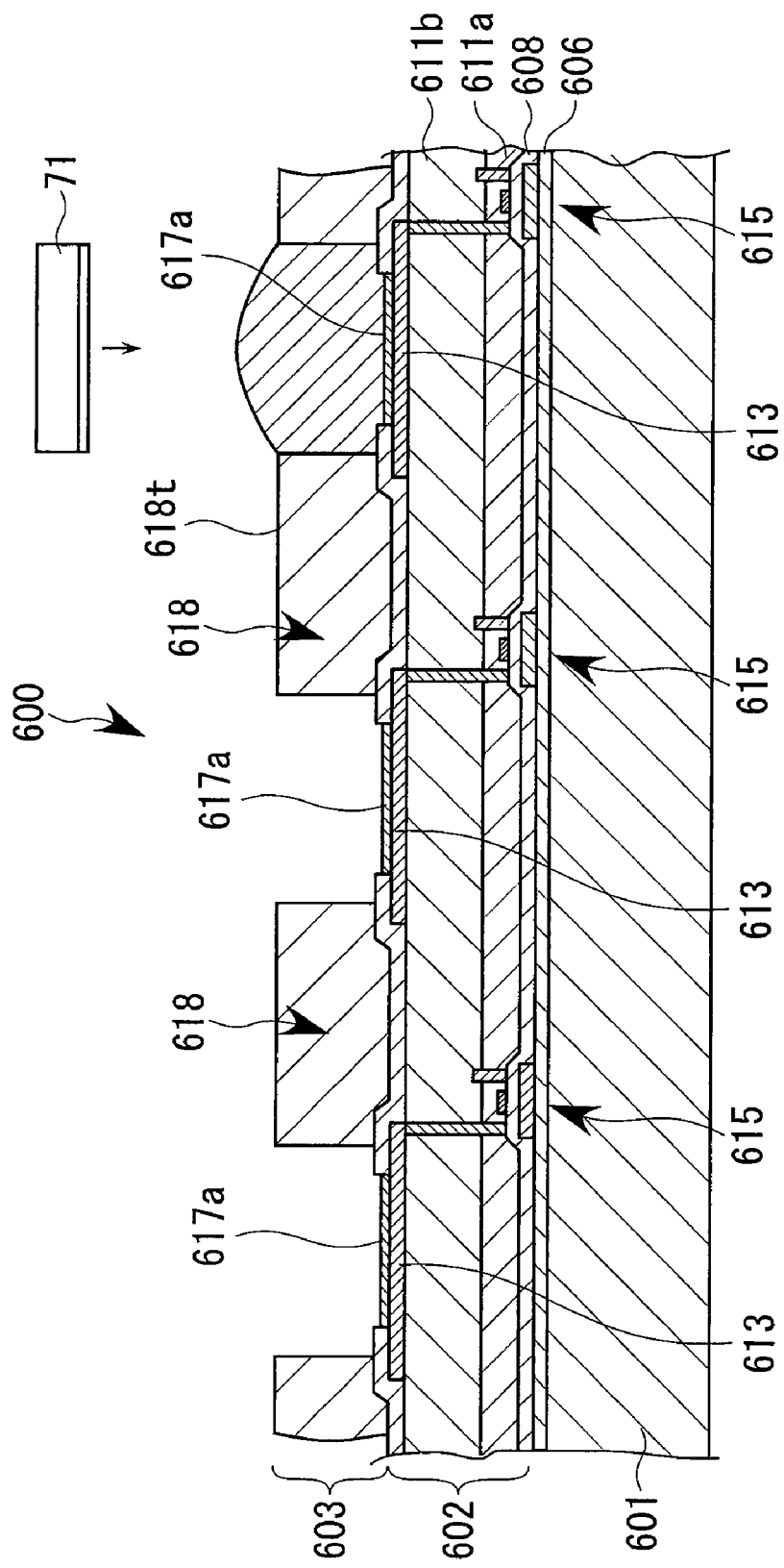
FIG. 32 is a sectional view showing the step of forming a blue light-emitting layer.

Then, as shown in FIG. 32, a predetermined amount of the second composition containing the light-emitting layer forming material corresponding to any one of colors (blue (B) in the example illustration in FIG. 32) is implanted in the pixel area (the opening 619) as a function liquid droplet. The second composition implanted in the pixel spreads over the hole-injecting/transporting layer 617a and is filled in the opening 619. Meanwhile, in case where the second composition is landed outside the pixel area and on the upper surface 618t of the bank-section 618, the liquid-repellent treatment has been previously applied to the upper surface 618t as described above, whereby the second composition is likely to roll in the opening 619.

Figure 33:
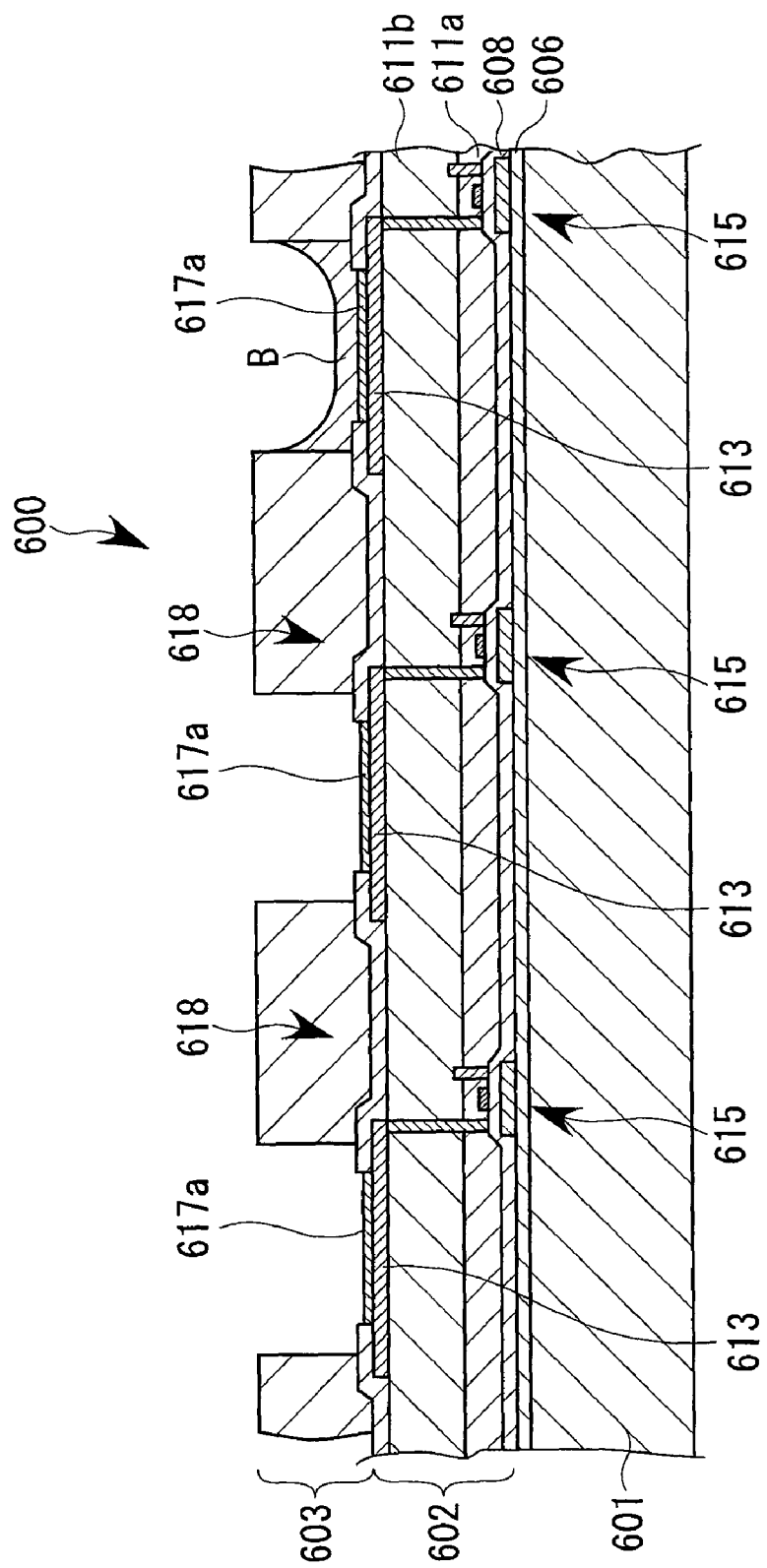
FIG. 33 is a sectional view showing the state in which the blue light-emitting layer is formed.

Subsequently, by carrying out a drying step and so forth, when the ejected second composition is dried, and nonpolar solvent contained in the second composition is evaporated, the light-emitting layer 617b is formed on the hole-injecting/transporting layer 617a as shown in FIG. 33. In the figure, the light-emitting layer 617b corresponding to the blue color (B) is formed.

Figure 34:
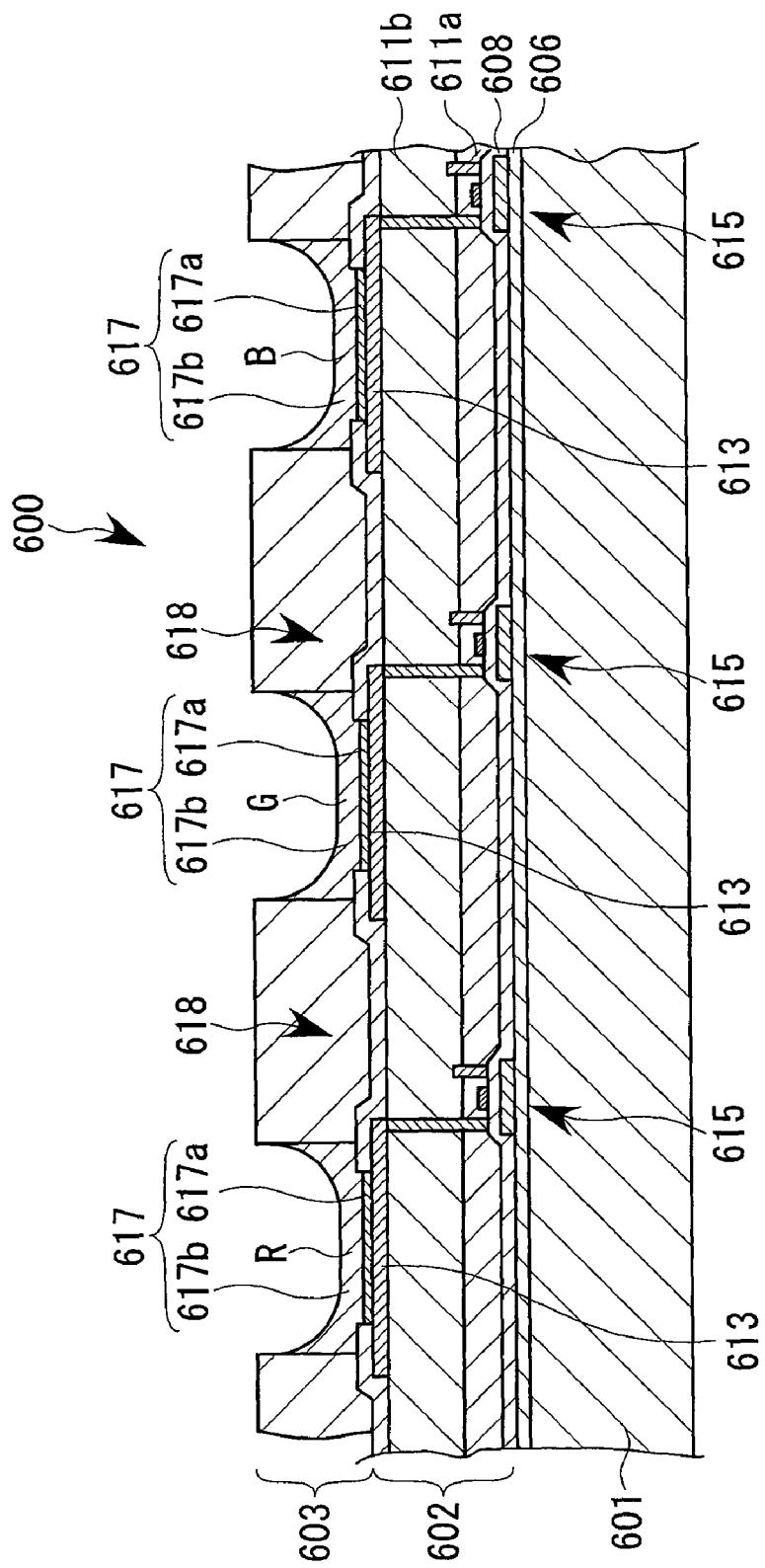
FIG. 34 is a sectional view showing the state in which all color light-emitting layers are formed.

Likewise, with the function liquid droplet ejection head 71, as shown in FIG. 34, when the steps similar to those of the light-emitting layer 617b corresponding the above-described blue color (B) are sequentially carried out, the light-emitting layers 617b corresponding to the other red (R) and (G) colors are formed. Meanwhile, the light-emitting layers 617b is not limited to being formed in the foregoing example order and can be formed in any order. For example, the order can be determined depending on light-emitting layer forming materials. Also, an arranging pattern of the three colors (R, G, and B) can be a stripe pattern, a mosaic pattern, or a delta pattern, or the like.

The function layer 617 is formed on the pixel electrodes 613, that is, the hole-injecting/transporting layer 617a and the light-emitting layer 617b are formed on the same in the manner as described above. Then, the process moves to the counter-electrode forming step S115.

Figure 35:
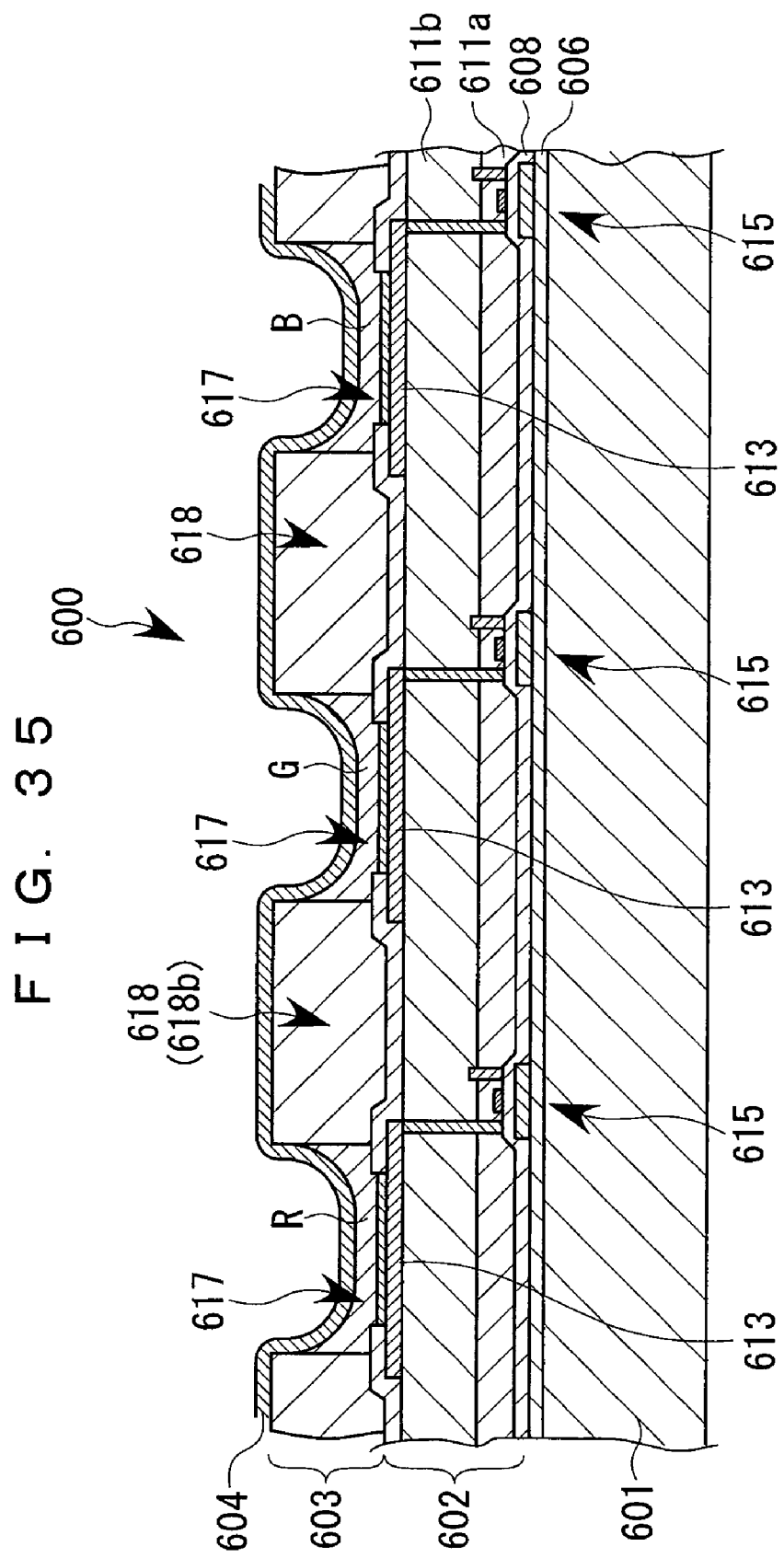
FIG. 35 is a sectional view showing the step of forming a cathode.

In the counter-electrode forming step S115, as shown in FIG. 35, the cathode 604 (the counter electrode) is formed on the entire surfaces of the light-emitting layer 617b and the organic bank layer 618b, by vapor deposition, sputtering, chemical vapor deposition (CVD), or the like. According to this embodiment, the cathode 604 is a laminate of a calcium layer and an aluminum layer, for example.

A protective layer composed of $SiO_2$, SiN, or the like is disposed above the cathode 604 if needed so as to serve as an antioxidant against Al and Ag film serving as electrodes.

After the cathode 604 is formed as described above, when other treatments including a sealing treatment for sealing the upper part of cathode 604 with a sealing member and a wiring treatment are carried out, the display device 600 is obtained.

Figure 36:
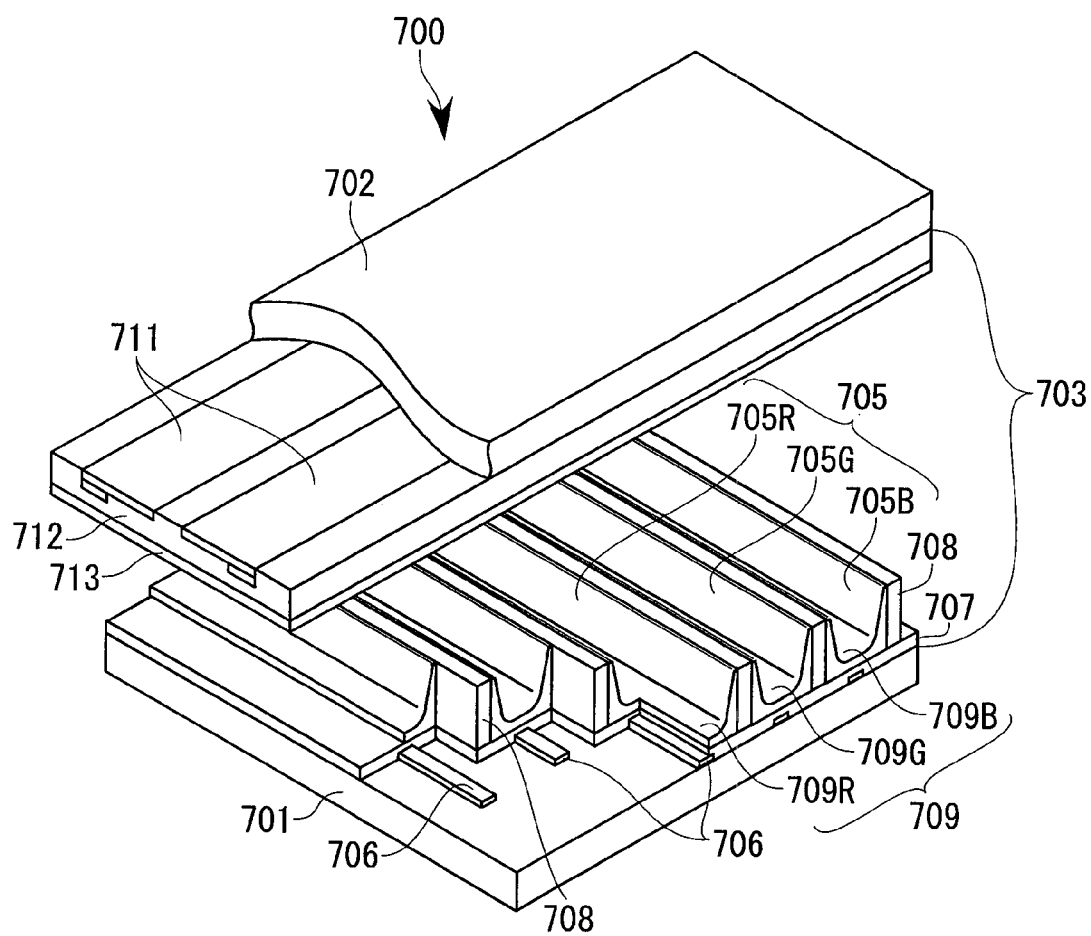
FIG. 36 is an exploded perspective view of an essential part of a display device serving as a plasma display panel (PDP) device.

FIG. 36 is an exploded perspective view of an essential part of a plasma display panel (PDP) device (hereinafter, simply referred to as a display device 700), wherein a part of the display device 700 is cut away.

The display device 700 includes mutually opposing first and second substrates 701 and 702, and a discharge display section 703 sandwiched between these substrates. The discharge display section 703 includes a plurality of discharge chambers 705. Of the plurality of discharge chambers 705, a set of red, green, and blue discharge chambers 705R, 705G, and 705B is arranged so as to serve as a single pixel.

The first substrate 701 has address electrodes 706 formed on the upper surface thereof in a stripe pattern at a predetermined interval, and a dielectric layer 707 is formed so as to cover the upper surfaces of the address electrodes 706 and the first substrate 701. The dielectric layer 707 has barriers 708 disposed thereon in a standing manner, each lying between two of the address electrodes 706 and extending along the corresponding address electrode 706. The barriers 708 include those extending along the address electrodes 706 as shown in the figure and those (not illustrated) extending perpendicular to the address electrodes 706.

Thus, areas defined by the barriers 708 serve as the discharge chambers 705.

The discharge chambers 705 have respective fluorescent members 709 disposed therein. Each fluorescent substance 709 emits fluorescent light of any one of colors red (R), green (G), and blue (B), and the red, green, and blue discharge chambers 705R, 705G, and 705B respectively have red, green, and blue fluorescent members 709R, 709G, and 709B disposed at the bottoms thereof.

The second substrate 702 has a plurality of display electrodes 711 disposed on the lower surface thereof, as shown in the figure, so as to extend in a direction perpendicular to the address electrodes 706, in a stripe pattern at a predetermined interval, and a dielectric layer 712 and a protective film 713 composed of MgO or the like are formed so as to cover these electrodes.

The first and second substrates 701 and 702 are bonded to each other such that the address electrodes 706 and the display electrodes 711 lie perpendicular to each other. The address electrodes 706 and the display electrodes 711 are connected to respective alternating power sources (not illustrated).

By energizing each of the electrodes 706 and 711, the fluorescent members 709 emit excitation light in the discharge display section 703 so as to offer color display.

According to this embodiment, the address electrodes 706, the display electrodes 711, and the fluorescent members 709 can be formed with the liquid droplet ejection apparatus 1 shown in FIG. 1. A forming step of the address electrodes 706 of the first substrate 701 will be described by way of example.

In this case, the following step is carried out in a state in which the first substrate 701 is placed on the setting table 41 of the liquid droplet ejection apparatus 1.

Firstly, a function liquid droplet of liquid material (function liquid) containing a conductive-film wiring forming material is landed in an address-electrode forming area with the function liquid droplet ejection heads 71. This liquid material contains conductive fine particles composed of metal or the like, dispersed in disperse media so as to serve as a conductive-film wiring forming material. This conductive particle can be a metal fine particle containing, for example, gold, silver, copper, palladium, nickel, a conductive polymer particle, or the like.

When refilling of the liquid material in all address-electrode forming areas to be refilled is finished, by drying the ejected liquid material and by evaporating dispersion media contained in the liquid material, the address electrodes 706 are formed.

Although the address electrodes 06 are formed by way of example in the above description, the display electrodes 711 and the fluorescent members 709 can be also formed by undergoing the foregoing respective steps.

When the display electrodes 711 are formed, in the same fashion as the address electrodes 706, a function liquid droplet of a liquid material (function liquid) containing a conductive-film wiring forming material is landed in a display-electrode forming area.

When the fluorescent members 709 are formed, function liquid droplets of liquid materials (function liquid) containing fluorescent materials corresponding to the respective colors (R, G, and B) are ejected by the function liquid droplet ejection heads 71 and landed in the discharge chambers 705 corresponding to the respective colors.

FIG. 37 is a sectional view of an essential part of an electron-emission device (also called an FED device or an SED, hereinafter simply referred to as a display device 800).

The display device 800 generally includes mutually opposing first and second substrates 801 and 802 and a field-emission display section 803 formed between these substrates. The field-emission display section 803 is made up by a plurality of electron-emission sections 805 arranged in a matrix pattern.

The first substrate 801 has first element electrodes 806a and second element electrodes 806b formed on the upper surface thereof, making up cathode electrodes 806, so as to lie perpendicular to each other. Also, a conductive film 807 having a gap 808 formed therein is formed in a section defined by each first element electrode 806a and each second element electrode 806b. That is, the first element electrodes 806a, the second element electrodes 806b, and the conductive films 807 make up the plurality of electron-emission sections 805. Each conductive film 807 is composed of palladium oxide (PdO) or the like, and the gap 808 is formed, for example, by foaming after the conductive film 807 is formed.

The second substrate 802 has anode electrodes 809 on the lower surface thereof so as to oppose the cathode electrodes 806. The anode electrodes 809 have a bank section 811 formed in a latticed pattern on the lower surface thereof. Downwardly-directed openings 812 encircled by the bank section 811 have fluorescent members 813 disposed therein so as to correspond to the respective electron-emission sections 805. Each of the fluorescent members 813 emits fluorescent light of any one of colors red (R), green (G), and blue (B), and red, green, and blue fluorescent members 813R, 813G, and 813B are disposed in the above-described predetermined pattern in the respective openings 812.

Then, the first and second substrates 801 and 802 formed as described above are bonded to each other having a fine gap therebetween. In the display device 800, when an electron emitted from the first or second element electrode 806a or 806b making up the cathode hits upon the fluorescent member 813 formed on the under surface of the anode electrode 809 serving as an anode, through the conductive film 807 (the gap 808), the fluorescent member 813 emits excitation light, thereby offering color display.

Also in this case, in the same fashion as in the other embodiments, the first and second element electrodes 806a and 806b, the conductive film 807, and the anode electrodes 809 can be formed with the liquid droplet ejection apparatus 1, and the fluorescent members 813R, 813G, and 813B corresponding to the respective colors can be also formed with the liquid droplet ejection apparatus 1.

Figure 38A:
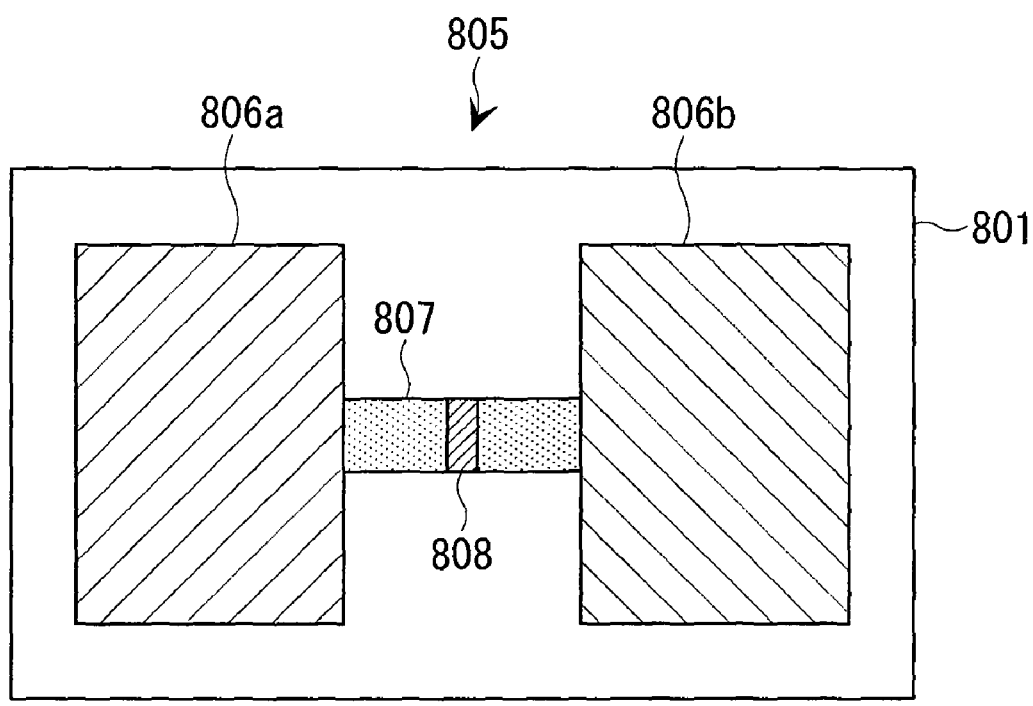
FIGS. 38A and 38B are respectively a plan view of an electron emission section and its vicinity of the display device, and a plan view showing the method of forming the electron-emission section.
Figure 38B:
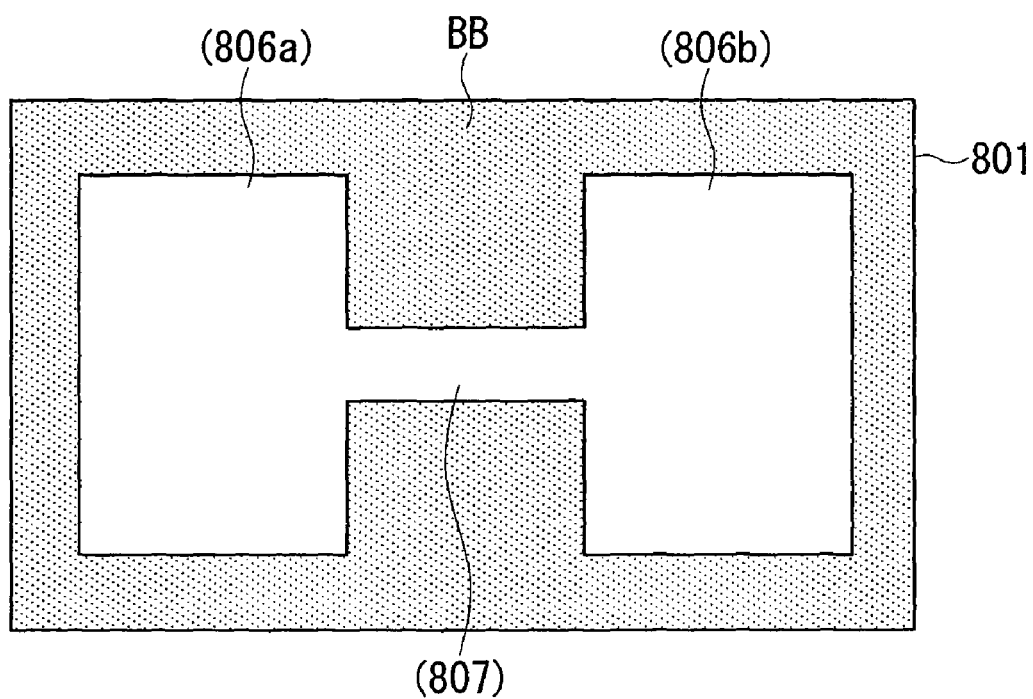

Since the first and second element electrodes 806a and 806b, and the conductive film 807 have respective two dimensional shapes shown in FIG. 38A, when these components are to be formed, a bank section BB is formed by lithography while sections in which the first and second element electrodes 806a and 806b and the conductive film 807 are to be formed are previously left in an unprocessed state as shown in FIG. 38B. Subsequently, the first and second element electrodes 806a and 806b are formed by an inkjet method with the liquid droplet ejection apparatus 1 in depressions formed by the bank section, the solvent is dried so as to complete these components; and the conductive film 807 is then formed by an inkjet method with the liquid droplet ejection apparatus 1. When the conductive film 807 is completed, the bank section BB is removed by ashing, and the foregoing forming treatment is then carried out. In the same fashion as in the organic EL device, the first and second substrates 801 and 802, and the bank section 811 and BB and are preferably subjected to the lyophilic treatment and the liquid-repellent treatment, respectively.

By applying the liquid droplet ejection apparatus 1 shown in FIG. 1 to production of a variety of electrooptical devices, these devices can be effectively manufactured.

What is claimed is:

1. A method of drawing on a workpiece by ejecting functional liquid thereon while relatively scanning the workpiece and a plurality of ejection heads, the method comprising the steps of:
    a first scanning for drawing in a plurality of first areas where each of the ejection heads scans a different position; and
    a second scanning for drawing in a second area between the plurality of first areas drawn in by the first scanning.

2. The method according to claim 1 wherein a plurality of different functional liquids are ejected by the plurality of election heads ejecting one type of the functional liquid per ejection head, and wherein the ejecting is performed on different areas per type of the functional liquid ejected in the first scanning.

3. The method according to claim 2, wherein the second scanning further comprises ejecting a different functional liquid than that of the first scanning.

4. The method according to claim 1, wherein the second scanning further comprises performing a plurality of scans.

* * * * *